US008659957B2

(12) United States Patent  
Sekine

(10) Patent No.: US 8,659,957 B2
(45) Date of Patent: Feb. 25, 2014

(54) SEMICONDUCTOR DEVICE AND METHOD OF DRIVING SEMICONDUCTOR DEVICE

(75) Inventor: Yusuke Sekine, Yamato (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 171 days.

(21) Appl. No.: 13/402,987

(22) Filed: Feb. 23, 2012

(65) Prior Publication Data

US 2012/0230114 A1   Sep. 13, 2012

(30) Foreign Application Priority Data

Mar. 7, 2011   (JP) ................................. 2011-048793

(51) Int. Cl.
*G11C 7/00* (2006.01)
(52) U.S. Cl.
USPC ............. 365/189.14; 365/185.22; 365/189.05
(58) Field of Classification Search
USPC ........................... 365/189.14, 185.22, 189.05
See application file for complete search history.

(56) References Cited

U.S. PATENT DOCUMENTS

| 4,466,081 A | 8/1984 | Masuoka |
| 5,731,856 A | 3/1998 | Kim et al. |
| 5,744,864 A | 4/1998 | Cillessen et al. |
| 6,127,702 A | 10/2000 | Yamazaki et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |

(Continued)

FOREIGN PATENT DOCUMENTS

| EP | 0 053 878 A2 | 6/1982 |
| EP | 1 737 044 A1 | 12/2006 |

(Continued)

OTHER PUBLICATIONS

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26. pp. 181-184.

(Continued)

*Primary Examiner* — Son Dinh
*Assistant Examiner* — Nam Nguyen
(74) *Attorney, Agent, or Firm* — Fish & Richardson P.C.

(57) ABSTRACT

An object is to provide a semiconductor device to reduce variation in the threshold voltages of memory cells after writing, reduce the operation voltage, or increase the storage capacity. The semiconductor device includes memory cells each including a transistor including an oxide semiconductor, a driver circuit that drives the memory cells, a potential generating circuit that generates potentials supplied to the driver circuit, and a write completion detecting circuit that detects all at once whether rewriting of data into the memory cells is completed or not. The driver circuit includes a data buffer, a writing circuit that writes one potential of the potentials into each of the memory cells as data, a reading circuit that reads the data written into the memory cells, and a verifying circuit that verifies whether the read data agrees with the data held in the data buffer or not.

19 Claims, 24 Drawing Sheets

(56) References Cited

U.S. PATENT DOCUMENTS

| | | | |
|---|---|---|---|
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 8,315,113 | B2 * | 11/2012 | Yoon ........................ 365/189.14 |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2010/0148171 | A1 | 6/2010 | Hayashi et al. |

FOREIGN PATENT DOCUMENTS

| | | | |
|---|---|---|---|
| EP | 2 226 847 | A2 | 9/2010 |
| JP | 57-105889 | A | 7/1982 |
| JP | 60-198861 | A | 10/1985 |
| JP | 63-210022 | A | 8/1988 |
| JP | 63-210023 | A | 8/1988 |
| JP | 63-210024 | A | 8/1988 |
| JP | 63-215519 | A | 9/1988 |
| JP | 63-239117 | A | 10/1988 |
| JP | 63-265818 | A | 11/1988 |
| JP | 05-251705 | A | 9/1993 |
| JP | 08-264794 | A | 10/1996 |
| JP | 11-505377 | A | 5/1999 |
| JP | 2000-044236 | A | 2/2000 |
| JP | 2000-150900 | A | 5/2000 |
| JP | 2002-076356 | A | 3/2002 |
| JP | 2002-289859 | A | 10/2002 |
| JP | 2003-086000 | A | 3/2003 |
| JP | 2003-086808 | A | 3/2003 |
| JP | 2004-103957 | A | 4/2004 |
| JP | 2004-273614 | A | 9/2004 |
| JP | 2004-273732 | A | 9/2004 |
| JP | 3721159 | B2 | 11/2005 |
| WO | 2004/114391 | A1 | 12/2004 |

OTHER PUBLICATIONS

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn-Oxide TFT,"

(56) References Cited

OTHER PUBLICATIONS

SID Digest '09 : SID International Symposium Digest of Technical Papers, May 31, 2009, pp. 1110-1112.
Godo, H et al., "Temperature Dependence of Characteristics and Electronic Structure for Amorphous In—Ga—Zn-Oxide TFT," AM-FPD '09 Digest of Technical Papers, Jul. 1, 2009, pp. 41-44.
Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.
Hirao, T et al., "Novel Top-Gate Zinc Oxide Thin-Film Transistors (ZnO TFTs) for AMLCDs," Journal of the SID, 2007, vol. 15, No. 1, pp. 17-22.
Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.
Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.
Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.
Ikeda., T et al., "Full-Functional System Liquid Crystal Display Using CG-Silicon Technology," SID Digest '04 : SID International Symposium Digest of Technical Papers, 2004, vol. 35, pp. 860-863.
Janotti, A et al., "Native Point Defects in ZnO," Phys. Rev. B (Physical Review. B), 2007, vol. 76, No. 16, pp. 165202-1-165202-22.
Janotti, A et al., "Oxygen Vacancies in ZnO," Appl. Phys. Lett. (Applied Physics Letters), 2005, vol. 87, pp. 122102-1-122102-3.
Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.
Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.
Kanno, H et al., "White Stacked Electrophosphorecent Organic Light-Emitting Devices Employing MOO3 As a Charge-Generation Layer," Adv. Mater. (Advanced Materials), 2006, vol. 18, No. 3, pp. 339-342.
Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.
Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.
Kikuchi, H et al., "Polymer-Stabilized Liquid Crystal Blue Phases," Nature Materials, Sep. 1, 2002, vol. 1, pp. 64-68.
Kim, S et al., "High-Performance oxide thin film transistors passivated by various gas plasmas," The Electrochemical Society, 214th ECS Meeting, 2008, No. 2317, 1 page.
Kimizuka, N. et al., "Spinel,YBFE2O4, and YB2FE3O7 Types of Structures for Compounds in the In2O3 and Sc2O3-A2O3-BO Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.
Kimizuka, N et al., "Syntheses and Single-Crystal Data of Homologous Compounds, In2O3(ZnO)m (m=3, 4, and 5). InGaO3(ZnO)3, and Ga2O3(ZnO)m (m=7, 8, 9, and 16) in the In2O3-ZnGa2O4-ZnO System," Journal of Solid State Chemistry, Apr. 1, 1995, vol. 116, No. 1, pp. 170-178.
Kitzerow, H et al., "Observation of Blue Phases in Chiral Networks," Liquid Crystals, 1993, vol. 14, No. 3, pp. 911-916.
Kurokawa, Y et al., "UHF RFCPUS on Flexible and Glass Substrates for Secure RFID Systems," Journal of Solid-State Circuits , 2008, vol. 43, No. 1, pp. 292-299.
Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.
Lee, H et al., "Current Status of, Challenges to, and Perspective View of AM-OLED," IDW '06 : Proceedings of the 13th International Display Workshops, Dec. 7, 2006, pp. 663-666.
Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.
Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.
Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.
Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.
Meiboom, S et al., "Theory of the Blue Phase of Cholesteric Liquid Crystals," Phys. Rev. Lett. (Physical Review Letters), May 4, 1981, vol. 46, No. 18, pp. 1216-1219.
Miyasaka, M, "SUFTLA Flexible Microelectronics on Their Way to Business," SID Digest '07 : SID International Symposium Digest of Technical Papers, 2007, vol. 38, pp. 1673-1676.
Mo, Y et al., "Amorphous Oxide TFT Backplanes for Large Size AMOLED Displays," IDW '08 : Proceedings of the 6th International Display Workshops, Dec. 3, 2008, pp. 581-584.
Nakamura, "Synthesis of Homologous Compound with New Long-Period Structure," NIRIM Newsletter, Mar. 1995, vol. 150, pp. 1-4 with English translation.
Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.
Nomura, K et al., "Thin-Film Transistor Fabricated in Single-Crystalline Transparent Oxide Semiconductor," Science, May 23, 2003, vol. 300, No. 5623, pp. 1269-1272.
Nomura, K et al., "Amorphous Oxide Semiconductors for High-Performance Flexible Thin-Film Transistors." Jpn. J. Appl. Phys. (Japanese Journal of Applied Physics) , 2006, vol. 45, No. 5B, pp. 4303-4308.
Nomura. K et al., "Room-Temperature Fabrication of Transparent Flexible Thin-Film Transistors Using Amorphous Oxide Semiconductors," Nature, Nov. 25, 2004, vol. 432, pp. 488-492.
Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.
Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.
Oba, F et al., "Defect energetics in ZnO: A hybrid Hartree-Fock density functional study," Phys. Rev. B (Physical Review. B), 2008, vol. 77, pp. 245202-1-245202-6.
Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.
Ohara, H et al., "21.3: 4.0 In. QVGA AMOLED Display Using In—Ga—Zn-Oxide TFTs With a Novel Passivation Layer," SID Digest '09 : SID International Symposium Digest of Technical Papers, May 31, 2009, pp. 284-287.
Ohara, H et al., "Amorphous In—Ga—Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

(56) References Cited

OTHER PUBLICATIONS

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn-Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTs and Their Application for Large Size AMOLED," AM-FPD '08 Digest of Technical Papers, Jul. 2, 2008, pp. 275-278.

Park. S et al., "Challenge to Future Displays: Transparent AM-OLED Driven by PEALD Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn-Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3-In2O3-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Sanghun Jeon et al.; "180nm Gate Length Amorphous InGaZnO Thin Film Transistor for High Density Image Sensor Applications"; IEDM 10: Technical Digest of International Electron Devices Meeting; Dec. 6, 2010; pp. 504-507.

Ihun Song et al.; "Short Channel Characteristics of Gallium—Indium—Zinc-Oxide Thin Film Transistors for Three-Dimensional Stacking Memory"; IEEE Electron Device Letters; Jun. 2008; pp. 549-552; vol. 29, No. 6.

Tomoyuki Ishii et al.; "A Poly-Silicon TFT With a Sub-5-nm Thick Channel for Low-Power Gain Cell Memory in Mobile Applications"; IEEE Transactions on Electron Devices; Nov. 1, 2004; pp. 1805-1810; , vol. 51, No. 11.

Wonchan Kim et al.; "An Experimental High-Density DRAM Cell with a Built-in Gain Stage"; IEEE Journal of Solid-State Circuits; Aug. 1, 1994; pp. 978-981; vol. 29, No. 8.

Shoji Shukuri et al.; "A Complementary Gain Cell Technology for Sub-1V Supply DRAMs"; IEDM 92: Technical Digest of International Electron Devices Meeting; Dec. 13, 1992; pp. 1006-1008.

Shoji Shukuri et al.; "A Semi-Static Complementary Gain Cell Technology for Sub-1 V Supply DRAM's"; IEEE Transactions on Electron Devices; Jun. 1, 1994; pp. 926-931; vol. 41, No. 6.

* cited by examiner

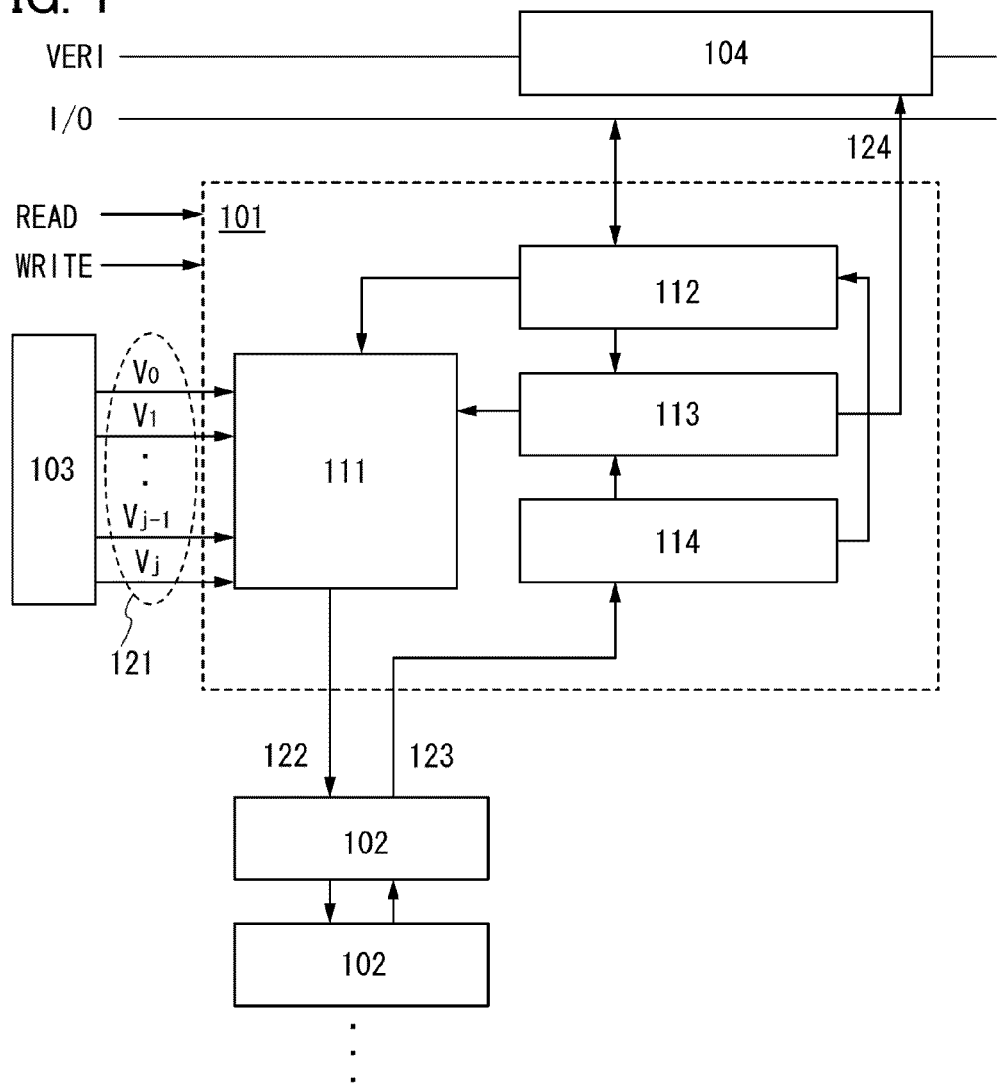

FIG. 16A1
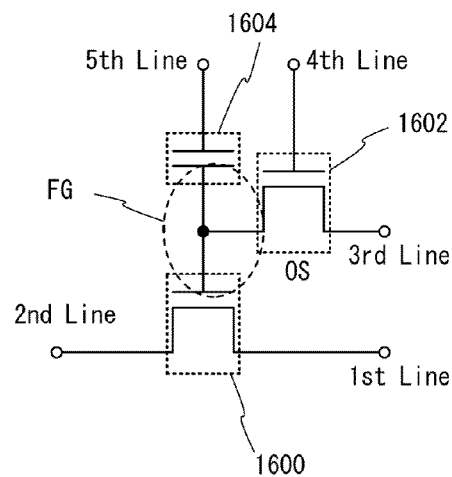
FIG. 16B
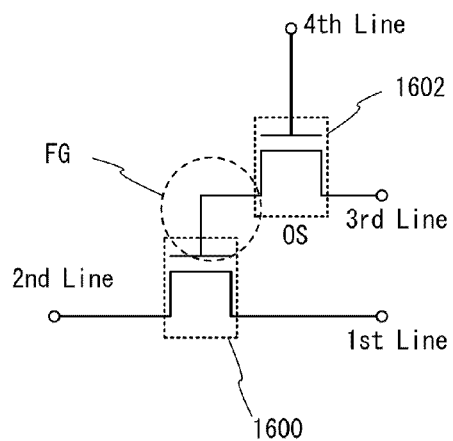
FIG. 16A2
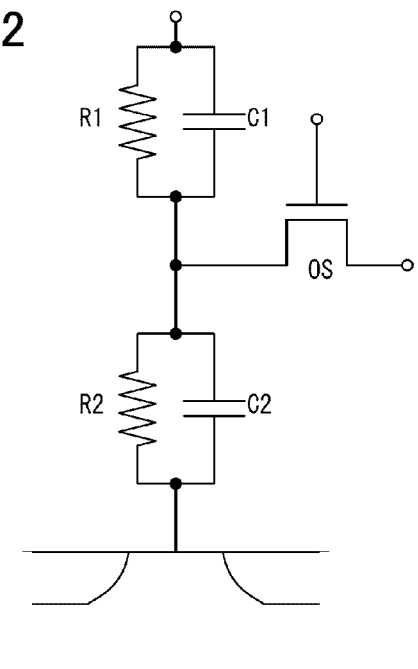

SEMICONDUCTOR DEVICE AND METHOD OF DRIVING SEMICONDUCTOR DEVICE

BACKGROUND OF THE INVENTION

1. Field of the Invention

The present invention relates to a semiconductor device using a semiconductor element and a method for driving the semiconductor device.

2. Description of the Related Art

Storage devices using semiconductor elements are broadly classified into two categories: a volatile device that loses stored data when power supply stops, and a non-volatile device that holds stored data even when power is not supplied.

A typical example of a volatile storage device is a DRAM (dynamic random access memory). A DRAM stores data in such a manner that a transistor included in a storage element is selected and charge is stored in a capacitor.

When data is read from a DRAM, charge in a capacitor is lost according to the above-described principle; thus, another writing operation is necessary whenever data is read out. Moreover, since leakage current (off-state current) flows between a source and a drain of a transistor included in a memory element when the transistor is in an off state, charge flows into or out even if the transistor is not selected, which makes a data holding period short. For that reason, another writing operation (refresh operation) is necessary at predetermined intervals, and it is difficult to sufficiently reduce power consumption. Furthermore, since stored data is lost when power supply stops, an additional storage device using a magnetic material or an optical material is needed in order to hold the data for a long time.

Another example of a volatile storage device is an SRAM (static random access memory). An SRAM holds stored data by using a circuit such as a flip-flop and thus does not need refresh operation. This means that an SRAM has an advantage over a DRAM. However, cost per storage capacity is increased because a circuit such as a flip-flop is used. Moreover, as in a DRAM, stored data in an SRAM is lost when power supply stops.

A typical example of a non-volatile storage device is a flash memory. A flash memory includes a floating gate between a gate electrode and a channel formation region in a transistor and stores data by holding charge in the floating gate. Therefore, a flash memory has advantages in that the data holding time is extremely long (almost permanent) and refresh operation which is necessary in a volatile storage device is not needed (e.g., see Patent Document 1).

However, a gate insulating layer included in a storage element deteriorates by tunneling current generated in writing, so that the storage element stops its function after a predetermined number of writing operations. In order to reduce adverse effects of this problem, a method in which the number of writing operations for storage elements is equalized is employed, for example. However, a complicated peripheral circuit is needed to realize this method. Moreover, employing such a method does not solve the fundamental problem of lifetime. In other words, a flash memory is not suitable for applications in which data is frequently rewritten.

In addition, a flash memory needs high voltage for injecting charge into the floating gate or removing charge from the floating gate, and also needs a circuit for generating high voltage. Further, it takes a relatively long time to inject or remove charge, and it is not easy to perform writing and erasing at higher speed.

REFERENCE

Patent Document

[Patent Document 1] Japanese Published Patent Application No. S57-105889

SUMMARY OF THE INVENTION

In addition to the above problems, fluctuation in the threshold voltage of a transistor included in a memory cell may cause fluctuation in potentials needed for driving a plurality of memory cells (such a potential is also referred to as the threshold voltage of a memory cell). If the operation voltages of the memory cells are determined without consideration of the fluctuation in the threshold voltages of the memory cells, an operation error might be caused. Therefore, the operation voltages of the plurality of memory cells are each set to have a certain range in consideration of the fluctuation in the threshold voltages of the memory cells. This has limited a reduction in the operation voltages of the memory cells.

Moreover, in the case where a memory cell is multi-valued, the operation voltage is increased; therefore, it has been difficult to increase the storage capacity without increasing the operation voltage and the area of the memory cell.

In view of the foregoing problems, one embodiment of the disclosed invention provides a semiconductor device with a novel structure in which stored data can be held even when power is not supplied and there is no limit on the number of times of writing, and provides a method for driving the semiconductor device. Further, one embodiment of the disclosed invention provides a semiconductor device in which variation (distribution width) in the threshold voltages of memory cells after writing is reduced so that the operation voltage can be reduced, the storage capacity can be increased, or operation such as writing, holding, or reading can be surely performed with the writing speed increased, and provides a method for driving the semiconductor device.

In one embodiment of the disclosed invention, a semiconductor device includes a transistor with low off-state current. Note that a transistor with low off-state current includes a semiconductor having a wide band gap (for example, a semiconductor having a band gap of 2 eV or more, preferably 3 eV or more), specifically, an oxide semiconductor.

A transistor with low off-state current can be obtained by forming a channel region of the transistor in a wide-gap semiconductor (for example, a semiconductor having a band gap of 2 eV or more, preferably 3 eV or more) having a wider band gap than a silicon semiconductor. An oxide semiconductor is one of wide-gap semiconductors. It is preferable to use an oxide semiconductor containing at least one element selected from In, Ga, Sn, and Zn, for example, an In—Sn—Ga—Zn—O-based oxide semiconductor, an In—Ga—Zn—O-based oxide semiconductor, or an In—Sn—Zn—O-based oxide semiconductor.

An oxide semiconductor is preferably, in a broad sense, a non-single-crystal oxide semiconductor including a crystal structure which has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis direction (a CAAC-OS (c-axis aligned crystalline oxide semiconductor)).

One embodiment of the disclosed invention is a semiconductor device which includes a plurality of memory cells each including a transistor whose threshold voltage is controlled by charge accumulated in a capacitor and a transistor which controls charging and discharging of the capacitor, a driver circuit which drives the plurality of memory cells, a potential generating circuit, and a write completion detecting circuit which detects all at once whether rewriting of data into the plurality of memory cells is completed or not. The memory cells each include at least two transistors, and a transistor with low off-state current is used as the transistor that controls charging and discharging of the capacitor. With the use of the transistor with low off-state current, fluctuation (change over time) in the charge accumulated in the capacitor can be suppressed.

One embodiment of the disclosed invention is a semiconductor device which includes a plurality of memory cells each including a transistor including an oxide semiconductor and a transistor including a material other than an oxide semiconductor, a driver circuit that drives the plurality of memory cells, a potential generating circuit that generates a plurality of potentials supplied to the driver circuit, and a write completion detecting circuit that detects all at once whether rewriting of data into the plurality of memory cells is completed or not by collectively evaluating the results of verify reading of the plurality of memory cells. The driver circuit includes a data buffer that holds data to be written into each of the plurality of memory cells, a writing circuit that writes one potential of the plurality of potentials into each of the plurality of memory cells as data in accordance with the data held in the data buffer, a reading circuit that reads the data written into the memory cells, and a verifying circuit that verifies whether the read data agrees with the data held in the data buffer or not. The one potential is determined as a write potential for the memory cell where the data agree with each other. The write potential is changed to another potential of the plurality of potentials, for the memory cell where the data do not agree with each other.

Another embodiment of the disclosed invention is a method for driving a semiconductor device which includes a plurality of memory cells each including a transistor including an oxide semiconductor and a transistor including a material other than an oxide semiconductor. The method includes the steps of holding data to be written into each of the plurality of memory cells in a data buffer, writing one potential of a plurality of potentials into each of the plurality of memory cells as data in accordance with the held data, reading the data written into the memory cells, and verifying whether the read data agrees with the data held in the data buffer or not. The one potential is determined as a write potential for the memory cell where the data agree with each other, and the write potential is changed to another potential, which is smaller than the one potential in the case where the read data is larger than the data held in the data buffer or which is larger than the one potential in the case where the read data is smaller than the data held in the data buffer, for the memory cell where the data do not agree with each other.

Another embodiment of the disclosed invention is a semiconductor device which includes a plurality of memory cells each including a transistor including an oxide semiconductor and a transistor including a material other than an oxide semiconductor; a driver circuit including a data buffer, a writing circuit, a reading circuit, and a verifying circuit; a potential generating circuit that generates a plurality of potentials; and a write completion detecting circuit that detects all at once whether rewriting of data into the plurality of memory cells is completed or not by collectively evaluating the results of verify reading of the plurality of memory cells. The data buffer is electrically connected to the writing circuit. The writing circuit is electrically connected to the potential generating circuit through a plurality of first signal lines. The writing circuit is electrically connected to each of the plurality of memory cells through a second signal line. The reading circuit is electrically connected to each of the plurality of memory cells through a third signal line. The verifying circuit is electrically connected to the write completion detecting circuit through a fourth signal line and is electrically connected to the reading circuit, the data buffer, and the writing circuit.

In any of the above structures, the levels of the plurality of potentials generated in the potential generating circuit are different from each other. Each of the plurality of potentials having different levels, which is generated in the potential generating circuit, is supplied to any of the plurality of first signal lines and supplied to the writing circuit. The plurality of potentials generated in the potential generating circuit includes a plurality of potentials for writing of the same data. For example, the plurality of potentials generated in the potential generating circuit can include at least one potential on a low potential side and a plurality of potentials on a high potential side, and the plurality of potentials on the high potential side can include the plurality of potentials for writing of the same data.

In any of the above structures, in each of the plurality of memory cells, one of a source and a drain of the transistor including an oxide semiconductor is electrically connected to a gate of the transistor including a material other than an oxide semiconductor.

In any of the above structures, the writing circuit or the second signal line is electrically connected to the other of the source and the drain of the transistor including an oxide semiconductor included in each of the plurality of memory cells. The reading circuit or the third signal line is electrically connected to one of a source and a drain of the transistor including a material other than an oxide semiconductor included in each of the plurality of memory cells.

In any of the above structures, the data buffer has a function of holding data to be written into each of the plurality of memory cells. The writing circuit has a function of writing one potential of the plurality of potentials into each of the plurality of memory cells as data in accordance with the data held in the data buffer. The reading circuit has a function of reading the data written into the memory cells. The verifying circuit has a function of verifying whether the read data agrees with the data held in the data buffer or not.

In any of the above structures, the one potential is determined as the write potential for the memory cell where the read data agrees with the data held in the data buffer. For the memory cell where the read data does not agree with the data held in the data buffer, the write potential is changed to another potential among the plurality of potentials, which is smaller than the one potential in the case where the read data is larger than the data held in the data buffer or which is larger than the one potential in the case where the read data is smaller than the data held in the data buffer.

In any of the above structures, writing and verifying are performed again after the write potential of the memory cell where the data do not agree with each other is changed to the another potential. After the verifying, the another potential is determined as a write potential for the memory cell where the data agree with each other, and the write potential is changed to still another potential among the plurality of potentials, which is further smaller than the one potential in the case where the read data is larger than the data held in the data buffer or which is further larger than the one potential in the case where the read data is smaller than the data held in the data buffer, for the memory cell where the data do not agree with each other. In this manner, writing and verifying are performed while the write potential is sequentially changed to another potential; thus, the write potentials for the plurality of memory cells are determined.

In any of the above structures, writing operation is completed when all data of the plurality of memory cells agree with the data held in the data buffer in the verifying circuit. Alternatively, writing operation may be completed after performing writing, reading, and verifying predetermined number of times.

In any of the above structures, there is variation (distribution width) in the threshold voltages of the plurality of memory cells in some cases. In that case, the potential determined as the write potential might differ between a memory cell with minimum threshold voltage ($V_{th\_min}$) and a memory cell with maximum threshold voltage ($V_{th\_max}$).

It is preferable that a potential determined as the write potential for the memory cell with the minimum threshold voltage ($V_{th\_min}$) be higher than or equal to the lowest potential of a plurality of potentials for writing of the same data among the plurality of potentials generated in the potential generating circuit. In addition, it is preferable that a potential determined as the write potential for the memory cell with the maximum threshold voltage ($V_{th\_max}$) be lower than or equal to the highest potential among the plurality of potentials generated in the potential generating circuit.

In other words, it is preferable that the lowest potential of the plurality of potentials for writing of the same data among the plurality of potentials generated in the potential generating circuit be lower than or equal to the potential determined as the write potential for the memory cell with the minimum threshold voltage ($V_{th\_min}$). In addition, it is preferable that the highest potential among the plurality of potentials generated in the potential generating circuit be higher than or equal to the potential determined as the write potential for the memory cell with the maximum threshold voltage ($V_{th\_max}$).

In any of the above structures, it is preferable that the transistor including a material other than an oxide semiconductor include a channel formation region provided in a substrate including a semiconductor material.

Note that the substrate including the semiconductor material is preferably a single crystal semiconductor substrate or an SOI substrate. The semiconductor material included in the substrate is preferably silicon. An oxide semiconductor layer preferably includes an oxide semiconductor material containing In, Ga, and Zn.

Note that although the transistor is formed using an oxide semiconductor in the above description, the disclosed invention is not limited to this. A material which can realize the off-state current characteristics equivalent to those of the oxide semiconductor, such as a wide gap material like silicon carbide (specifically, a semiconductor material whose energy gap Eg is larger than 3 eV) may be used.

Since the off-state current of a transistor including an oxide semiconductor is extremely low, stored data can be held for a long time by using the transistor. In other words, power consumption can be adequately reduced because refresh operation becomes unnecessary or the frequency of refresh operation can be extremely low. Moreover, stored data can be held for a long time even when power is not supplied.

In a semiconductor device according to one embodiment of the disclosed invention, even when the threshold voltage of a transistor included in a memory cell fluctuates, variation (distribution width) in the threshold voltages of a plurality of memory cells after writing can be reduced, whereby the operation voltage of the semiconductor device can be reduced. A memory can be multi-valued without increasing the operation voltage and the area of a memory cell, so that the storage capacity per unit area of the semiconductor device can be increased. A semiconductor device in which operation such as writing, holding, or reading can be surely performed with the writing speed increased can be provided.

Further, a semiconductor device according to one embodiment of the disclosed invention does not need high voltage for writing of data and there is no problem of deterioration of elements. For example, unlike a conventional non-volatile memory, it is not necessary to inject and extract electrons into and from a floating gate, and thus a problem such as deterioration of a gate insulating layer does not occur at all. In other words, the semiconductor device according to one embodiment of the disclosed invention does not have a limit on the number of times of rewriting which is a problem in a conventional nonvolatile memory, and reliability thereof is drastically improved. Furthermore, data is written depending on the on state and the off state of the transistor, whereby high-speed operation can be easily realized. In addition, there is no need of operation for erasing data.

Since a transistor including a material other than an oxide semiconductor can operate at sufficiently high speed, a semiconductor device in which the transistor is used in combination with a transistor including an oxide semiconductor can perform operation (e.g., data reading) at sufficiently high speed. Further, a transistor including a material other than an oxide semiconductor can favorably realize a variety of circuits (such as a logic circuit or a driver circuit) which is required to operate at high speed.

Thus, a semiconductor device having a novel feature can be achieved by being provided with both the transistor including a semiconductor material which is not an oxide semiconductor (a transistor capable of operation at a sufficiently high speed, in general) and the transistor including an oxide semiconductor (a transistor whose off-state current is sufficiently low, in general).

In a semiconductor device according to one embodiment of the disclosed invention, the write potential for a memory cell is determined so that desired data can be written from memory cells having threshold voltages closer to the medium value of the assumed varying threshold voltages, and verifying in the case where the read data is large and that in the case where the read data is small can be performed all at once on memory cells to which the desired data cannot be written; thus, writing can be performed at higher speed.

BRIEF DESCRIPTION OF THE DRAWINGS

FIG. 1 is a block diagram of a semiconductor device.

FIGS. 16A1, 16A2, and 16B are circuit diagrams of a memory cell included in a semiconductor device.

DETAILED DESCRIPTION OF THE INVENTION

Figure 2A:
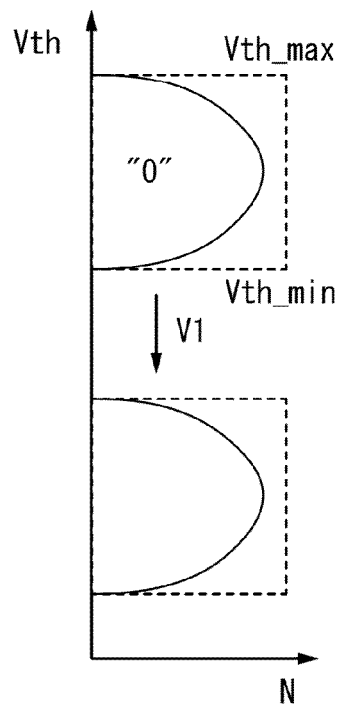
FIGS. 2A to 2D each show distribution of the threshold voltages of memory cells included in a semiconductor device.

Hereinafter, embodiments of the disclosed invention are described with reference to the drawings. Note that the present invention is not limited to the following description and it will be readily appreciated by those skilled in the art that modes and details can be modified in various ways without departing from the spirit and the scope of the present invention. Therefore, the present invention should not be construed as being limited to the description in the following embodiments.

Note that the position, size, range, or the like of each component illustrated in drawings and the like is not accurately represented in some cases for easy understanding. Therefore, the disclosed invention is not necessarily limited to the position, size, range, or the like as disclosed in the drawings and the like.

In this specification and the like, ordinal numbers such as "first", "second", and "third" are used in order to avoid confusion among components, and the terms do not limit the components numerically.

Embodiment 1

In this embodiment, a structure and operation of a semiconductor device according to one embodiment of the disclosed invention will be described with reference to FIG. 1, FIGS. 2A to 2D, FIGS. 3A to 3D, FIGS. 4A and 4B, and FIGS. 5A and 5B.

FIG. 1 is an example of a block diagram of a semiconductor device including memory cells.

The semiconductor device includes a driver circuit 101, a plurality of memory cells 102, a potential generating circuit 103, and a write completion detecting circuit 104. The driver circuit 101 includes a writing circuit 111, a data buffer 112, a verifying circuit 113, and a reading circuit 114. Each of the plurality of memory cells 102 includes a transistor (not shown) including an oxide semiconductor and a transistor (not shown) including a material other than an oxide semiconductor. Further, the semiconductor device includes a wiring for supplying an input/output signal (I/O) (also referred to as a data input/output line), a wiring for supplying an output signal (VERI) (also referred to as a verify signal line), a wiring for supplying a read signal (READ), and a wiring for supplying a write signal (WRITE). The driver circuit 101 is provided for each column having the plurality of memory cells 102.

The data buffer 112 is electrically connected to the writing circuit 111. The writing circuit 111 is electrically connected to the potential generating circuit 103 through a plurality of first signal lines 121. The writing circuit 111 is electrically connected to each of the plurality of memory cells 102 through a second signal line 122. The reading circuit 114 is electrically connected to each of the plurality of memory cells 102 through a third signal line 123. The verifying circuit 113 is electrically connected to the write completion detecting circuit 104 through a fourth signal line 124. The reading circuit 114 is electrically connected to the data buffer 112 and the verifying circuit 113. The verifying circuit 113 is electrically connected to the data buffer 112 and the writing circuit 111.

The driver circuit 101 has a function of driving the plurality of memory cells. The potential generating circuit 103 has a function of generating a plurality of potentials ($V_0$ to $V_j$) (j is an integer of 2 or more).

The levels of the plurality of potentials ($V_0$ to $V_j$) (j is an integer of 2 or more) generated in the potential generating circuit 103 are different from each other. Each of the plurality of potentials ($V_0$ to $V_j$) (j is an integer of 2 or more) having different levels, which is generated in the potential generating circuit 103, is supplied to any of the plurality of first signal lines 121 and supplied to the writing circuit 111.

The data buffer 112 has a function of holding data to be written into each of the plurality of memory cells 102 and holding data read therefrom. The writing circuit 111 has a function of writing one potential (e.g., $V_1$) of the plurality of potentials generated in the potential generating circuit 103 into each of the plurality of memory cells 102 as data in accordance with the data held in the data buffer 112. The reading circuit 114 has a function of reading the data written into the memory cells 102. The verifying circuit 113 has a function of verifying whether the data read by the reading circuit 114 agrees with the write data held in the data buffer 112 or not.

The one potential (e.g., $V_1$) is determined as a write potential for the memory cell 102 where the data read by the reading circuit 114 agrees with the write data held in the data buffer 112. The write potential is changed to either of two other potentials (e.g., $V_2$ or $V_3$) of the plurality of potentials generated in the potential generating circuit 103, for the memory cell 102 where the data read by the reading circuit 114 does not agree with the write data held in the data buffer 112.

After the write potential is changed to the either of the two other potentials (e.g., $V_2$ or $V_3$), writing and verifying are performed again on the memory cell 102 where the data read by the reading circuit 114 does not agree with the write data held in the data buffer 112. After the verifying, the either of the two other potentials (e.g., $V_2$ or $V_3$) is determined as the write potential for the memory cell 102 where the data read by the reading circuit 114 agrees with the write data held in the data buffer 112. For the memory cell 102 where the data read by the reading circuit 114 does not agree with the write data held in the data buffer 112, data is input to the write completion detecting circuit 104 from the verifying circuit 113 and the write potential is changed to either of two still other potentials (e.g., $V_{j-1}$ or $V_j$) of the plurality of potentials. In this manner, writing and verifying are performed while the write potential is sequentially changed to another potential; thus, the write potentials for the plurality of memory cells are determined.

When all data of the memory cells 102 in one row agree with the write data held in the data buffer 112 in the verifying circuit 113, data is input to the write completion detecting circuit 104 from the verifying circuit 113; thus, writing operation is completed.

In the above structure, fluctuation in the threshold voltage of a transistor included in the memory cell 102, or the like may cause variation (distribution width) in potentials needed for driving the plurality of memory cells 102 (such a potential is also referred to as the threshold voltage of a memory cell).

An example of a procedure for writing data "1" into the plurality of memory cells 102 having data "0" in the case where there is variation (distribution width) in the threshold voltages of the plurality of memory cells 102 is shown in FIGS. 2A to 2D, FIGS. 3A to 3D, and FIGS. 4A and 4B. Note that among the plurality of potentials ($V_0$ to $V_j$) (j is an integer of 2 or more) generated in the potential generating circuit 103, the potential $V_0$ (e.g., a ground potential) is a potential for writing data "0" and the potentials $V_1$ to $V_j$ are potentials for writing data "1".

FIG. 2A is a graph showing distribution of the threshold voltages $V_{th}$ of the plurality of memory cells 102, where the horizontal axis represents the number N of memory cells and the vertical axis represents the threshold voltage $V_{th}$ of the memory cells 102. FIG. 2A shows distribution of the threshold voltages $V_{th}$ before writing (data "0") and after writing. The distribution of the threshold voltages $V_{th}$ before writing (data "0") is shown above an arrow, and the distribution of the threshold voltages $V_{th}$ after writing is shown below the arrow. The level of a potential used for writing ($V=V_1$) is shown beside the arrow.

As shown in FIG. 2A, writing (referred to as Writing 1) is performed on the plurality of memory cells 102 with the use of one potential (here, $V_1$) of the plurality of potentials ($V_0$ to $V_j$) (j is an integer of 2 or more) generated in the potential generating circuit 103 as a write potential. Consequently, the distribution of the threshold voltages $V_{th}$ before writing (data "0") is changed to the distribution of the threshold voltages $V_{th}$ after writing.

Figure 2B:
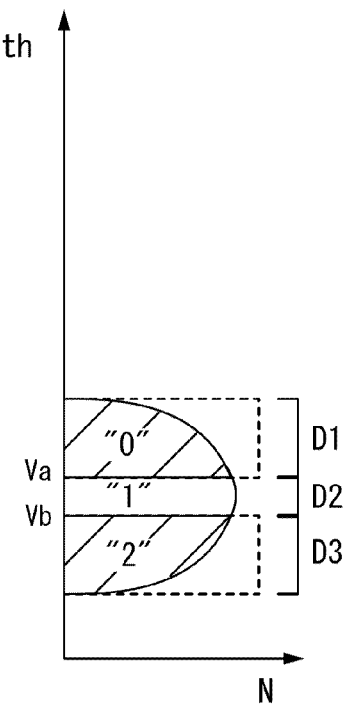

Next, as shown in FIG. 2B, data written into the memory cells 102 where Writing 1 is performed is read by the reading circuit 114, and whether the data read by the reading circuit 114 agrees with write data held in the data buffer 112 (i.e., data to be written into the memory cells 102) or not is verified (this step is referred to as Verifying 1).

In Verifying 1, it is determined that the data read by the reading circuit 114 is data "0" when the threshold voltage $V_{th}$ of the memory cell 102 is higher than Va, data "2" when the threshold voltage $V_{th}$ of the memory cell 102 is lower than Vb, and data "1" when the threshold voltage $V_{th}$ of the memory cell 102 is higher than or equal to Vb and lower than or equal to Va.

Specifically, a range denoted by D2 in FIG. 2B is the range where the data read by the reading circuit 114 agrees with the write data held in the data buffer 112 (i.e., the data to be written into the memory cells 102) (this state is also referred to as Verify OK). In the memory cells 102 in the range denoted by D2 in FIG. 2B (i.e., the memory cells 102 in the state of Verify OK), data "1" can be obtained when the potential $V_1$ is used as the write potential. Thus, in the memory cells 102 in the range denoted by D2 in FIG. 2B (i.e., the memory cells 102 in the state of Verify OK), the one potential ($V_1$) is determined as the write potential.

Ranges denoted by D1 and D3 in FIG. 2B are the ranges where the data read by the reading circuit 114 does not agree with the write data held in the data buffer 112 (i.e., the data to be written into the memory cells 102) (this state is also referred to as Verify NG). In the memory cells 102 in the ranges denoted by D1 and D3 in FIG. 2B (i.e., the memory cells 102 in the state of Verify NG), data "1" cannot be obtained and data "0" and data "2" are detected when the potential $V_1$ is used as the write potential.

In the memory cells 102 in the ranges denoted by D1 and D3 in FIG. 2B (i.e., the memory cells 102 in the state of Verify NG, in which data "0" and data "2" are detected), the write potential is changed to either of two other potentials (here, $V_2$ or $V_3$) of the plurality of potentials generated in the potential generating circuit 103. After that, writing and verifying are performed again.

Figure 2C:
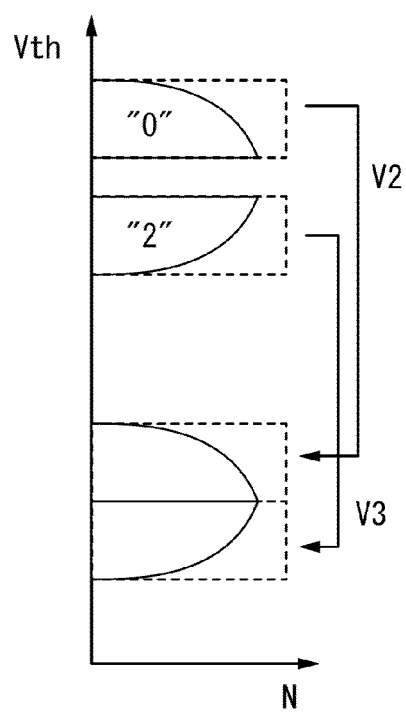

FIG. 2C shows the distribution of the threshold voltages $V_{th}$ in the case where writing (referred to as Writing 2) is performed on the memory cells 102 in the ranges denoted by D1 and D3 in FIG. 2B with the use of the two other potentials ($V_2$ or $V_3$) of the plurality of potentials generated in the potential generating circuit 103 as the write potential. Note that FIG. 2C shows only the memory cells 102 in the ranges denoted by D1 and D3 in FIG. 2B for convenience; however, writing may be concurrently performed on other memory cells 102 in the step of Writing 2. In other words, the potential $V_1$ may be concurrently written into the memory cells 102 in the range denoted by D2 in FIG. 2B in the step of Writing 2.

In FIG. 2C, the distribution of the threshold voltages before writing (data "0" and data "2") of the potentials $V_2$ and $V_3$ is similar to the distribution of the threshold voltages before writing (data "0" in FIG. 2A) of the potential $V_1$ for convenience; however, the distribution of the threshold voltages before writing (data "0" and data "2") of the potentials $V_2$ and $V_3$ may be similar to the distribution of the threshold voltages after writing (data "0" and data "2" in FIG. 2B) of the potential $V_1$.

As shown in FIG. 2C, when writing (Writing 2) is performed with the use of the potentials $V_2$ and $V_3$ of the plurality of potentials ($V_0$ to $V_j$) (j is an integer of 2 or more) generated in the potential generating circuit 103 as the write potential, the distribution of the threshold voltages $V_{th}$ before writing (data "0" and data "2") is changed to the distribution of the threshold voltages $V_{th}$ after writing.

Figure 2D:
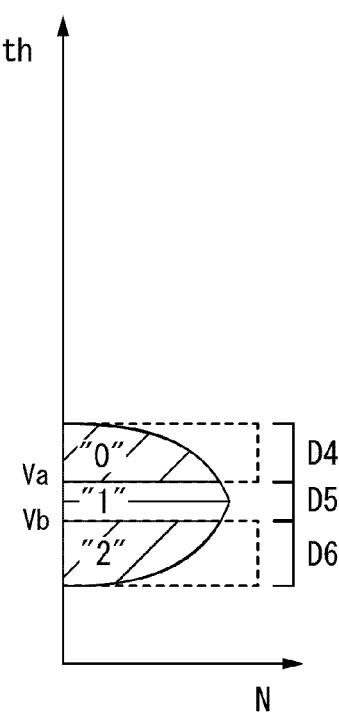

Next, as shown in FIG. 2D, data written into the memory cells 102 is read by the reading circuit 114, and whether the data read by the reading circuit 114 agrees with write data held in the data buffer 112 (i.e., data to be written into the memory cells 102) or not is verified (this step is referred to as Verifying 2). Also here, only the memory cells 102 in the ranges denoted by D1 and D3 in FIG. 2B are shown for convenience.

In Verifying 2, it is determined that the data read by the reading circuit 114 is data "0" when the threshold voltage $V_{th}$ of the memory cell 102 is higher than Va, data "2" when the threshold voltage $V_{th}$ of the memory cell 102 is lower than Vb, and data "1" when the threshold voltage $V_{th}$ of the memory cell 102 is higher than or equal to Vb and lower than or equal to Va.

Specifically, a range denoted by D5 in FIG. 2D is the range where the data read by the reading circuit 114 agrees with the write data held in the data buffer 112 (i.e., the data to be written into the memory cells 102) (this state is also referred to as Verify OK). In the memory cells 102 in the range denoted by D5 in FIG. 2D (i.e., the memory cells 102 in the state of Verify OK), data "1" can be obtained when the potential $V_2$ or $V_3$ is used as the write potential. Thus, in the memory cells 102 in the range denoted by D5 in FIG. 2D (i.e., the memory cells 102 in the state of Verify OK), the two other potentials ($V_2$ or $V_3$) are determined as the write potential.

Ranges denoted by D4 and D6 in FIG. 2D are the ranges where the data read by the reading circuit 114 does not agree with the write data held in the data buffer 112 (i.e., the data to be written into the memory cells 102) (this state is also referred to as Verify NG). In the memory cells 102 in the ranges denoted by D4 and D6 in FIG. 2D (i.e., the memory cells 102 in the state of Verify NG), data "1" cannot be obtained and data "0" and data "2" are detected when the potential $V_2$ or $V_3$ is used as the write potential.

In the memory cells 102 in the ranges denoted by D4 and D6 in FIG. 2D (i.e., the memory cells 102 in the state of Verify NG, in which data "0" and data "2" are detected), the write potential is changed to either of two still other potentials (here, $V_4$ or $V_5$) of the plurality of potentials generated in the potential generating circuit 103. After that, writing and verifying are performed again.

Figure 3A:
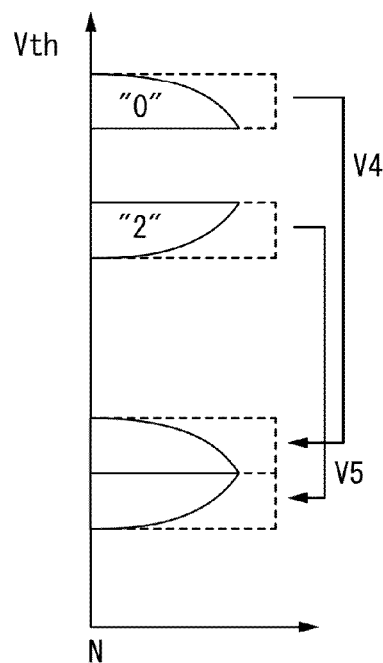
FIGS. 3A to 3D each show distribution of the threshold voltages of memory cells included in a semiconductor device.

FIG. 3A shows the distribution of the threshold voltages $V_{th}$ in the case where writing (referred to as Writing 3) is performed on the memory cells 102 in the ranges denoted by D4 and D6 in FIG. 2D with the use of the two still other potentials ($V_4$ or $V_5$) of the plurality of potentials generated in the potential generating circuit 103 as the write potential. Note that FIG. 3A shows only the memory cells 102 in the ranges denoted by D4 and D6 in FIG. 2D for convenience; however, writing may be concurrently performed on other memory cells 102 in the step of Writing 3. In other words, the potential $V_1$ may be concurrently written into the memory cells 102 in the range denoted by D2 in FIG. 2B in the step of Writing 3, and the potential $V_2$ or $V_3$ may be concurrently written into the memory cells 102 in the range denoted by D5 in FIG. 2D in the step of Writing 3.

In FIG. 3A, the distribution of the threshold voltages before writing (data "0" and data "2") of the potentials $V_4$ and $V_5$ is similar to the distribution of the threshold voltages before writing (data "0" in FIG. 2A) of the potential $V_1$ for convenience; however, the distribution of the threshold voltages before writing (data "0" and data "2") of the potentials $V_4$ and $V_5$ may be similar to the distribution of the threshold voltages after writing (data "0" and data "2" in FIG. 2D) of the potentials $V_2$ and $V_3$.

As shown in FIG. 3A, when writing (Writing 3) is performed with the use of the potentials $V_4$ and $V_5$ of the plurality of potentials ($V_0$ to $V_j$) (j is an integer of 2 or more) generated in the potential generating circuit 103 as the write potential, the distribution of the threshold voltages $V_{th}$ before writing (data "0" and data "2") is changed to the distribution of the threshold voltages $V_{th}$ after writing.

Figure 3B:
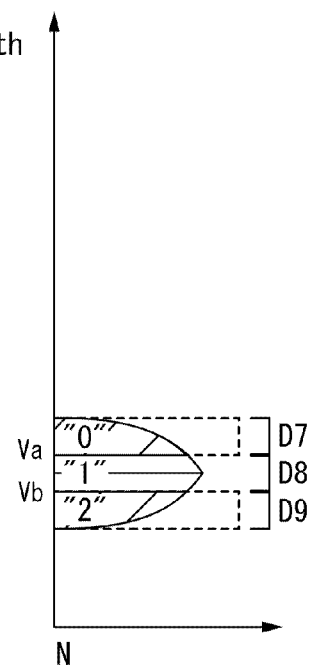

Next, as shown in FIG. 3B, data written into the memory cells 102 is read by the reading circuit 114, and whether the data read by the reading circuit 114 agrees with write data held in the data buffer 112 (i.e., data to be written into the memory cells 102) or not is verified (this step is referred to as Verifying 3). Also here, only the memory cells 102 in the ranges denoted by D4 and D6 in FIG. 2D are shown for convenience.

In Verifying 3, it is determined that the data read by the reading circuit 114 is data "0" when the threshold voltage $V_{th}$ of the memory cell 102 is higher than Va, data "2" when the threshold voltage $V_{th}$ of the memory cell 102 is lower than Vb, and data "1" when the threshold voltage $V_{th}$ of the memory cell 102 is higher than or equal to Vb and lower than or equal to Va.

Specifically, a range denoted by D8 in FIG. 3B is the range where the data read by the reading circuit 114 agrees with the write data held in the data buffer 112 (i.e., the data to be written into the memory cells 102) (this state is also referred to as Verify OK). In the memory cells 102 in the range denoted by D8 in FIG. 3B (i.e., the memory cells 102 in the state of Verify OK), data "1" can be obtained when the potential $V_4$ or $V_5$ is used as the write potential. Thus, in the memory cells 102 in the range denoted by D8 in FIG. 3B (i.e., the memory cells 102 in the state of Verify OK), the two still other potentials (here, $V_4$ or $V_5$) are determined as the write potential.

Ranges denoted by D7 and D9 in FIG. 3B are the ranges where the data read by the reading circuit 114 does not agree with the write data held in the data buffer 112 (i.e., the data to be written into the memory cells 102) (this state is also referred to as Verify NG). In the memory cells 102 in the ranges denoted by D7 and D9 in FIG. 3B (i.e., the memory cells 102 in the state of Verify NG), data "1" cannot be obtained and data "0" and data "2" are detected when the potential $V_4$ or $V_5$ is used as the write potential.

In the memory cells 102 in the ranges denoted by D7 and D9 in FIG. 3B (i.e., the memory cells 102 in the state of Verify NG, in which data "0" and data "2" are detected), the write potential is changed to either of two further still other potentials (here, $V_6$ or $V_7$) of the plurality of potentials generated in the potential generating circuit 103. After that, writing and verifying are performed again.

Figure 3C:
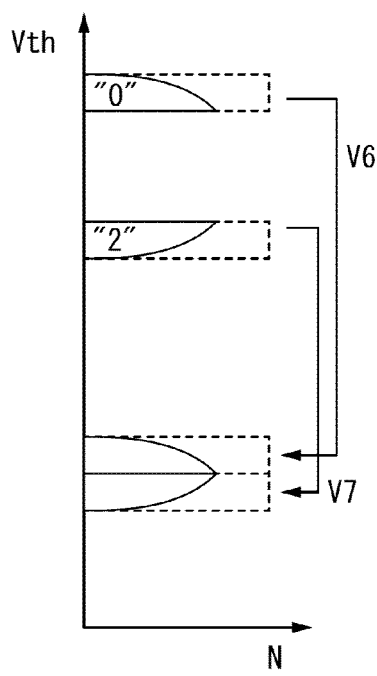

FIG. 3C shows the distribution of the threshold voltages $V_{th}$ in the case where writing (referred to as Writing 4) is performed on the memory cells 102 in the ranges denoted by D7 and D9 in FIG. 3B with the use of the two further still other potentials ($V_6$ or $V_7$) of the plurality of potentials generated in the potential generating circuit 103 as the write potential. Note that FIG. 3C shows only the memory cells 102 in the ranges denoted by D7 and D9 in FIG. 3B for convenience; however, writing may be concurrently performed on other memory cells 102 in the step of Writing 4. In other words, the potential $V_1$ may be concurrently written into the memory cells 102 in the range denoted by D2 in FIG. 2B in the step of Writing 4, the potential $V_2$ or $V_3$ may be concurrently written into the memory cells 102 in the range denoted by D5 in FIG. 2D in the step of Writing 4, and the potential $V_4$ or $V_5$ may be concurrently written into the memory cells 102 in the range denoted by D8 in FIG. 3B in the step of Writing 4.

In FIG. 3C, the distribution of the threshold voltages before writing (data "0" and data "2") of the potentials $V_6$ and $V_7$ is similar to the distribution of the threshold voltages before writing (data "0" in FIG. 2A) of the potential $V_1$ for convenience; however, the distribution of the threshold voltages before writing (data "0" and data "2") of the potentials $V_6$ and $V_7$ may be similar to the distribution of the threshold voltages after writing (data "0" and data "2" in FIG. 2D) of the potentials $V_4$ and $V_5$.

As shown in FIG. 3C, when writing (Writing 4) is performed with the use of the potentials $V_6$ and $V_7$ of the plurality of potentials ($V_0$ to $V_j$) (j is an integer of 2 or more) generated in the potential generating circuit 103 as the write potential, the distribution of the threshold voltages $V_{th}$ before writing (data "0" and data "2") is changed to the distribution of the threshold voltages $V_{th}$ after writing.

Figure 3D:
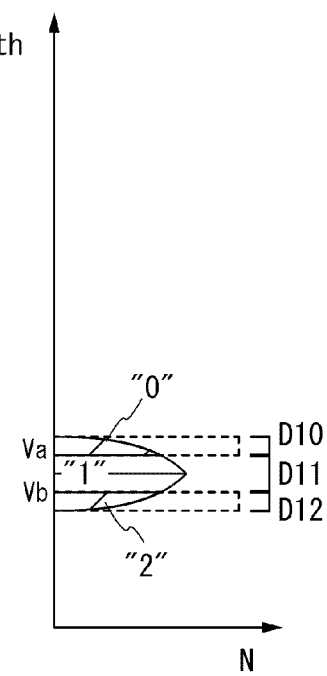

Next, as shown in FIG. 3D, data written into the memory cells 102 is read by the reading circuit 114, and whether the data read by the reading circuit 114 agrees with write data held in the data buffer 112 (i.e., data to be written into the memory cells 102) or not is verified (this step is referred to as Verifying 4). Also here, only the memory cells 102 in the ranges denoted by D7 and D9 in FIG. 3B are shown for convenience.

In Verifying 4, it is determined that the data read by the reading circuit 114 is data "0" when the threshold voltage $V_{th}$ of the memory cell 102 is higher than Va, data "2" when the threshold voltage $V_{th}$ of the memory cell 102 is lower than Vb, and data "1" when the threshold voltage $V_{th}$ of the memory cell 102 is higher than or equal to Vb and lower than or equal to Va.

Specifically, a range denoted by D11 in FIG. 3D is the range where the data read by the reading circuit 114 agrees with the write data held in the data buffer 112 (i.e., the data to be written into the memory cells 102) (this state is also referred to as Verify OK). In the memory cells 102 in the range denoted by D11 in FIG. 3D (i.e., the memory cells 102 in the state of Verify OK), data "1" can be obtained when the potential $V_6$ or $V_7$ is used as the write potential. Thus, in the memory cells 102 in the range denoted by D11 in FIG. 3D (i.e., the memory cells 102 in the state of Verify OK), the two further still other potentials ($V_6$ or $V_7$) are determined as the write potential.

Ranges denoted by D10 and D12 in FIG. 3D are the ranges where the data read by the reading circuit 114 does not agree with the write data held in the data buffer 112 (i.e., the data to be written into the memory cells 102) (this state is also referred to as Verify NG). In the memory cells 102 in the ranges denoted by D10 and D12 in FIG. 3D (i.e., the memory cells 102 in the state of Verify NG), data "1" cannot be obtained and data "0" and data "2" are detected when the potential $V_6$ or $V_7$ is used as the write potential.

In the memory cells 102 in the ranges denoted by D10 and D12 in FIG. 3D (i.e., the memory cells 102 in the state of Verify NG, in which data "0" and data "2" are detected), the write potential is changed to either of two yet further still other potentials (here, $V_8$ or $V_9$) of the plurality of potentials generated in the potential generating circuit 103. After that, writing and verifying are performed again.

Figure 4A:
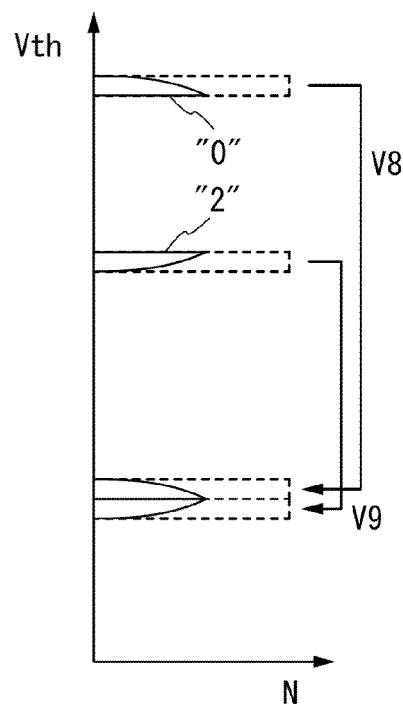
FIGS. 4A and 4B each show distribution of the threshold voltages of memory cells included in a semiconductor device.

FIG. 4A shows the distribution of the threshold voltages $V_{th}$ in the case where writing (referred to as Writing 5) is performed on the memory cells 102 in the ranges denoted by D10 and D12 in FIG. 3D with the use of the two yet further still other potentials ($V_8$ or $V_9$) of the plurality of potentials generated in the potential generating circuit 103 as the write potential. Note that FIG. 4A shows only the memory cells 102 in the ranges denoted by D10 and D12 in FIG. 3D for convenience; however, writing may be concurrently performed on other memory cells 102 in the step of Writing 5. In other words, the potential $V_1$ may be concurrently written into the memory cells 102 in the range denoted by D2 in FIG. 2B in the step of Writing 5, the potential $V_2$ or $V_3$ may be concurrently written into the memory cells 102 in the range denoted by D5 in FIG. 2D in the step of Writing 5, the potential $V_4$ or $V_5$ may be concurrently written into the memory cells 102 in the range denoted by D8 in FIG. 3B in the step of Writing 5, and the potential $V_6$ or $V_7$ may be concurrently written into the memory cells 102 in the range denoted by D11 in FIG. 3D in the step of Writing 5.

In FIG. 4A, the distribution of the threshold voltages before writing (data "0" and data "2") of the potentials $V_8$ and $V_9$ is similar to the distribution of the threshold voltages before writing (data "0" and data "2" in FIG. 3A) of the potentials $V_4$ and $V_5$ for convenience; however, the distribution of the threshold voltages before writing (data "0" and data "2") of the potentials $V_8$ and $V_9$ may be similar to the distribution of the threshold voltages after writing (data "0" and data "2" in FIG. 3D) of the potentials $V_6$ and $V_7$.

As shown in FIG. 4A, when writing (Writing 5) is performed with the use of the potentials $V_8$ and $V_9$ of the plurality of potentials ($V_0$ to $V_j$) (j is an integer of 2 or more) generated in the potential generating circuit 103 as the write potential, the distribution of the threshold voltages $V_{th}$ before writing (data "0" and data "2") is changed to the distribution of the threshold voltages $V_{th}$ after writing.

Figure 4B:
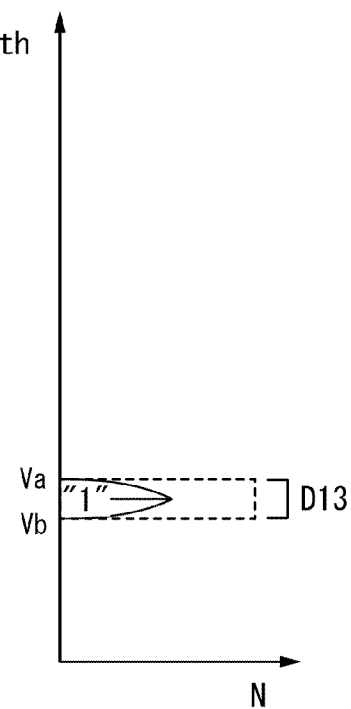

Next, as shown in FIG. 4B, data written into the memory cells 102 is read by the reading circuit 114, and whether the data read by the reading circuit 114 agrees with write data held in the data buffer 112 (i.e., data to be written into the memory cells 102) or not is verified (this step is referred to as Verifying 5). Also here, only the memory cells 102 in the ranges denoted by D10 and D12 in FIG. 3D are shown for convenience.

In Verifying 5, it is determined that the data read by the reading circuit 114 is data "0" when the threshold voltage $V_{th}$ of the memory cell 102 is higher than Va, data "2" when the threshold voltage $V_{th}$ of the memory cell 102 is lower than Vb, and data "1" when the threshold voltage $V_{th}$ of the memory cell 102 is higher than or equal to Vb and lower than or equal to Va.

Specifically, a range denoted by D13 in FIG. 4B is the range where the data read by the reading circuit 114 agrees with the write data held in the data buffer 112 (i.e., the data to be written into the memory cells 102) (this state is also referred to as Verify OK). In the memory cells 102 in the range denoted by D13 in FIG. 4B (i.e., the memory cells 102 in the state of Verify OK), data "1" can be obtained when the potential $V_8$ or $V_9$ is used as the write potential. Thus, in the memory cells 102 in the range denoted by D13 in FIG. 4B (i.e., the memory cells 102 in the state of Verify OK), the two yet further still other potentials (here, $V_8$ or $V_9$) are determined as the write potential.

Here, the data read by the reading circuit 114 all agrees with the data held in the data buffer 112 (i.e., the data to be written into the memory cells 102) (this state is also referred to as Verify OK). The range is denoted by D13 in FIG. 4B. At this stage, the write potentials (here, any of $V_1$, $V_2$, $V_3$, $V_4$, $V_5$, $V_6$, $V_7$, $V_8$, and $V_9$) are determined for all the plurality of memory cells 102. Note that the range denoted by D13 in FIG. 4B corresponds to the range denoted by D2 in FIG. 2B.

Figure 5A:
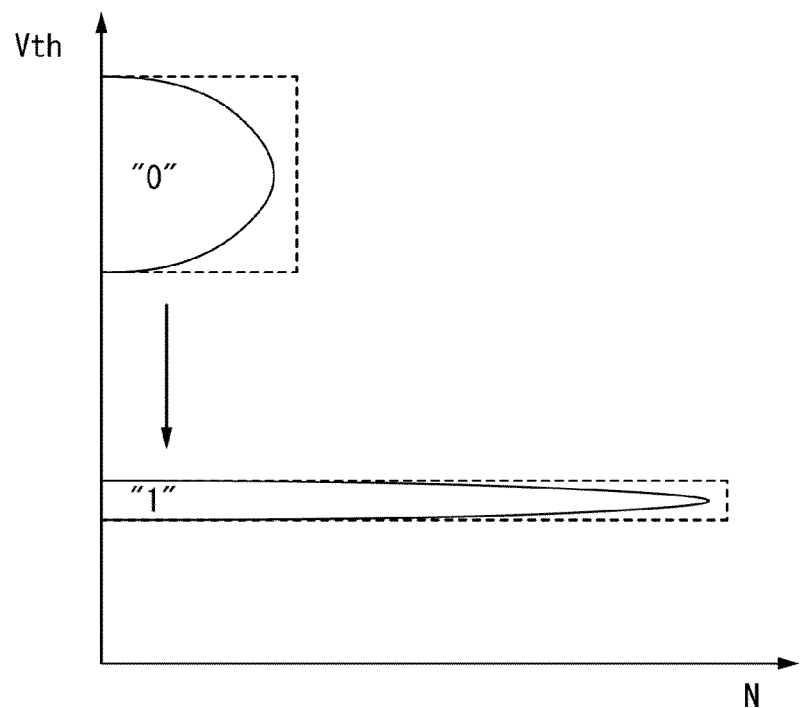
FIGS. 5A and 5B each show distribution of the threshold voltages of memory cells included in a semiconductor device.

When all the plurality of memory cells 102 are in the state of Verify OK, a signal is input to the write completion detecting circuit from the verifying circuit; thus, writing operation is completed. Alternatively, writing operation may be completed after performing writing and verifying predetermined number of times (e.g., j times). When the writing operation is completed, variation (distribution width) in the threshold voltages $V_{th}$ after writing (data "1") can be smaller than variation (distribution width) in the threshold voltages $V_{th}$ before writing (data "0") as shown in FIG. 5A, for example. Consequently, the operation voltage can be reduced.

Figure 5B:
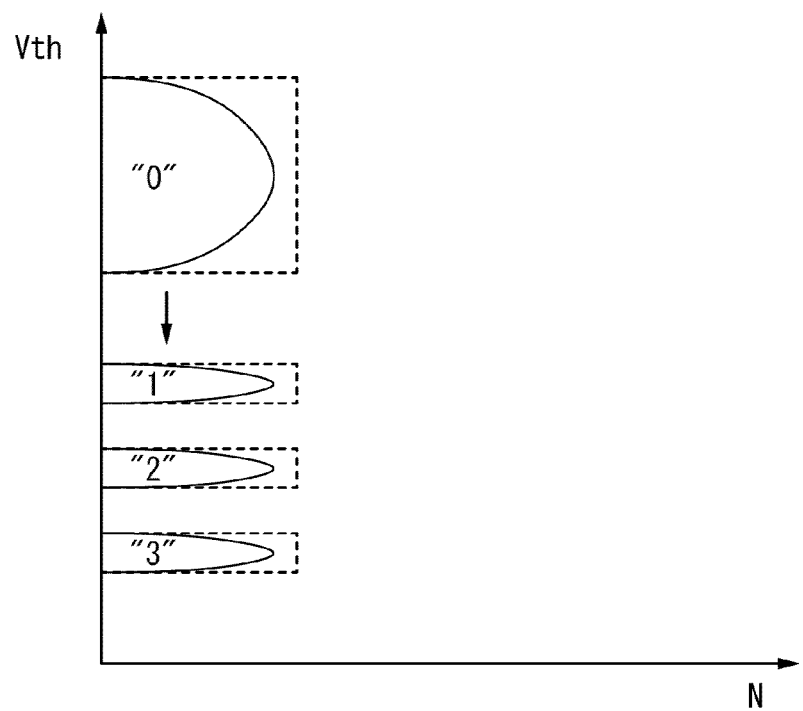

An example in which the memory cell 102 has three-level data "0", "1", or "2" is described above; the above structure can also be applied in the case where the memory cell 102 has data of four or more levels (multi-level data). Since variation (distribution width) in the threshold voltages $V_{th}$ after writing can be made smaller than variation (distribution width) in the threshold voltages $V_{th}$ before writing, the above structure is advantageous also in the case of a multi-valued memory. As shown in FIG. 5B, for example, variation (distribution width) in the threshold voltages $V_{th}$ after writing (data "1", "2", and "3") can be made smaller than variation (distribution width) in the threshold voltages $V_{th}$ before writing (data "0"). Consequently, the storage capacity can be increased without increasing the operation voltage and the area of a memory cell.

Variation (distribution width) in the threshold voltages $V_{th}$ after writing can be suppressed to around a potential width between adjacent potentials of plurality of potentials for writing of the same data. By generating the plurality of potentials for writing of the same data at short intervals, variation (distribution width) in the threshold voltages $V_{th}$ of the memory cells after writing can be reduced.

As shown in FIGS. 2A to 2D, FIGS. 3A to 3D, and FIGS. 4A and 4B, in the case where there is variation (distribution width) in the threshold voltages of the plurality of memory cells 102, the potential determined as the write potential might differ between a memory cell with the minimum threshold voltage ($V_{th\_min}$) and a memory cell with the maximum threshold voltage ($V_{th\_max}$) even when the same data is written.

For example, a potential determined as the write potential for writing data "1" into the memory cell 102 with the minimum threshold voltage ($V_{th\_min}$) is the potential $V_9$ as shown in FIGS. 4A and 4B, whereas a potential determined as the write potential for writing data "1" into the memory cell 102 with the maximum threshold voltage ($V_{th\_max}$) is the potential $V_8$ as shown in FIGS. 4A and 4B.

Here, it is preferable that a potential (here, $V_9$) determined as the write potential for the memory cell 102 with the minimum threshold voltage ($V_{th\_min}$) be higher than or equal to the lowest potential of potentials (i.e., $V_1$ to $V_j$) (j is an integer of 2 or more) for writing data "1" among the plurality of potentials ($V_0$ to $V_j$) (j is an integer of 2 or more) generated in the potential generating circuit. In addition, it is preferable that a potential (here, $V_8$) determined as the write potential for the memory cell 102 with the maximum threshold voltage ($V_{th\_max}$) be lower than or equal to the highest potential among the plurality of potentials ($V_1$ to $V_j$) (j is an integer of 2 or more) for writing data "1" generated in the potential generating circuit.

In other words, it is preferable that the lowest potential of the potentials (i.e., $V_1$ to $V_j$) (j is an integer of 2 or more) for writing data "1" among the plurality of potentials generated in the potential generating circuit be lower than or equal to the potential (here, $V_9$) determined as the write potential for the memory cell with the minimum threshold voltage ($V_{th\_min}$). In addition, it is preferable that the highest potential among the plurality of potentials for writing data "1" generated in the potential generating circuit be higher than or equal to the potential (here, $V_8$) determined as the write potential for the memory cell with the maximum threshold voltage ($V_{th\_max}$).

In the above structure, in each of the plurality of memory cells 102, one of a source and a drain of the transistor (not shown) including an oxide semiconductor can be electrically connected to a gate of the transistor (not shown) including a material other than an oxide semiconductor.

In the above structure, the second signal line 122 which electrically connects the writing circuit 111 to each of the plurality of memory cells 102 can be electrically connected to the other of the source and the drain of the transistor (not shown) including an oxide semiconductor included in each of the plurality of memory cells 102.

In the above structure, the third signal line 123 which electrically connects the reading circuit 114 to each of the plurality of memory cells 102 can be electrically connected to one of a source and a drain of the transistor (not shown) including a material other than an oxide semiconductor included in each of the plurality of memory cells 102.

In the above structure, it is preferable that the transistor (not shown) including a material other than an oxide semiconductor include a channel formation region provided in a substrate including a semiconductor material.

In the semiconductor device according to this embodiment, even when the threshold voltage of a transistor included in the memory cell 102 fluctuates, variation (distribution width) in the threshold voltages of the plurality of memory cells 102 after writing can be reduced, whereby the operation voltage of the semiconductor device can be reduced. A memory can be multi-valued without increasing the operation voltage and the area of a memory cell, so that the storage capacity per unit area of the semiconductor device can be increased. A semiconductor device in which operation such as writing, holding, or reading can be surely performed can be provided.

The structures, methods, and the like described in this embodiment can be combined as appropriate with any of the structures, methods, and the like described in the other embodiments.

Embodiment 2

In this embodiment, a circuit configuration and an operation of a semiconductor device according to one embodiment of the disclosed invention will be described with reference to FIG. 6, FIG. 7, FIG. 8, FIG. 9, FIG. 10, FIG. 11, FIG. 12, FIG. 13, FIG. 14, and FIG. 15. Note that in each of circuit diagrams, in some cases, "OS" is written beside a transistor in order to indicate that the transistor includes an oxide semiconductor.

(Description of Driver Circuit)

Figure 6:
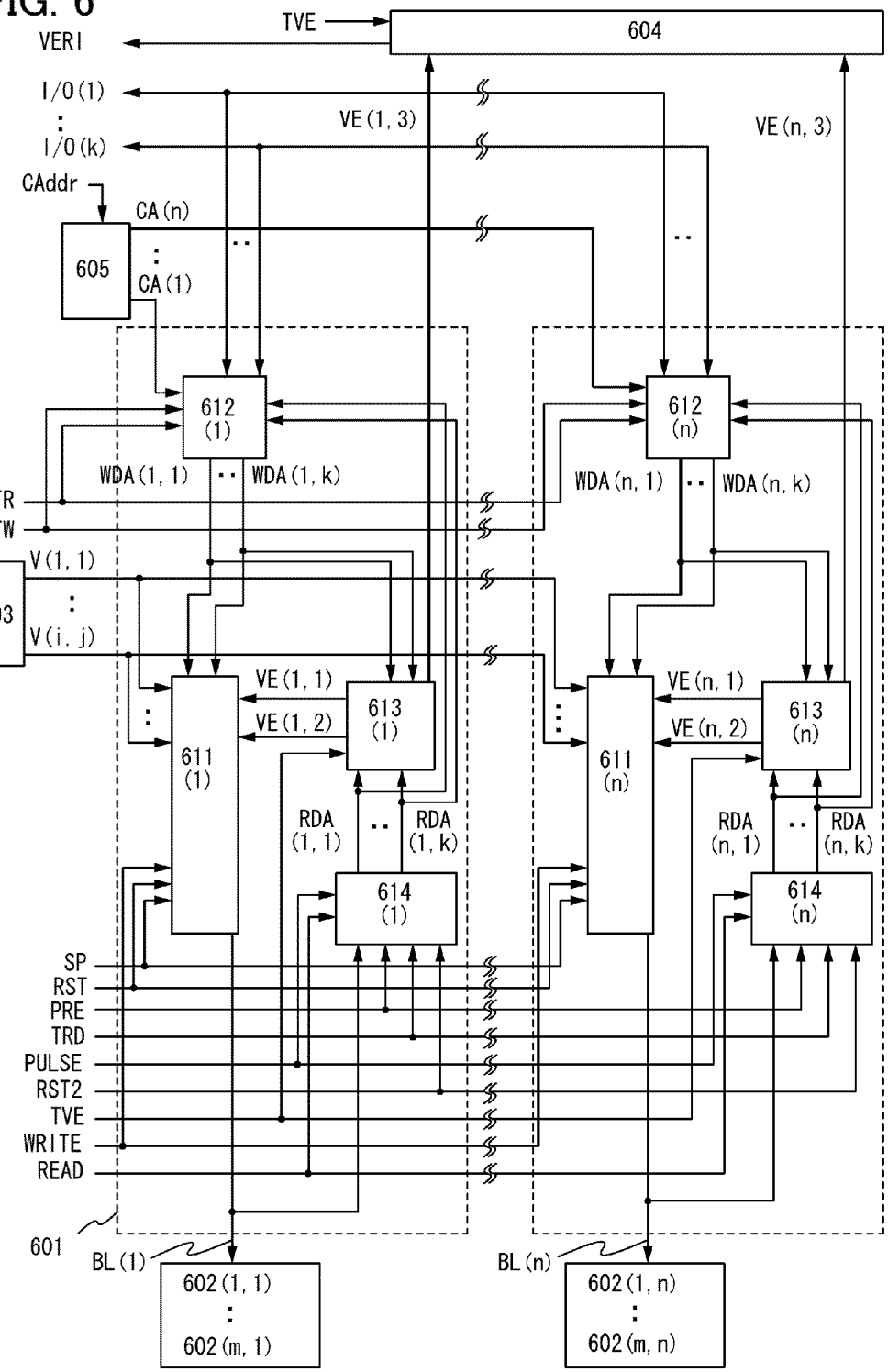
FIG. 6 is a circuit diagram of a semiconductor device.

FIG. 6 is a block diagram of a semiconductor device.

A driver circuit 601 includes a data buffer 612, a writing circuit 611, a verifying circuit 613, and a reading circuit 614, and functions to perform writing, reading, and verifying of data. The driver circuit 601 is provided for each column.

The potential generating circuit 603 is electrically connected to i×j (i is an integer of 2 or more, and j is an odd number of three or more) write potential supply lines (corresponding to the first signal lines 121 in FIG. 1). All of the write potential supply lines V(1,1) to V(i,j) are electrically connected to writing circuits 611(1) to 611(n) in the driver circuits 601 and supply a plurality of write potentials to the writing circuits 611(1) to 611(n). Note that i represents the number of levels (value) of data that can be stored in the memory cell 602, and (j+1)/2 represents the maximum number of times of verifying. Note also that n is an integer of one or more, which represents the number of columns.

The number of the memory cells 602 is m (rows)×n (columns), and the memory cells 602 are electrically connected to the driver circuits 601 through bit lines BL(1) to BL(n) (corresponding to the second signal line 122 or the third signal line 123 in FIG. 1) in respective rows. The memory cells 602 store potentials supplied to the bit lines BL(1) to BL(n) when writing is performed, and output stored data to the bit lines BL(1) to BL(n) when reading is performed. Note that FIG. 6 illustrates an example in which the bit lines BL(1) to BL(n) serve as both write signal lines and read signal lines; however, the write signal lines and the read signal lines may be separately provided. Note also that m is an integer of one or more, which represents the number of rows.

A write completion detecting circuit 604 is electrically connected to n verify signal lines (corresponding to the fourth signal line 124 in FIG. 1). The verify signal lines VE(1,3) to VE(m,3) are electrically connected respectively to verifying circuits 613(1) to 613(n) in the driver circuits 601, and signals based on the results of verifying in the verifying circuits 613(1) to 613(n) are supplied to the write completion detecting circuit 604.

Data buffers 612(1) to 612(n) are electrically connected to the writing circuits 611(1) to 611(n), the verifying circuits 613(1) to 613(n), and reading circuits 614(1) to 614(n). Further, the data buffers 612(1) to 612(n) are electrically connected to data input/output lines I/O(1) to I/O(k) (k is an integer of 2 or more), address selection signal lines CA(1) to CA(n), a write data transfer signal line TW, and a read data transfer signal line TR. As for the data buffers 612(1) to 612(n), the data buffer 612 which is selected by the address selection signal lines CA(1) to CA(n) is electrically connected to the data input/output lines I/O(1) to I/O(k) when writing is performed; thus, data input through the data input/output lines I/O(1) to I/O(k) is held in any of the data buffers 612(1) to 612(n). Then, when a write data transfer signal is input through the write data transfer signal line TW, the data held in the data buffers 612(1) to 612(n) is output to the writing circuits 611(1) to 611(n) and the verifying circuits 613(1) to 613(n). When a read data transfer signal is input through the read data transfer signal line TR in reading, data output from the reading circuits 614(1) to 614(n) is held in the data buffers 612(1) to 612(n). Then, any of the data buffers 612(1) to 612(n), which is selected by the address selection signal lines CA(1) to CA(n), is electrically connected to the data input/output lines I/O(1) to I/O(k), and the data held in the data buffers 612(1) to 612(n) is output to the data input/output lines I/O(1) to I/O(k). Note that k is an integer of 1 or more which represents the amount of information of write data; k can be 2 in the case where four levels of data can be stored in one memory cell, and k can be 3 in the case where eight levels of data can be stored in one memory cell.

The writing circuits 611(1) to 611(n) are electrically connected to the potential generating circuit 603 through the write potential supply lines V(1,1) to V(i,j). Further, the writing circuits 611(1) to 611(n) are electrically connected to the data buffers 612(1) to 612(n), the verifying circuits 613(1) to 613(n), and the memory cells 602(1,1) to 602(m,n). A signal line SP, a signal line RST, and a write signal line WRITE are electrically connected to the writing circuits 611(1) to 611(n). The writing circuits 611(1) to 611(n) select one of the write potential supply lines V(1,1) to V(i,j) in accordance with data input from the data buffers 612 and verify signals VE(1,1) to VE(m,1) and verify signals VE(1,2) to VE(m,2) input from the verifying circuits 613, and electrically connect the one of the write potential supply lines V(1,1) to V(i,j) to the bit lines BL(1) to BL(n).

The verifying circuits 613(1) to 613(n) are electrically connected to the writing circuits 611(1) to 611(n), the data buffers 612(1) to 612(n), and the reading circuits 614(1) to 614(n). Further, the verifying circuits 613(1) to 613(n) are electrically connected to a verify output signal line TVE. The verifying circuits 613(1) to 613(n) compare write data input from the data buffers 612(1) to 612(n) with read data input from the reading circuits 614(1) to 614(n). When a verify output signal is input to the verify output signal line TVE, the verifying circuits 613(1) to 613(n) output comparison results of data to the writing circuits 611(1) to 611(n) and the write completion detecting circuit 604.

The reading circuits 614(1) to 614(n) are electrically connected to the data buffers 612(1) to 612(n), the verifying circuits 613(1) to 613(n), and the memory cells 602(1,1) to 602(m,n). Further, the reading circuits 614(1) to 614(n) are electrically connected to a signal line PRE, a signal line TRD, a signal line PULSE, a signal line RST2, and a read signal line READ. The reading circuits 614(1) to 614(n) read data from any one row of the memory cells 602(1,1) to 602(m,n) when a read signal is input through the read signal line READ. When a pulse is input to the signal line TRD, the reading circuits 614(1) to 614(n) output the read data to the data buffers 612(1) to 612(n) and the verifying circuits 613(1) to 613(n).

A decoder 605 is electrically connected to an address signal line CAddr and the data buffers 612(1) to 612(n) in the driver circuits 601 and selects the driver circuit 601 in which writing and reading of data are to be performed, in accordance with an address signal CAddr.

Specific circuit configurations and operation of the data buffer 612, the potential generating circuit 603, the writing circuit 611, the memory cell 602, the reading circuit 614, the verifying circuit 613, and the write completion detecting circuit 604 will be described below.

(Description of Data Buffer)

Figure 7:
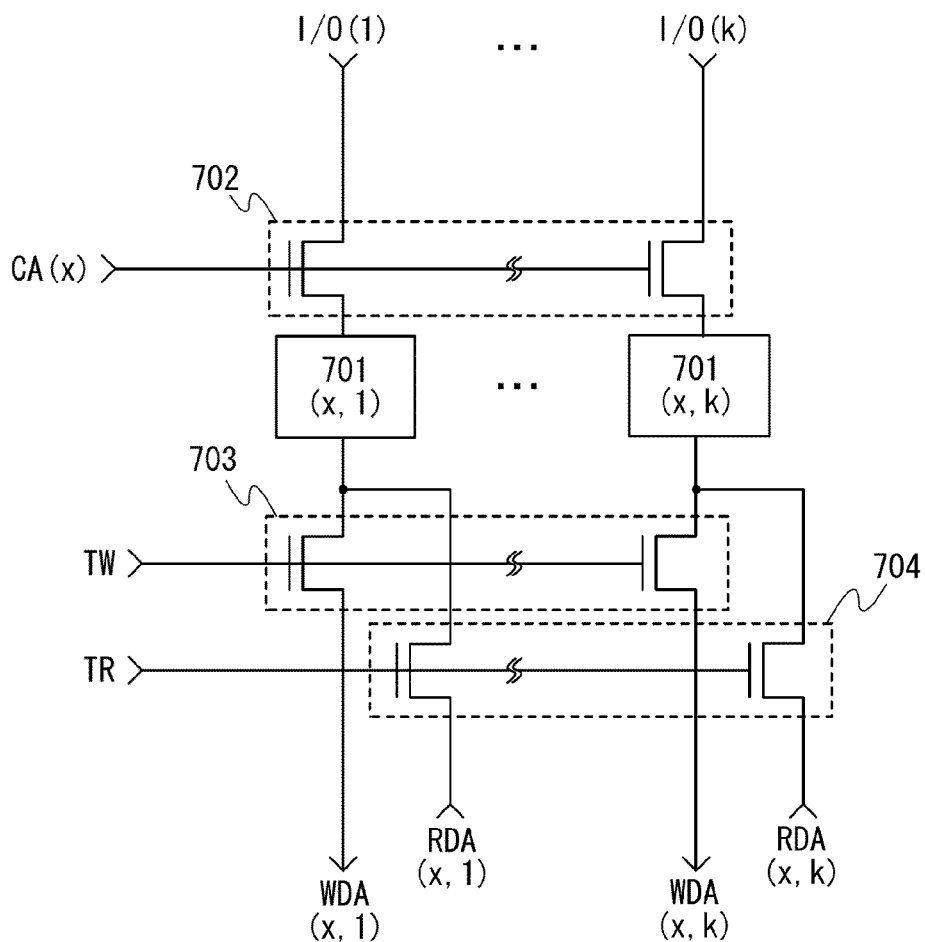
FIG. 7 is a circuit diagram of a data buffer included in a semiconductor device.

FIG. 7 illustrates an example of a circuit of the data buffer 612 in FIG. 6. The data input/output lines I/O(1) to I/O(k) are electrically connected to respective drain electrodes of transistors 702. The address selection signal line CA(x) (x is an integer greater than or equal to 1 and less than or equal to n) is electrically connected to gate electrodes of the transistors 702. Source electrodes of the transistors 702 are electrically connected to respective one terminals of latch circuits LAT701(x,1) to LAT701(x,k). The other terminals of the latch circuits LAT701(x,1) to LAT701(x,k) are electrically connected to respective drain electrodes of transistors 703 and transistors 704. Each gate electrode of the transistors 703 is electrically connected to the write data transfer signal line TW. Source electrodes of the transistors 703 are electrically connected to respective signal lines WDA(x,1) to WDA(x,k). Each gate electrode of the transistors 704 is electrically connected to the read data transfer signal line TR. Source electrodes of the transistors 704 are electrically connected to respective signal lines RDA(x,1) to RDA(x,k).

Next, input operation of write data to the data buffer 612 will be described. First, given write data is sequentially transmitted through the data input/output lines I/O(1) to I/O(k). In synchronization with the timing of transmitting the data, a high potential VH (e.g., 5 V) is supplied to the address selection signal line CA(x) to turn on the transistors 702, so that data of the data input/output lines I/O(1) to I/O(k) is held in the latch circuits LAT701(x,1) to LAT701(x,k). Then, a low potential VL (e.g., 0 V) is supplied to the address selection signal line CA(x) to which the high potential VH has been supplied and the transistors 702 are turned off. Data is held by the above-described procedure in all the latch circuits LAT701 in first to n-th columns or data is held by the above-described procedure in the latch circuits LAT701 in columns on which writing needs to be performed. Next, the high potential VH is supplied to the write data transfer signal line TW to turn on the transistors 703, so that the given data held in the latch circuits LAT701(1,1) to LAT701(n,k) is transmitted to signal lines WDA(1,1) to WDA(n,k).

(Description of Potential Generating Circuit)

Figure 8:
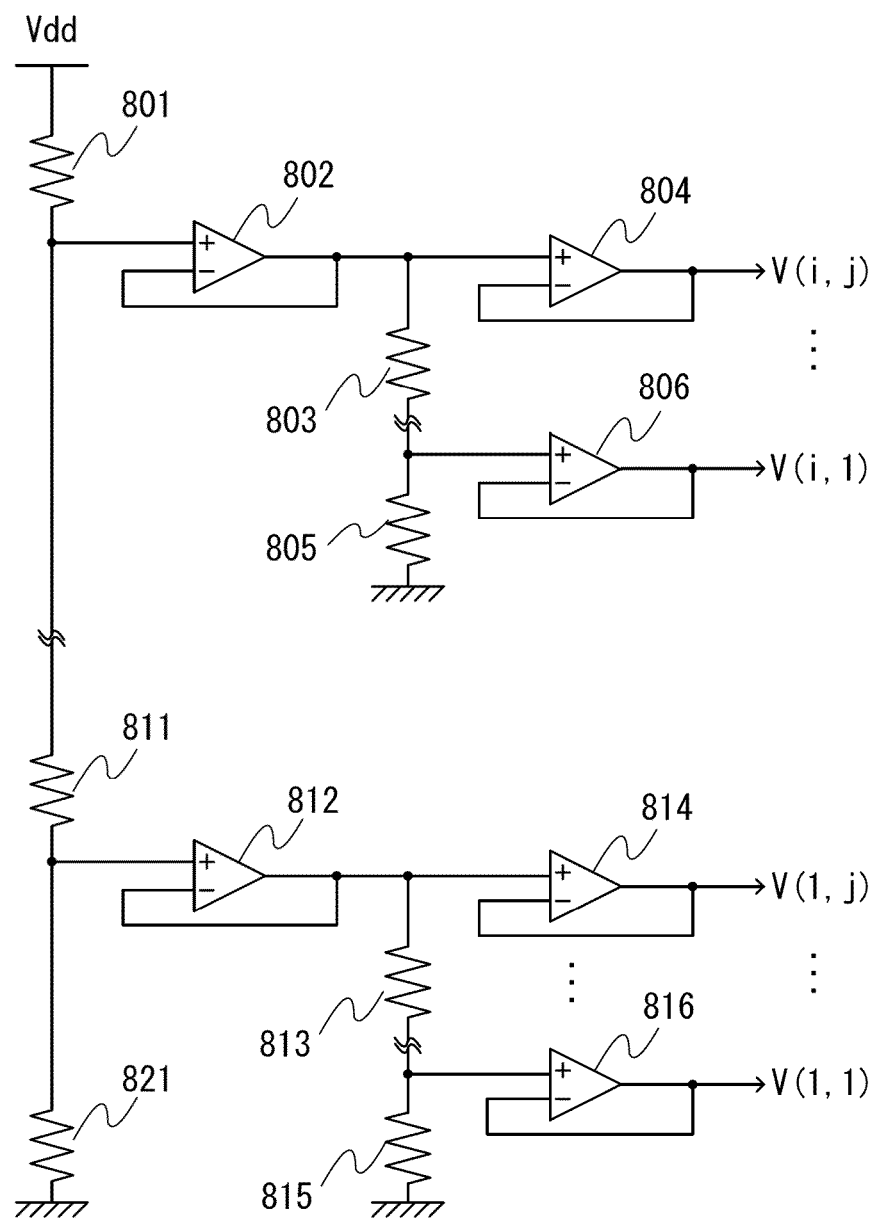
FIG. 8 is a circuit diagram of a potential generating circuit included in a semiconductor device.

FIG. 8 illustrates an example of the potential generating circuit 603 in FIG. 6. The potential generating circuit 603 has a function of generating a potential supplied to the bit line BL(n) of the memory cell 602.

First, a configuration of the potential generating circuit 603 will be described with reference to FIG. 8. The potential generating circuit 603 has the following configuration. A power supply potential Vdd (e.g., 5 V) is electrically connected to one terminal of a resistor 801. The other terminal of the resistor 801 is electrically connected to one terminal of a resistor 811. The other terminal of the resistor 811 is electrically connected to one terminal of a resistor 821. The other terminal of the resistor 821 is grounded (or supplied with a low potential). Input terminals of a voltage follower 802 and a voltage follower 812 are electrically connected between the resistors. A resistor 803 and a resistor 805 are electrically connected between an output terminal of the voltage follower 802 and a ground potential (or a low potential). A resistor 813 and a resistor 815 are electrically connected between an output terminal of the voltage follower 812 and a ground potential (or a low potential). A voltage follower 804 and a voltage follower 806 are electrically connected between the output terminal of the voltage follower 802 and the resistors 803 and 805. A voltage follower 814 and a voltage follower 816 are electrically connected between the output terminal of the voltage follower 812 and the resistors 813 and 815. Output terminals of the voltage follower 804, the voltage follower 806, the voltage follower 814, and the voltage follower 816 are electrically connected to the write potential supply lines V(1,1) to V(i,j).

Next, operation of the potential generating circuit 603 will be described. When the power supply potential Vdd is supplied, the ratio of the resistance of the resistor electrically connected between the power supply potential Vdd and the voltage follower 802 or the voltage follower 812 with respect to the sum of the resistance of the resistor 801, the resistor 811, and the resistor 821 is input through voltage drop to the input terminals of the voltage follower 802 and the voltage follower 812. Then, output potentials of the voltage follower 802 and the voltage follower 812 become the same as the input potentials of the voltage follower 802 and the voltage follower 812. The output potentials of the voltage follower 802 and the voltage follower 812 are input to the voltage follower 804 and the voltage follower 814, respectively. Output potentials of the voltage follower 804 and the voltage follower 814 are input to the write potential supply lines as V(i,j) and V(1,j), respectively, which are equal to the input potentials of the voltage follower 804 and the voltage follower 814. Meanwhile, the resistor 803 and the resistor 805 are electrically connected in series between the output terminal of the voltage follower 802 and the ground potential (or the low potential), and the resistor 813 and the resistor 815 are electrically connected in series between the output terminal of the voltage follower 812 and the ground potential (or the low potential). In addition, an input terminal of the voltage follower 806 is electrically connected between the resistor 803 and the resistor 805. Therefore, as an input potential of the voltage follower 806, a potential which is voltage-dropped from the output potential of the voltage follower 802 by an amount corresponding to the ratio of the resistance of the resistor electrically connected between the output terminal of the voltage follower 802 and the voltage follower 806 with respect to the sum of the resistance of the resistor 803 and the resistor 805 is input. Then, a potential equal to the input potential of the voltage follower 806 is output as V(i,1) from the output terminal of the voltage follower 806 to the write potential supply line. In a similar manner, a potential equal to an input potential of the voltage follower 816 is output as V(1,1) from the output terminal of the voltage follower 816 to the write potential supply line.

By using one write potential supply line only when data "0" is written (when the potential written into the memory cell 602 is 0 V), the number of write potential supply lines connected to the potential generating circuit 603 can be (i−1)×j+1. Accordingly, the number of write potential supply lines is reduced, and thus the area occupied by the memory cell 602 can be increased owing to a reduction in the number of wirings. By using one write potential supply line only when data "i" is written (when the maximum potential is written into the memory cell 602), an effect similar to that described above can be obtained. Furthermore, by using one write potential supply line when data "0" and data "i" are written, the number of write potential supply lines connected to the potential generating circuit 603 can be (i−2)×j+2; accordingly, the area occupied by the memory cell 602 can be further increased owing to a reduction in the number of wirings.

The potential generating circuit 603 is not limited to the circuit in FIG. 8 and can be formed to be a circuit including a plurality of different potential supply lines with the use of a known circuit.

(Description of Writing Circuit)

Figure 9:
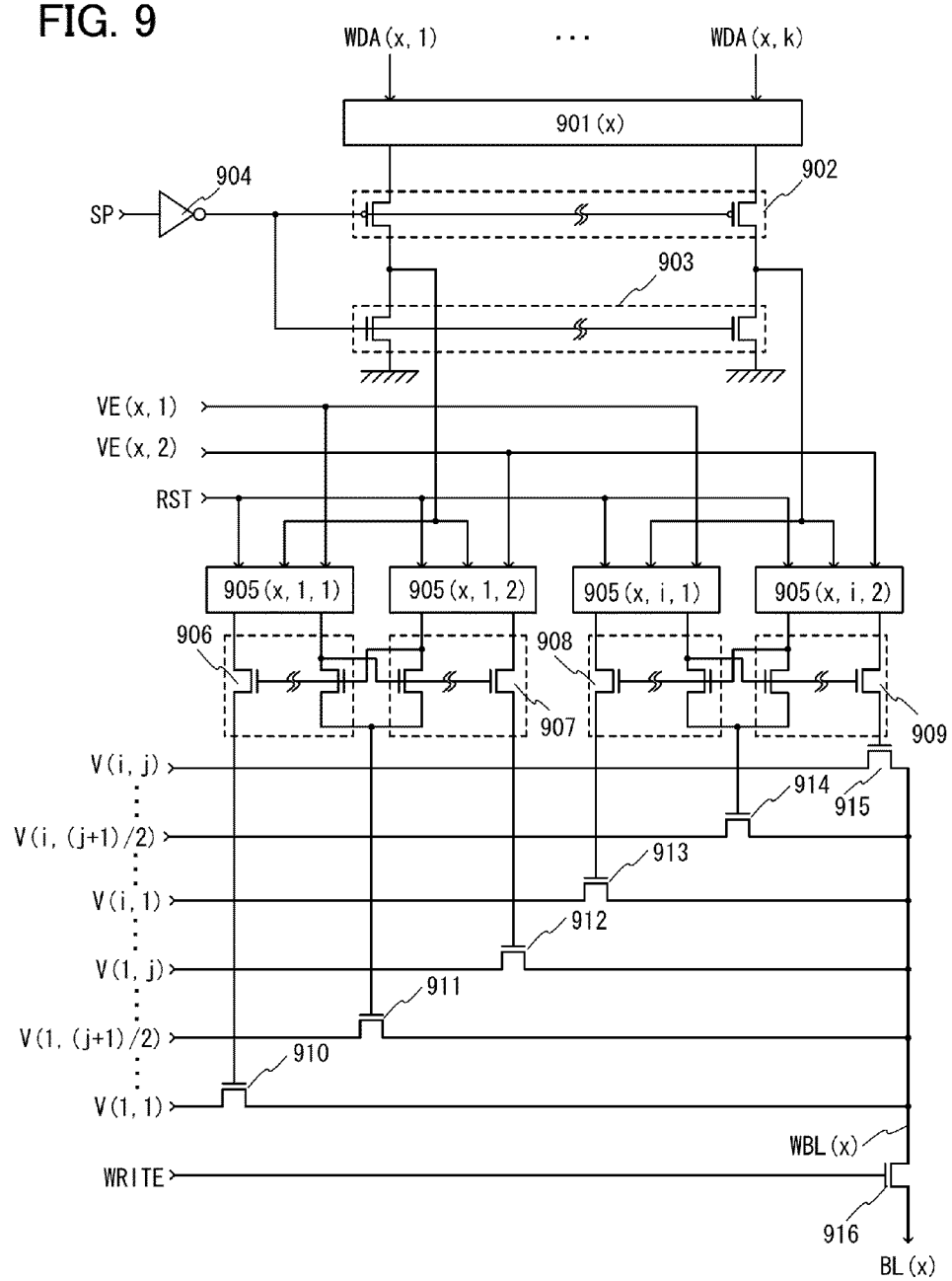
FIG. 9 is a circuit diagram of a writing circuit included in a semiconductor device.

FIG. 9 illustrates an example of the writing circuit 611 in FIG. 6. The writing circuit 611 has a function of electrically connecting one of a plurality of write potential supply lines to a bit line to supply a write potential to the bit line.

The signal lines WDA(x,1) to WDA(x,k) which are electrically connected to the data buffer 612 in FIG. 6 are electrically connected to input terminals of a decoder 901(x). Output terminals of the decoder 901(x) are electrically connected to respective source electrodes of transistors 902. Each gate electrode of the transistors 902 and transistors 903 is electrically connected to an output terminal of an inverter 904. An input terminal of the inverter is electrically connected to the signal line SP. Each drain electrode of the transistors 902 and 903 is electrically connected to any two of shift registers 905(x,1,1) to 905(x,i,2). The signal line RST and signal lines VE(x,1) and VE(x,2) are electrically connected to the shift registers 905(x,1,1) to 905(x,i,2). Output terminals of the shift register 905(x,1,1) are electrically connected to respective drain electrodes of transistors 906. A first output terminal of the shift register 905(x,1,1) is electrically connected to each gate electrode of transistors 907. Output terminals of the shift register 905(x,1,2) are electrically connected to respective drain electrodes of the transistors 907. A first output terminal of the shift register 905(x,1,2) is electrically connected to each gate electrode of the transistors 906. Similarly, output terminals of the shift register 905(x,i,1) are electrically connected to respective drain electrodes of transistors 908. A first output terminal of the shift register 905(x,i,1) is electrically connected to each gate electrode of transistors 909. Output terminals of the shift register 905(x,i,2) are electrically connected to respective drain electrodes of the transistors 909. A first output terminal of the shift register 905(x,i,2) is electrically connected to each gate electrode of the transistors 908. Source electrodes of the transistors 906, 907, 908, and 909 are electrically connected to gate electrodes of transistors 910, 911, 912, 913, 914, and 915. Drain electrodes of the transistors 910, 911, 912, 913, 914, and 915 are electrically connected to the write potential supply lines V(1,1) to V(i,j). Source electrodes of the transistors 910, 911, 912, 913, 914, and 915 are electrically connected to a drain electrode of a transistor 916. A gate electrode of the transistor 916 is electrically connected to the write signal line WRITE. A source electrode of the transistor 916 is electrically connected to the bit line BL(x).

Next, operation of the writing circuit 611 will be described. First, the low potential VL is applied to the signal line SP, so that the transistors 902 are turned off and the transistors 903 are turned on. Thus, a ground potential is input as a start pulse for the shift registers 905(x,1,1) to 905(x,i,2). Then, the high potential VH is supplied to the signal line RST to reset the shift registers 905(x,1,1) to 905(x,i,2), so that all the shift registers 905(x,1,1) to 905(x,i,2) output the low potential VL. Accordingly, the transistors 906, 907, 908, and 909 are all turned off, and the transistors 910, 911, 912, 913, 914, and

915 are also all turned off. After that, the low potential VL is supplied to the signal line RST and reset operation of the shift registers 905 is completed.

At the same time as the reset operation of the shift registers 905, the high potential VH is supplied to the write data transfer signal line TW, and write data output from the data buffer 612 is input to the decoder 901($x$) through the signal lines WDA($x$,1) to WDA($x$,k). The decoder 901 decodes the write data and outputs a potential corresponding to the result of decoding (e.g., the high potential VH when the data is data "1", and the low potential VL when the data is data "0") to the drain electrodes of the transistors 902.

At the same time as the low potential VL is supplied to the signal line RST and reset operation of the shift registers 905 is completed, the high potential VH is supplied to the signal line SP, so that the transistors 903 are turned off and the transistors 902 are turned on. Thus, output results of the decoder 901 are input to the shift registers 905($x,i$,1) to 905($x,i$,2). The high potential VH is input to two shift registers, the shift registers 905($x,y$,1) and 905($x,y$,2) (y is an integer greater than or equal to 1 and less than or equal to i), among the shift registers 905($x$,1,1) to 905($x,i$,2), and the low potential VL is input to the other shift registers. When the output results of the decoder 901 are input to the shift registers 905, only the shift registers 905 to which the high potential VH is input operate. When the shift registers 905 operate, the high potential VH is supplied to the signal lines electrically connected to the first output terminals, and the low potential VL is supplied to the signal lines electrically connected to the other output terminals. When the high potential VH is supplied to the signal lines electrically connected to the first output terminals, the high potential is supplied also to the gate electrodes of the transistors electrically connected to the first output terminals of the shift registers 905. Thus, all the transistors electrically connected to the first output terminals of the shift registers 905 are turned on. However, since the high potential is supplied through the first output terminals of the shift registers 905 only to the signal lines electrically connected to the first output terminals, the high potential is supplied only to the gate electrode of the transistor whose drain electrode is electrically connected to the write potential supply line V(y,(j+1)/2), among the transistors 910, 911, 912, 913, 914, and 915, and only that transistor is turned on. Then, a potential of the write potential supply line V(y,(j+1)/2) which is electrically connected to the drain electrode of the transistor in an on state is supplied to the signal line WBL($x$).

After the write potential is supplied to the signal line WBL($x$), the output terminals of the decoder 901 and input terminals of the shift registers 905($x$,1,1) to 905($x,i$,2) are brought into an insulating state (also referred to as a non-conduction state) by supply of the low potential VL to the signal line SP. Meanwhile, a ground potential is input to the shift registers 905 because the transistors 903 are turned on, whereas the output of the shift registers 905 is kept in the state at the start of operation. In synchronization with the timing of supplying the low potential VL to the signal line SP, the high potential VH is supplied to the write signal line WRITE to turn on the transistor 916, so that a potential of the signal line WBL($x$) is supplied to the bit line BL($x$) and writing is performed on the memory cell 602. When the writing is completed, the potential of the write signal line WRITE is changed to VL to turn off the transistor 916, so that the bit line BL($x$) is brought into an electrically floating state (also referred to as a floating state).

When the bit line BL($x$) is in a floating state, first verify reading is performed (verify reading is also referred to as verifying). When data to be written into the memory cell 602 (i.e., data held in the data buffer 612) agrees with verify-read data as a result of verify reading, the signal lines VE($x$,1) and VE($x$,2) keep the low potential VL, potentials of the output of the shift registers 905($x$,1,1) to 905($x,i$,2) are kept, and the write potential V(y,(j+1)/2) is kept as the potential of the signal line WBL($x$). The potential V(y,(j+1)/2) is kept as the potential of the signal line WBL($x$) as described above; in other words, the potential V(y,(j+1)/2) is determined as the write potential or the potential V(y,(j+1)/2) is employed as the write potential.

On the other hand, when data to be written into the memory cell 602 (i.e., data held in the data buffer) does not agree with verify-read data, the high potential VH is applied to either of the signal lines VE($x$,1) and VE($x$,2).

In the case where the high potential is applied to the signal line VE($x$,1), it is found that it has been determined that the read data is larger than the write data (e.g., data "2" is read out when data "1" has been written). When the high potential VH is input to the signal line VE($x$,1), only the shift register 905 which outputs the high potential VH to the signal line electrically connected to the first output terminal of the shift register 905, among the shift registers 905($x$,1,1) to 905($x,i$,1), outputs the high potential VH to a signal line electrically connected to another output terminal such as the signal line electrically connected to a second output terminal of the shift register 905. All the transistors whose gate electrodes are electrically connected to the first output terminal of the shift register 905 whose output signals have changed are turned off, and the potential applied to the drain electrodes of the transistors whose drain electrodes are electrically connected to the output terminals of the shift register 905 whose output signals have changed also changes. In addition, by the change in the potential of the second output terminal of the shift register 905, only the transistor connected to the write potential supply line V(y,((j+1)/2)−1), is turned on, among the transistors 910, 911, 912, 913, 914, and 915. Thus, the potential applied to the signal line WBL($x$) is decreased from V(y,(j+1)/2) to V(y,((j+1)/2)−1).

In the case where the high potential is applied to the signal line VE($x$,2), it is found that it has been determined that the read data is smaller than the write data (e.g., data "0" is read out when data "1" has been written). When the high potential VH is input to the signal line VE($x$,2), only the shift register 905 which outputs the high potential VH to the signal line electrically connected to the first output terminal of the shift register 905, among the shift registers 905($x$,1,2) to 905($x,i$,2), outputs the high potential VH to a signal line electrically connected to another output terminal such as the signal line electrically connected to a second output terminal of the shift register 905. All the transistors whose gate electrodes are electrically connected to the first output terminal of the shift register 905 whose output signals have changed are turned off, and the potential applied to the drain electrodes of the transistors whose drain electrodes are electrically connected to the output terminals of the shift register 905 whose output signals have changed also changes. In addition, by the change in the potential of the second output terminal of the shift register 905, only the transistor connected to the write potential supply line V(y,((j+1)/2)+1), is turned on, among the transistors 910, 911, 912, 913, 914, and 915. Thus, the potential applied to the signal line WBL($x$) is increased from V(y,(j+1)/2) to V(y,((j+1)/2)+1).

After that, the potential of the signal line VE($x$,1) or VE($x$,2) is changed to the low potential VL, whereas the output of the shift registers 905 is kept without change. The high potential VH is supplied to the write signal line WRITE to turn on the transistor 916, so that a potential of the signal line WBL($x$)

is supplied to the bit line BL(x) and writing is performed again on the memory cell 602.

Data writing is repeated until the write data for all the memory cells in one row or for memory cells on which writing needs to be performed among the memory cells in one row agrees with the read data.

The above writing and verify reading are each performed (j+1)/2 times at a maximum. By repeatedly changing potentials supplied to the bit line BL(x) until write data agrees with a result of verify reading, the write potentials can be determined and variation in the threshold voltages of the memory cells 602 can be reduced. Verifying in the case where the read data is larger than the write data and that in the case where the read data is smaller than the write data are performed all at once, whereby the number of times of verifying is reduced by half and writing time can be made shorter than in conventional verifying. Further, the write voltage is set close to the medium value of the write voltages of data; thus, writing operation can be completed even earlier when the distribution width of the threshold voltages of the memory cells is small.

(Description of Memory Cell)

Figure 10:
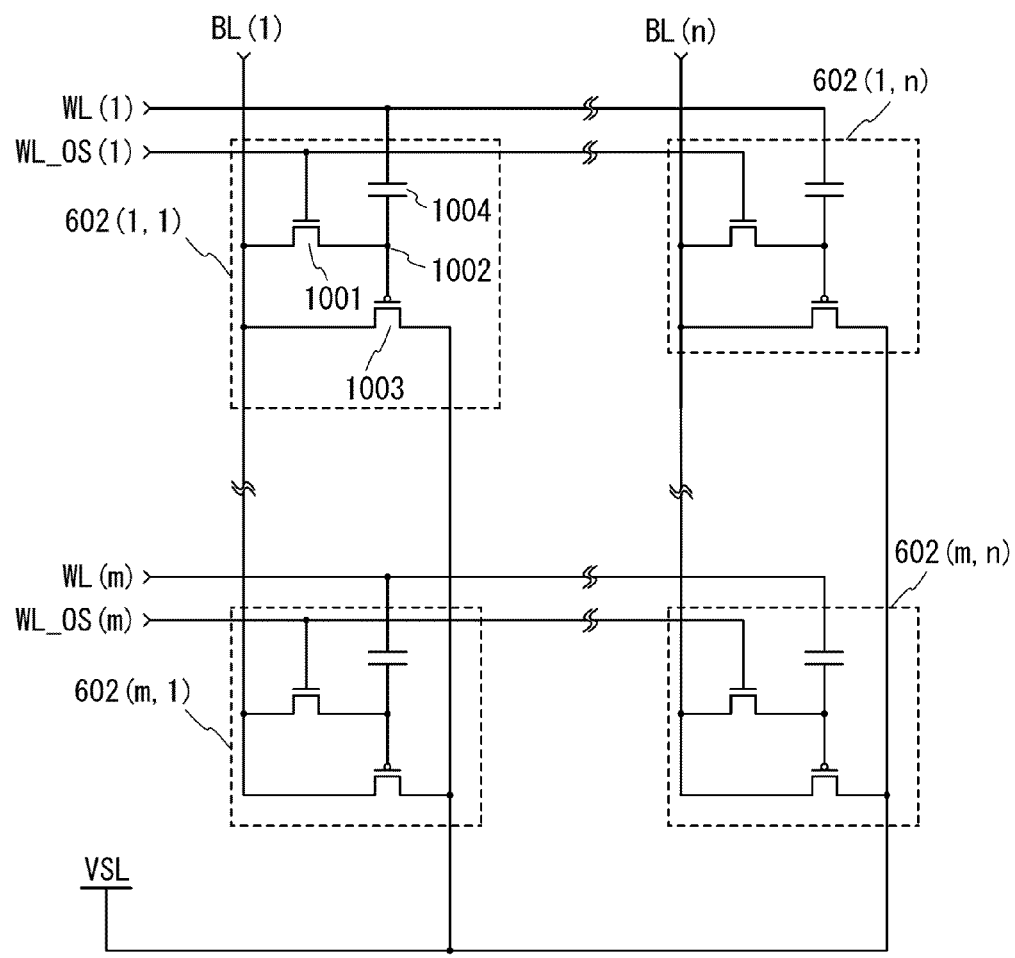
FIG. 10 is a circuit diagram of a memory cell included in a semiconductor device.

FIG. 10 illustrates the memory cells 602(1,1) to 602(*m,n*) in FIG. 6.

First, a configuration of the memory cell 602 will be described. In the memory cell 602(1,1), the bit line BL(1) is electrically connected to a drain electrode of a transistor 1001, a gate electrode of the transistor 1001 is electrically connected to a word line WL_OS(1), a source electrode of the transistor 1001 and a gate electrode of a transistor 1003 are electrically connected to one electrode of a capacitor 1004, and the other electrode of the capacitor 1004 is connected to a word line WL(1). Further, the bit line BL(1) is electrically connected to a drain electrode of the transistor 1003, and a source electrode of the transistor 1003 is electrically connected to a signal line VSL. One memory cell 602 has the above configuration.

Next, the writing operation will be described. When data is written into the memory cells 602, the potential of the write signal line WRITE is raised to the high potential VH and a write potential is supplied to the bit lines BL(1) to BL(n). The potential of one of word lines WL(1) to WL(m) of a row to which data is to be written is decreased from the high potential VH to the low potential VL at the same time as the potential of the write signal line WRITE is raised to the high potential VH. Then, the potential of one of word lines WL_OS(1) to WL_OS(m) of the row to which data is to be written is raised to the high potential VH. For example, when the potential of the word line WL_OS(1) is raised to the high potential VH, the high potential VH is applied to the gate electrode of the transistor 1001, which is an OS transistor, and gate electrodes of all OS transistors in the first row which are electrically connected to the word line WL_OS(1), so that each of the OS transistors is turned on. Then, charge with a potential equal to the write potential supplied to the bit line BL(1) is stored in a floating node 1002 in the memory cell 602. Then, all the OS transistors in the first row whose gate electrodes are electrically connected to the word line WL_OS(1) are turned off. After that, the potential supplied to the word line WL(1) is raised from the low potential VL to the high potential VH, and at the same time, the potential of the signal line WRITE is decreased from the high potential VH to the low potential VL. The transistor 1001 has a characteristic of extremely low off-state current, which facilitates holding of charge stored in the floating node 1002 and reading of stored data.

A high potential VR (e.g., 3 V) is supplied to the signal line VSL in reading and verify reading, and the low potential VL is supplied to the signal line VSL in operation other than reading and verify reading.

(Description of Reading Circuit)

Figure 11:
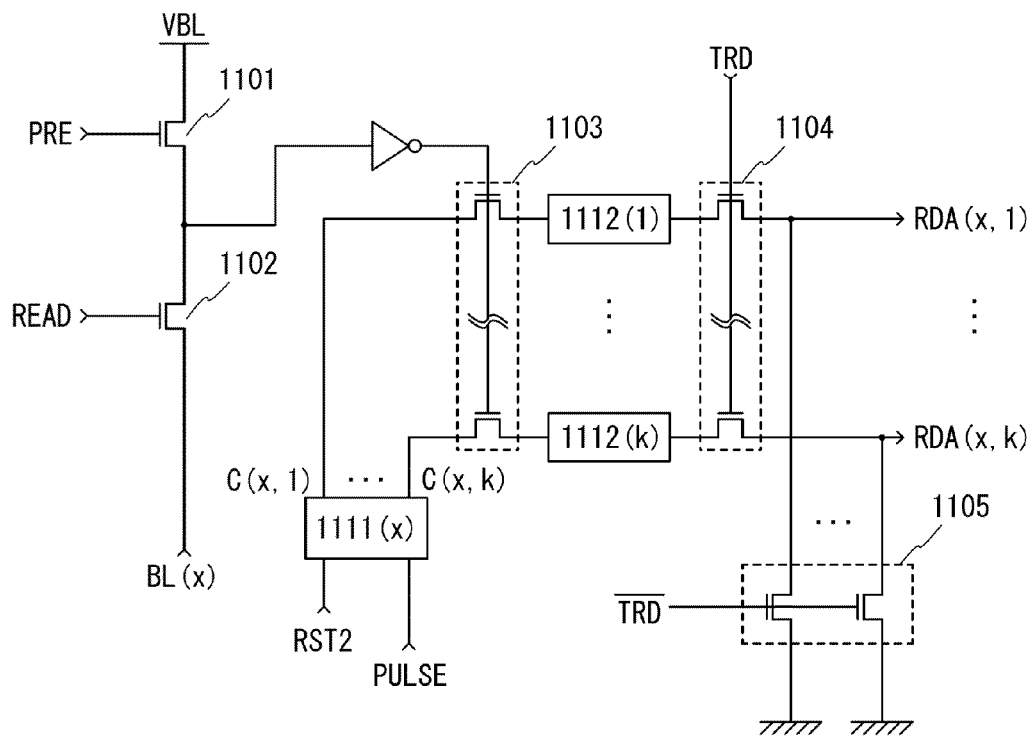
FIG. 11 is a circuit diagram of a reading circuit included in a semiconductor device.

FIG. 11 illustrates an example of the reading circuit 614 in FIG. 6. The reading circuit 614 has a function of reading data written into the memory cell 602.

In the reading circuit 614, a low potential VBL is applied to a source electrode of a transistor 1101, a gate electrode of the transistor 1101 is electrically connected to the signal line PRE, a drain electrode of the transistor 1101 and a source electrode of a transistor 1102 are electrically connected to an input terminal of an inverter, and an output terminal of the inverter is electrically connected to each gate electrode of transistors 1103. A gate electrode of the transistor 1102 is electrically connected to the read signal line READ, and a drain electrode of the transistor 1102 is electrically connected to the bit line BL(x). Drain electrodes of the transistors 1103 are electrically connected to signal lines C(x,1) to C(x,k). The signal lines C(x,1) to C(x,k) are electrically connected to output terminals of a counter 1111(*x*). Input terminals of the counter 1111(*x*) are electrically connected to the signal line PULSE and the signal line RST2. Source electrode of the transistors 1103 are electrically connected to input terminals of respective latch circuits 1112(*x*,1) to 1112(*x,k*). Output terminals of the latch circuits 1112(*x*,1) to 1112(*x,k*) are electrically connected to drain electrodes of respective transistors 1104. Gate electrodes of the transistors 1104 are electrically connected to the signal line TRD. Pairs of source electrodes of the transistors 1104 and drain electrodes of transistors 1105 are electrically connected to respective signal lines RDA(x,1) to RDA(x,k). Gate electrodes of the transistors 1105 are electrically connected to a signal line /TRD. Source electrodes of the transistors 1105 are grounded (or supplied with a low potential).

Next, operation of the reading circuit 614 will be described with reference to FIG. 11. When reading or verify reading is performed, the potential of the signal line PRE becomes the high potential VH, so that the transistor 1101 is turned on, and then the potential of the signal line READ becomes the high potential VH, so that the transistor 1102 is turned on. Then, the potential of the bit line BL(x) becomes equal to the low potential VBL. At this time, the high potential VH is applied to the gate electrodes of the transistors 1103 and the transistors 1103 are turned on. At the same time as the potential of the read signal line READ becomes the high potential VH, a pulse is applied to the signal line RST2, so that the counter 1111(*x*) is brought into a reset state, and the low potential VL is output to the signal lines C(x,1) to C(x,k). At the same time as the potential of the signal line RST2 becomes the low potential VL, the potential of the signal line PRE becomes the low potential, so that the bit line BL(x) is brought into a floating state.

After the bit line BL(x) is brought into a floating state, the potential of the word line WL(z) (z is an integer greater than or equal to 1 and less than or equal to m) of the memory cell in FIG. 10 is decreased by stages. When the potential of the word line WL(z) is decreased, the transistor 1003 is turned on depending on the data written in the floating node 1002, so that the potential of the bit line BL(x) becomes equal to the high potential VSL. Assuming that data "0" has been written to the memory cell, the potential of the bit line BL(x) becomes equal to the high potential VSL when the potential of the word line WL(z) is decreased by one stage. Assuming that data "1" has been written to the memory cell, the potential of the bit line BL(x) becomes equal to the high potential VSL when the potential of the word line WL(z) is decreased by (i+1) stages. Note that the number of times the potential of the word line WL(z) is decreased by stages is (i+1), and the potential becomes the low potential VL after decreasing (i+1) times.

In synchronization with the timings at which the potential of the word line WL(z) is decreased by levels, pulses are input to the signal line PULSE in FIG. 11. The values of the output signals C(x,1) to C(x,k) of the counter 1111(x) increase every time a pulse is input to the signal line PULSE. The latch circuits 1112(1) to 1112(k) respectively store potentials equal to the output signals C(x,1) to C(x,k) as long as the transistors 1103 are on, but when data is read from the memory cell and the potential of the bit line BL(x) becomes the high potential VSL, the low potential VL is supplied to the gate electrodes of the transistors 1103, so that the transistors 1103 are turned off. Thus, the latch circuits 1112(1) to 1112(k) respectively hold data of the signal lines C(x,1) to C(x,k) in the state before the transistors 1103 are turned off. The data held in the latch circuits 1112(1) to 1112(k) serves as read data.

When the potential of the word line WL(z) in FIG. 10 is decreased by levels to reach the low potential VL, it means that one of data "0" to "i" of the memory cells is read out. The read data, which has been encoded, is held in the latch circuits 1112(1) to 1112(k) in FIG. 11. Then, when the potential of the signal line TRD becomes the high potential VH, so that the transistors 1104 are turned on and the transistors 1105 are turned off, potentials equal to those of the latch circuits 1112(1) to 1112(k) are output to the signal lines RDA(x,1) to RDA(x,k). Note that while the potential of the signal line TRD is kept at the low potential, the transistors 1104 are off and the transistors 1105 are on, and a ground potential (or a low potential) is output to the signal lines RDA(x,1) to RDA(x,k). After the read data is output to the signal lines RDA(x,1) to RDA(x,k), the potential of the signal line TRD becomes the low potential VL, and a ground potential (or a low potential) is output to the signal lines RDA(x,1) to RDA(x,k).

(Description of Verifying Circuit)

Figure 12:
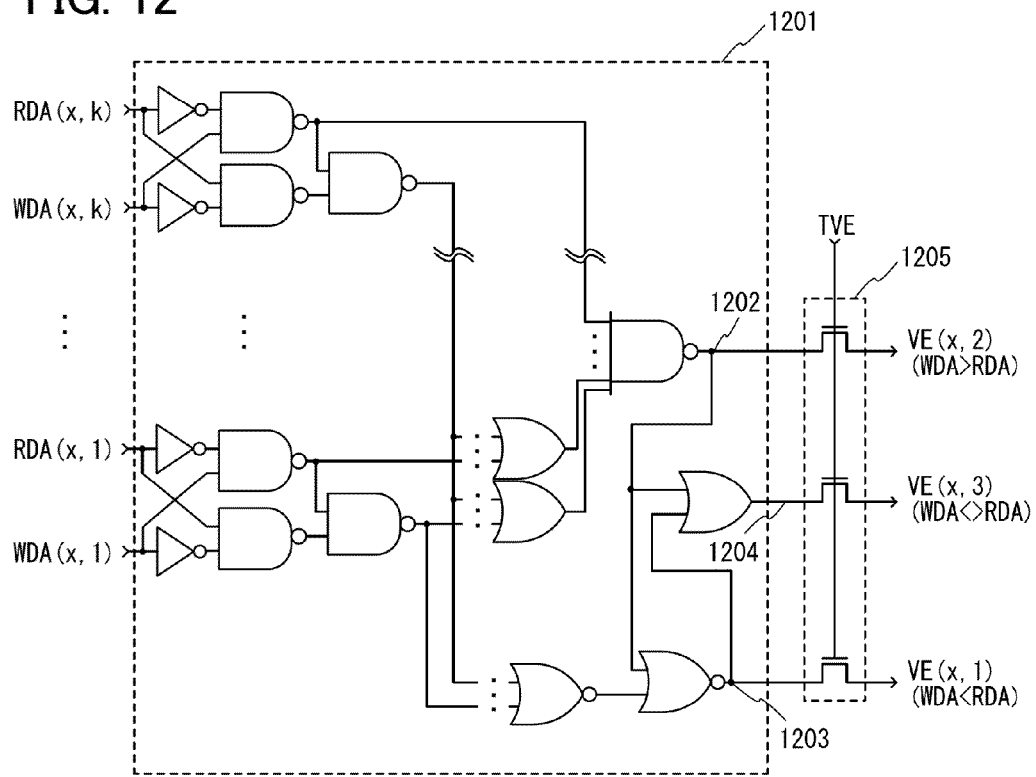
FIG. 12 is a circuit diagram of a verifying circuit included in a semiconductor device.

FIG. 12 illustrates an example of the verifying circuit 613. The verifying circuit 613 has a function of comparing write data with data of verify reading to determine whether writing is normally completed or not.

The verifying circuit 613 has the following configuration. Pairs of the signal lines WDA(x,1) to WDA(x,k) and the signal lines RDA(x,1) to RDA(x,k) are electrically connected to respective input terminals of a k-bit level comparison circuit 1201. Output signal lines 1202, 1203, and 1204 of the k-bit level comparison circuit 1201 are electrically connected to respective drain electrodes of transistors 1205. Each gate electrode of the transistors 1205 is electrically connected to the signal line TVE. Source electrodes of the transistors 1205 are electrically connected respectively to signal lines VE(x,1), VE(x,2), and VE(x,3).

Next, the operation of the verifying circuit 613 will be described. When data writing is performed, write data is input to the k-bit level comparison circuit 1201 through the signal lines WDA(x,1) to WDA(x,k) from the data buffer 612. When verify reading is performed, read data written to the memory cell is input to the k-bit level comparison circuit 1201 through the signal lines RDA(x,1) to RDA(x,k) from the reading circuit 614. The k-bit level comparison circuit 1201 compares the input write data with data of verify reading, and outputs the high potential VH as the potential of the signal lines 1203 and 1204 and the low potential VL as the potential of the signal line 1202 when the data of verify reading is larger than the write data. Further, the k-bit level comparison circuit 1201 outputs the high potential VH as the potential of the signal lines 1202 and 1204 and the low potential VL as the potential of the signal line 1203 when the data of verify reading is smaller than the write data. When the write data is equal to the data of verify reading, the low potential VL is output as the potential of all the signal lines 1202, 1203, and 1204.

After writing and verify reading are performed and the levels of write data and data of verify reading are compared, the potential of the signal line TVE becomes the high potential VH, so that the transistors 1205 are turned on, the potential of the signal line 1203 is output to the signal line VE(x,1), the potential of the signal line 1202 is output to the signal line VE(x,2), and the potential of the signal line 1204 is output to the signal line VE(x,3). After verifying is completed, the low potential VL is output to the signal line TVE, so that the transistors 1205 are turned off, and the signal lines 1202, 1203, and 1204 are respectively insulated from the signal lines VE(x,1), VE(x,2), and VE(x,3).

Note that the verifying circuit 613 can be formed using known circuits in combination without being limited to the circuit in FIG. 12. As the verifying circuit 613, a circuit configured to compare write data with data of verify reading and output a pulse to the signal line VE(x,1), VE(x,2), or VE(x,3) in the case where the write data and the data of verify reading are different may be used.

(Description of Write Completion Detecting Circuit)

Figure 13:
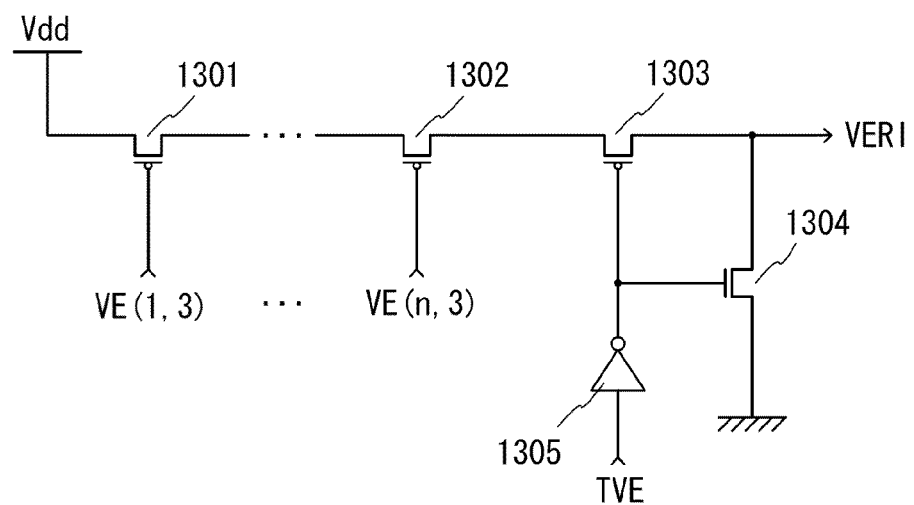
FIG. 13 is a circuit diagram of a write completion detecting circuit included in a semiconductor device.

FIG. 13 illustrates an example of the write completion detecting circuit 604. The write completion detecting circuit 604 detects whether writing of data to the memory cells in one row is completed or not.

First, a configuration of the write completion detecting circuit 604 will be described with reference to FIG. 13. The signal lines VE(1,3) to VE(m,3) supplied with the output of the driver circuits 601 are electrically connected to respective gate electrodes of transistors 1301 to 1302. In the transistors 1301 to 1302, a source electrode of each transistor is electrically connected to a drain electrode of the adjacent transistor. A source electrode of the transistor 1301 is electrically connected to a high potential Vdd, and a drain electrode of the transistor 1302 is electrically connected to a source electrode of a transistor 1303. A gate electrode of the transistor 1303 and a gate electrode of a transistor 1304 are electrically connected to an output terminal of an inverter 1305. A drain electrode of the transistor 1303 and a drain electrode of the transistor 1304 are electrically connected to a signal line VERI. A source electrode of the transistor 1304 is grounded, and an input terminal of the inverter 1305 is electrically connected to the signal line TVE.

Next, the operation of the write completion detecting circuit will be described. After verify reading is performed and write data is compared with data of verify reading, when the potential of the signal line TVE becomes the high potential VH, the low potential VL is applied to the gate electrodes of the transistors 1303 and 1304. Thus, the transistor 1303 is turned on and the transistor 1304 is turned off. Results of verifying are input from the verifying circuits 613(1) to 613(n) through the signal lines VE(1,3) to VE(m,3) at the same time as the potential of the signal line TVE becomes the high potential.

In the case where the write data agrees with the data of verify reading in the verifying circuits in all of the columns, the potentials of the signal lines VE(1,3) to VE(m,3) become the low potential and all the transistors 1301 to 1302 are turned on. Thus, the signal line VERT is electrically connected to the high potential Vdd, so that the potential of the signal line VERT becomes the high potential Vdd. On the other hand, in the case where the write data does not agree with the data of verify reading in the verifying circuits in one or more columns, the high potential is output from signal lines for the columns where data do not agree with each other, among the signal lines VE(1,3) to VE(m,3). When the high potential is output to the signal line VE(x,3), the transistor whose gate electrode is electrically connected to the signal line VE(x,3) among the transistors 1301 to 1302 is turned off, and the signal line VERI is kept insulated from the high potential Vdd.

After verify reading is performed, when the potential of the signal line VERI becomes the high potential Vdd, it can be determined that writing of data to all the memory cells in one row where writing has been performed is completed. When the potential of the signal line VERI is kept at the low potential VL, it can be determined that the write data does not agree with the data of verify reading in one or more memory cells among the memory cells in the one row where writing has been performed. In the case where the write data does not agree with the data of verify reading, writing can be performed again on the memory cells where the write data does not agree with the data of verify reading with the use of a potential different from the previous one.

Figure 14:
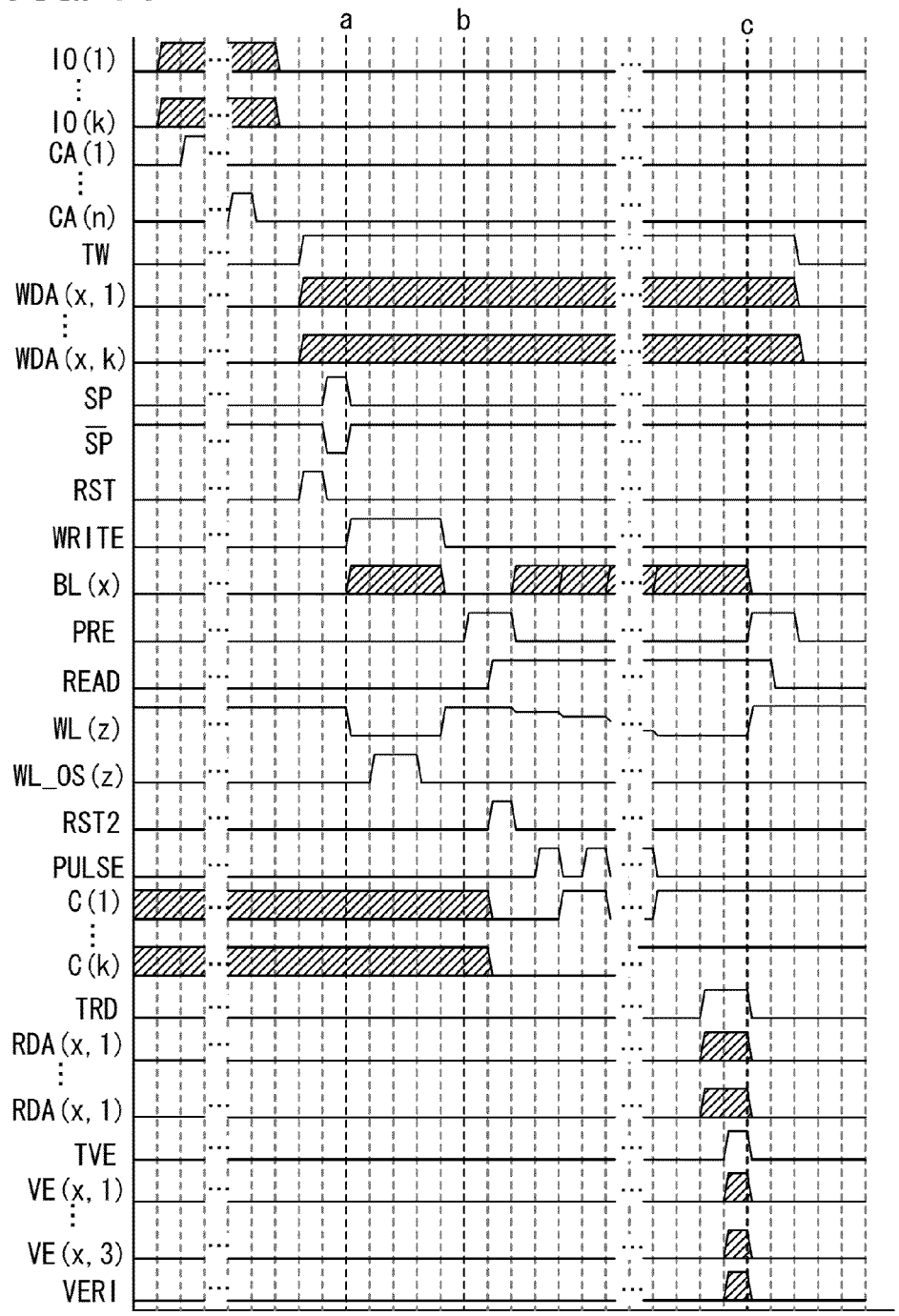
FIG. 14 is a timing chart of a write completion detecting circuit included in a semiconductor device.

FIG. 14 is a timing chart of writing operation. In FIG. 14, writing is performed on the memory cell at point a, verify reading is started at point b, and the verify reading is completed at point c. When write data does not agree with data of verify reading, that is, in a state of Verify NG, writing is performed again, returning to point a from point c.

Figure 15:
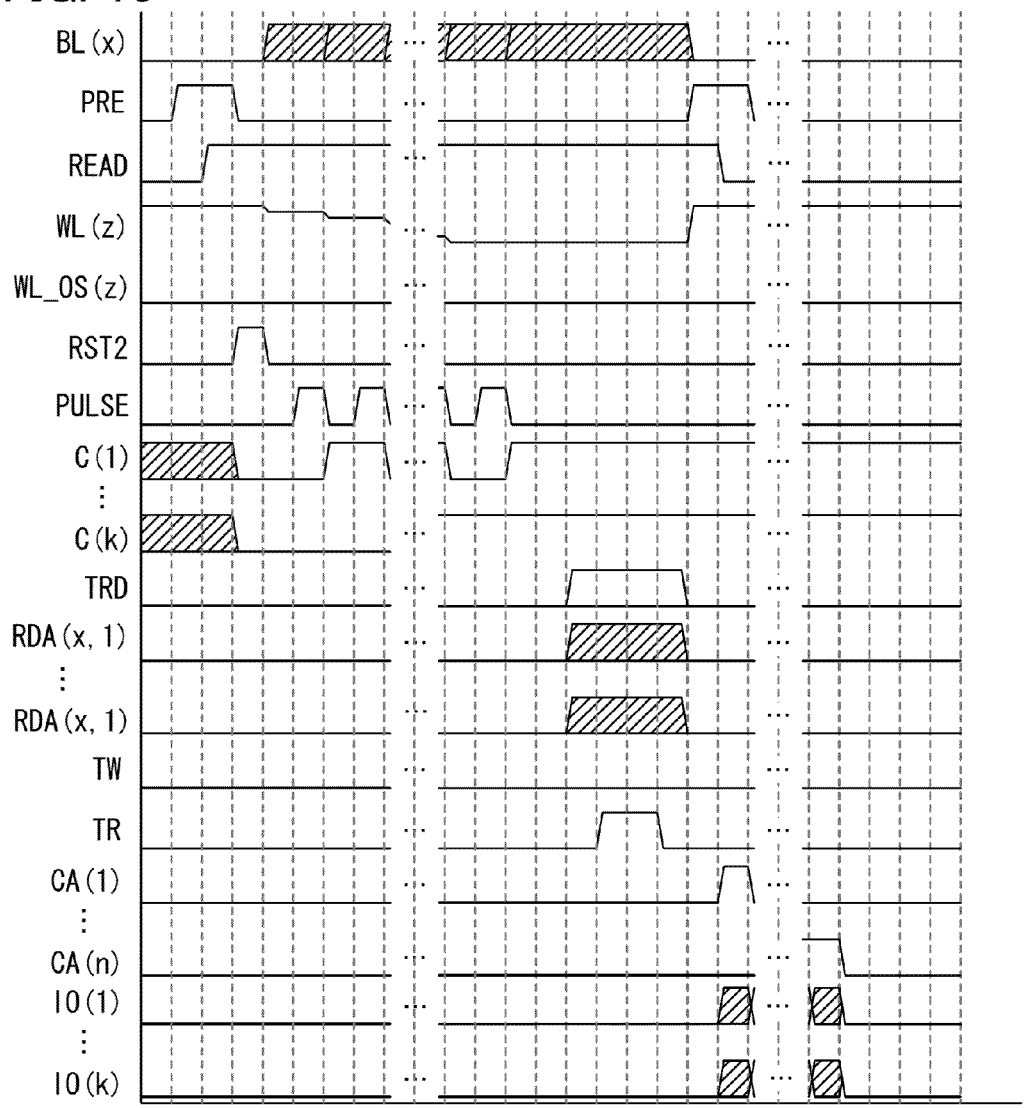
FIG. 15 is a timing chart of a write completion detecting circuit included in a semiconductor device.

FIG. 15 is a timing chart of reading operation. Since the operations of the memory cells and the reading circuit 614 in reading operation are already mentioned in the description of FIG. 11, description of the operations is omitted.
(Description of Reading Operation)

The data read by the reading circuit 614 in FIG. 6 is output to the signal lines RDA(x,1) to RDA(x,k), and the data is input to the data buffers 612(1) to 612(n) through the signal lines RDA(x,1) to RDA(x,k). After the read data is input to the data buffers 612(1) to 612(n), the high potential is output to the signal line TR, so that the transistors 704 in FIG. 7 are turned on, and the signal lines RDA(x,1) to RDA(x,k) are electrically connected respectively to the latch circuits 701(x,1) to 701(x, k). Thus, the read data is stored in the latch circuits 701(x,1) to 701(x,k). When the data is stored in the latch circuits 701(x,1) to 701(x,k), the low potential is output to the signal line TR, so that the signal lines RDA(x,1) to RDA(x,k) are respectively insulated from the latch circuits 701(x,1) to 701(x,k).

After the read data is stored in the data buffers 612(1) to 612(n), the address selection signal lines CA(1) to CA(n) are sequentially selected, so that the read data stored in the data buffers 612(1) to 612(n) are sequentially output to the data input/output lines IO(1) to IO(k). All the data or necessary data is read from the data buffers 612(1) to 612(n), and the reading operation is completed. Data can be read from plural rows by repeating the above operation.

In the semiconductor device according to one embodiment of the disclosed invention, even when the threshold voltage of a transistor included in a memory cell fluctuates, variation (distribution width) in the threshold voltages of a plurality of memory cells after writing can be reduced, whereby the operation voltage of the semiconductor device can be reduced. A memory can be multi-valued without increasing the operation voltage and the area of a memory cell, so that the storage capacity per unit area of the semiconductor device can be increased. A semiconductor device in which operation such as writing, holding, or reading can be surely performed can be provided.

The structures, methods, and the like described in this embodiment can be combined as appropriate with any of the structures, methods, and the like described in the other embodiments.

Embodiment 3

In this embodiment, a circuit configuration and operation of a memory cell included in a semiconductor device according to one embodiment of the disclosed invention will be described with reference to FIGS. 16A1, 16A2, and 16B. Note that in each of circuit diagrams, in some cases, "OS" is written beside a transistor in order to indicate that the transistor includes an oxide semiconductor.
<Basic Configuration of Memory Cell>

In a memory cell illustrated in FIG. 16A1, a first wiring (a 1st Line) and a source electrode (or a drain electrode) of a transistor 1600 are electrically connected to each other, and a second wiring (a 2nd Line) and the drain electrode (or the source electrode) of the transistor 1600 are electrically connected to each other. In addition, a third wiring (a 3rd Line) and a source electrode (or a drain electrode) of a transistor 1602 are electrically connected to each other, and a fourth wiring (a 4th Line) and a gate electrode of the transistor 1602 are electrically connected to each other. In addition, a gate electrode of the transistor 1600 and the drain electrode (or the source electrode) of the transistor 1602 are electrically connected to one electrode of a capacitor 1604, and a fifth wiring (a 5th Line) and the other electrode of the capacitor 1604 are electrically connected to each other.

Here, for example, a transistor including an oxide semiconductor is used as the transistor 1602. A transistor including an oxide semiconductor has a characteristic of extremely low off-state current. Therefore, when the transistor 1602 is turned off, a potential of the gate electrode of the transistor 1600 can be held for an extremely long time. Provision of the capacitor 1604 facilitates holding of charge given to the gate electrode of the transistor 1600 and reading of held data.

A transistor including a material other than an oxide semiconductor is used as the transistor 1600. In terms of increasing the speed of reading data, it is preferable to use, for example, a transistor with high switching rate such as a transistor formed using single crystal silicon.

Alternatively, a structure in which the capacitor 1604 is not provided as illustrated in FIG. 16B can be employed.

The memory cell illustrated in FIG. 16A1 utilizes a characteristic in which the potential of the gate electrode of the transistor 1600 can be held, whereby writing, holding, and reading of data can be performed as follows.

Firstly, writing and holding of data will be described. First, the potential of the fourth wiring is set to a potential at which the transistor 1602 is turned on, so that the transistor 1602 is turned on. Accordingly, the potential of the third wiring is supplied to the gate electrode of the transistor 1600 and the capacitor 1604. In other words, a predetermined charge is supplied to the gate electrode of the transistor 1600 (writing). Here, one of charges for supply of two different potentials (hereinafter, a charge for supply of a low potential is referred to as a charge $Q_L$ and a charge for supply of a high potential is referred to as a charge $Q_H$) is given to the gate electrode of the transistor 1600. Note that charges for supply of three or more different potentials may be employed to improve the storage capacity. After that, the potential of the fourth wiring is set to a potential at which the transistor 1602 is turned off, so that the transistor 1602 is turned off. Thus, the charge supplied to the gate electrode of the transistor 1600 is held (holding).

Since the off-state current of the transistor 1602 is extremely low, the charge of the gate electrode of the transistor 1600 is held for a long time.

Secondly, reading of data will be described. By supplying an appropriate potential (a reading potential) to the fifth wiring while supplying a predetermined potential (a constant potential) to the first wiring, the potential of the second wiring varies depending on the amount of charge held in the gate electrode of the transistor 1600. This is because in general, when the transistor 1600 is an n-channel transistor, an apparent threshold voltage $V_{th\_H}$ in the case where $Q_H$ is given to the gate electrode of the transistor 1600 is lower than an apparent threshold voltage $V_{th\_L}$ in the case where $Q_L$ is given to the gate electrode of the transistor 1600. Here, an apparent threshold voltage refers to the potential of the fifth wiring, which is needed to turn on the transistor 1600. Thus, by setting the potential of the fifth wiring to a potential $V_0$ which is between $V_{th\_H}$ and $V_{th\_L}$, charge given to the gate electrode of the transistor 1600 can be determined. For example, in the case where $Q_H$ is supplied in writing, when the potential of the fifth wiring is $V_0$ ($>V_{th\_H}$), the transistor 1600 is turned on. In the case where $Q_L$ is supplied in writing, even when the potential of the fifth wiring is $V_0$ ($<V_{th\_L}$), the transistor 1600 remains off. Therefore, the data held can be read by measuring the potential of the second wiring.

However, fluctuation in the threshold voltage of a transistor (e.g., the transistor 1600) included in the memory cell may cause fluctuation in potentials needed for driving a plurality of memory cells (such a potential is also referred to as the threshold voltage of a memory cell). For example, fluctuation in the threshold voltage of the transistor 1600 may cause variation in the threshold voltages of the memory cells in data reading. Therefore, the operation voltages of the plurality of memory cells are each set to have a certain range in consideration of the fluctuation in the threshold voltages of the memory cells. This has limited a reduction in the operation voltages of the memory cells.

In the semiconductor device according to one embodiment of the disclosed invention, writing, reading, and verifying are performed while the write potential is sequentially changed to another potential as described in Embodiment 1 with reference to FIG. 1, FIGS. 2A to 2D, FIGS. 3A to 3D, FIGS. 4A and 4B, and FIGS. 5A and 5B; thus, the write potentials for the plurality of memory cells are determined. Accordingly, a semiconductor device in which variation (distribution width) in the threshold voltages of memory cells after writing is reduced so that the operation voltage can be reduced, the storage capacity can be increased, or operation such as writing, holding, or reading can be surely performed with the writing speed increased, and a method for driving the semiconductor device can be provided.

Note that in the case where a plurality of memory cells is arrayed to be used, only data of desired memory cells needs to be read. Thus, in the case where data of predetermined memory cells is read and data of the other memory cells is not read, a potential which allows the transistor 1600 to be turned off regardless of a state of the gate electrode, that is, a potential lower than $V_{th\_H}$ may be applied to fifth wirings of the memory cells whose data is not to be read. Alternatively, a potential which allows the transistor 1600 to be turned on regardless of a state of the gate electrode, that is, a potential higher than $V_{th\_L}$ may be supplied to the fifth wirings.

Next, rewriting of data (also referred to as another writing) will be described. Rewriting of data is performed in a manner similar to that of the writing and holding of data. The potential of the fourth wiring is set to a potential at which the transistor 1602 is turned on, so that the transistor 1602 is turned on. Accordingly, the potential of the third wiring (a potential for new data) is supplied to the gate electrode of the transistor 1600 and to the capacitor 1604. After that, the potential of the fourth wiring is set to a potential at which the transistor 1602 is turned off, so that the transistor 1602 is turned off. Accordingly, charge for new data is supplied to the gate electrode of the transistor 1600.

In the memory cell included in the semiconductor device according to one embodiment of the disclosed invention, data can be directly rewritten by another writing of data as described above. Therefore, extracting of charge from a floating gate with the use of a high voltage needed in a flash memory or the like is not necessary and thus, reduction in operation speed, which is attributed to erasing operation, can be suppressed. In other words, high-speed operation of the semiconductor device including the memory cell can be realized.

Note that the third wiring illustrated in FIGS. 16A1 and 16B corresponds to the second signal line 122 illustrated in FIG. 1 in Embodiment 1. The second wiring illustrated in FIGS. 16A1 and 16B corresponds to the third signal line 123 illustrated in FIG. 1 in Embodiment 1.

Note that the source electrode (or the drain electrode) of the transistor 1602 is electrically connected to the gate electrode of the transistor 1600, thereby having an effect similar to that of a floating gate of a floating gate transistor used for a non-volatile memory element. Hereinafter, the portion where the drain electrode (or the source electrode) of the transistor 1602 and the gate electrode of the transistor 1600 are electrically connected to each other is called a node FG in some cases. When the transistor 1602 is turned off, the node FG can be regarded as being embedded in an insulator and thus charge is held in the node FG. The off-state current of the transistor 1602 including an oxide semiconductor is smaller than or equal to 1/100000 of the off-state current of a transistor including a silicon semiconductor; thus, loss of the charge accumulated in the node FG due to leakage in the transistor 1602 is negligible. That is, with the transistor 1602 including an oxide semiconductor, a nonvolatile storage device which can hold data without being supplied with power can be realized.

For example, when the off-state current of the transistor 1602 is smaller than or equal to 10 zA (1 zA (zeptoampere) is $1 \times 10^{-21}$ A) at room temperature (25° C.) and the capacitance value of the capacitor 1604 is approximately 10 fF, data can be held for $10^4$ seconds or longer. It is needless to say that the holding time depends on transistor characteristics and capacitance values.

Further, the memory cell included in the semiconductor device of one embodiment of the disclosed invention does not have a problem of deterioration of a gate insulating film (tunnel insulating film), which occurs in a conventional floating gate transistor. That is, the deterioration of a gate insulating film due to injection of an electron into a floating gate, which has been regarded as a problem, can be solved. This means that there is no limit on the number of times of writing in principle. Furthermore, a high voltage needed for writing or erasing in a conventional floating gate transistor is not necessary.

Components such as transistors in the memory cell illustrated in FIG. 16A1 can be regarded as including resistors and capacitors as illustrated in FIG. 16A2. That is, in FIG. 16A2, the transistor 1600 and the capacitor 1604 are each regarded as including a resistor and a capacitor. R1 and C1 denote the resistance value and the capacitance value of the capacitor 1604, respectively. The resistance value R1 corresponds to the resistance value of an insulating layer included in the capacitor 1604. R2 and C2 denote the resistance value and the capacitance value of the transistor 1600, respectively. The resistance value R2 corresponds to the resistance value of a gate insulating layer at the time when the transistor 1600 is on. The capacitance value C2 corresponds to the capacitance value of so-called gate capacitance (capacitance between the gate electrode and the source electrode or drain electrode and capacitance between the gate electrode and the channel formation region).

A charge holding period (also referred to as a data holding period) is determined mainly by the off-state current of the transistor 1602 under the conditions where the gate leakage current of the transistor 1602 is sufficiently small and R1 and R2 satisfy R1≥ROS and R2≥ROS, where ROS is the resistance (also referred to as effective resistance) between the source electrode and the drain electrode in a state where the transistor 1602 is off.

On the other hand, in the case where the conditions are not satisfied, it is difficult to sufficiently secure the holding period even if the off-state current of the transistor 1602 is sufficiently small. This is because a leakage current other than the off-state current of the transistor 1602 (e.g., a leakage current generated between the source electrode and the gate electrode of the transistor 1600) is large. Accordingly, it can be said that the memory cell disclosed in this embodiment preferably satisfies the relations R1≥ROS and R2≥ROS.

Meanwhile, it is desirable that C1≥C2 be satisfied. This is because by increasing C1, the potential of the fifth wiring can be efficiently applied to the node FG when the potential of the node FG is controlled by the fifth wiring, and thus the difference between the potentials supplied to the fifth wiring (e.g., a read potential and a non-read potential) can be reduced.

When the above relations are satisfied, a semiconductor device including a more favorable memory cell can be realized. Note that R1 and R2 are controlled by the gate insulating layer of the transistor 1600 and the insulating layer of the capacitor 1604. The same applies to C1 and C2. Therefore, the material, the thickness, and the like of the gate insulating layer are desirably set as appropriate to satisfy the above relation.

In the semiconductor device described in this embodiment, the node FG has an effect similar to a floating gate of a floating gate transistor in a flash memory or the like, but the node FG of this embodiment has a feature which is essentially different from that of the floating gate in the flash memory or the like.

In a flash memory, since a potential applied to a control gate is high, it is necessary to keep a proper distance between cells in order to prevent the potential from affecting a floating gate of the adjacent cell. This is one of factors inhibiting higher integration of the semiconductor device. The factor is attributed to a basic principle of a flash memory, in which tunneling current is generated by application of a high electric field.

In contrast, the memory cell included in the semiconductor device according to this embodiment is operated by switching of a transistor including an oxide semiconductor and does not use the above principle of charge injection by tunneling current. That is, a high electric field for charge injection is not necessary, unlike in a flash memory. Accordingly, it is not necessary to consider an influence of a high electric field from a control gate on an adjacent cell, which facilitates high integration.

In addition, there is another advantage over a flash memory in that a high electric field and a large peripheral circuit (such as a booster circuit) are unnecessary. For example, the highest voltage applied to the memory cell according to this embodiment (the difference between the highest potential and the lowest potential applied to terminals of the memory cell at the same time) can be 5 V or lower, preferably 3 V or lower in each memory cell in the case where two levels (one bit) of data are written.

In the case where the relative dielectric constant $\in$r1 of the insulating layer included in the capacitor 1604 is made different from the relative dielectric constant $\in$r2 of the insulating layer included in the transistor 1600, C1 can easily be made greater than or equal to C2 (C1≥C2) while S1 which is the area of the insulating layer included in the capacitor 1604 and S2 which is the area of the insulating layer forming gate capacitance of the transistor 1600 satisfy the relation where 2·S2 is greater than or equal to S1 (2·S2≥S1), desirably S2 is greater than or equal to S1 (S2≥S1). In other words, C1≥C2 can be easily satisfied while the area of the insulating layer included in the capacitor 1604 is small. Specifically, for example, when a film formed of a high-k material such as hafnium oxide or a stack of a film formed of a high-k material such as hafnium oxide and a film formed of an oxide semiconductor is used for the insulating layer included in the capacitor 1604, $\in$r1 can be set to 10 or more, preferably 15 or more, and when a film formed of silicon oxide is used for the insulating layer forming the gate capacitance, $\in$r2 can be set to 3 to 4.

Combination of such structures enables higher integration of the memory cell included in the semiconductor device according to one embodiment of the disclosed invention.

Note that in addition to the increase in the integration degree, a multilevel technique can be employed in order to increase the storage capacity of the memory cell included in the semiconductor device. For example, three or more levels of data are written to one memory cell, whereby the storage capacity can be increased as compared to that in the case where two-level (one-bit) data is written. The multilevel technique can be achieved by, for example, giving charge Q, which is different from charge $Q_L$ for supplying a low potential and charge $Q_H$ for supplying a high potential, to the gate electrode of the transistor 1600, in addition to the charge $Q_L$ and the charge $Q_H$.

Since the off-state current of the transistor 1602 including an oxide semiconductor is extremely small in the semiconductor device described in this embodiment, stored data can be held for an extremely long period owing to such a transistor. In other words, power consumption can be adequately reduced because refresh operation becomes unnecessary or the frequency of refresh operation can be extremely low. Moreover, stored data can be held for a long period even when power is not supplied (note that a potential is preferably fixed).

In a semiconductor device according to one embodiment of the disclosed invention, even when the threshold voltage of a transistor included in a memory cell fluctuates, variation (distribution width) in the threshold voltages of a plurality of memory cells after writing can be reduced, whereby the operation voltage of the semiconductor device can be reduced. A memory can be multi-valued without increasing the operation voltage and the area of a memory cell, so that the storage capacity per unit area of the semiconductor device can be increased. A semiconductor device in which operation such as writing, holding, or reading can be surely performed can be provided.

Further, in the semiconductor device described in this embodiment, high voltage is not needed for writing data and there is no problem of deterioration of elements. For example, unlike a conventional non-volatile memory, it is not necessary to inject and extract electrons into and from a floating gate, and thus a problem such as deterioration of a gate insulating layer does not occur at all. In other words, the semiconductor device according to one embodiment of the present invention does not have a limit on the number of times of writing which is a problem in a conventional nonvolatile memory, and reliability thereof is drastically improved. Furthermore, data is written depending on the on state and the off state of the transistor, whereby high-speed operation can be easily realized.

Since a transistor including a material other than an oxide semiconductor can operate at sufficiently high speed, a semiconductor device in which the transistor is used in combination with a transistor including an oxide semiconductor can perform operation (e.g., data reading) at sufficiently high speed. Further, a transistor including a material other than an oxide semiconductor can favorably realize a variety of circuits (such as a logic circuit or a driver circuit) which is required to operate at high speed.

Thus, a semiconductor device having a novel feature can be achieved by being provided with both the transistor including a semiconductor material other than an oxide semiconductor (a transistor capable of operation at sufficiently high speed, in general) and the transistor including an oxide semiconductor (a transistor whose off-state current is sufficiently low, in general).

The structures, methods, and the like described in this embodiment can be combined as appropriate with any of the structures, methods, and the like described in the other embodiments.

Embodiment 4

In this embodiment, application examples of a semiconductor device according to one embodiment of the disclosed invention will be described with reference to FIGS. 17A to 17C. Here, an example of a storage device will be described. Note that in each of circuit diagrams, in some cases, "OS" is written beside a transistor in order to indicate that the transistor includes an oxide semiconductor.

Figure 17A:
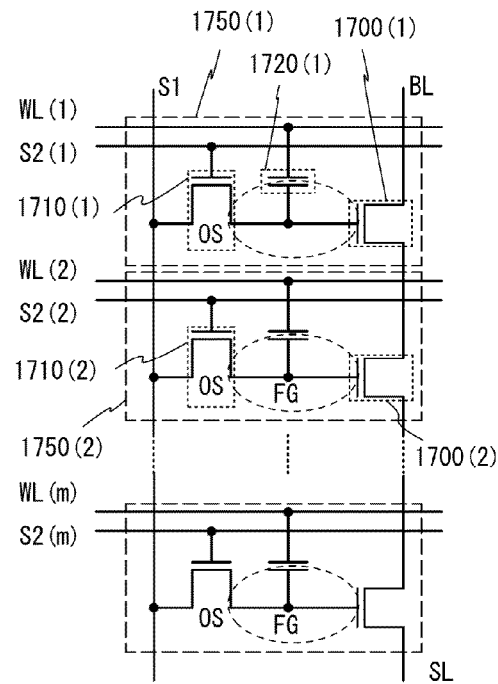
FIGS. 17A to 17C are circuit diagrams of semiconductor devices.
Figure 17B:
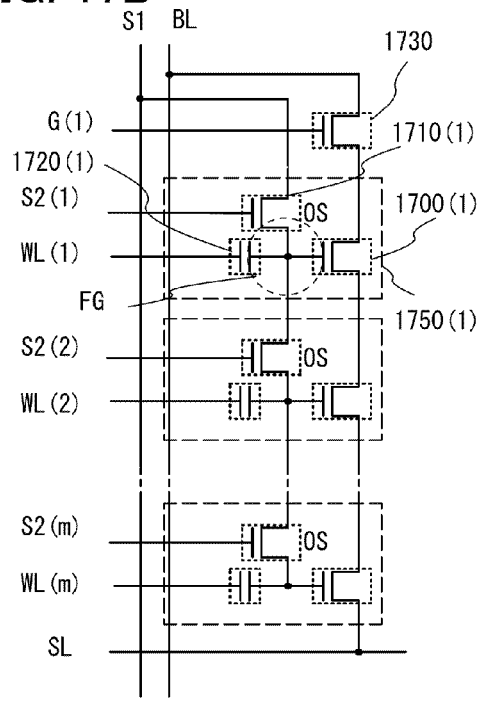
Figure 17C:
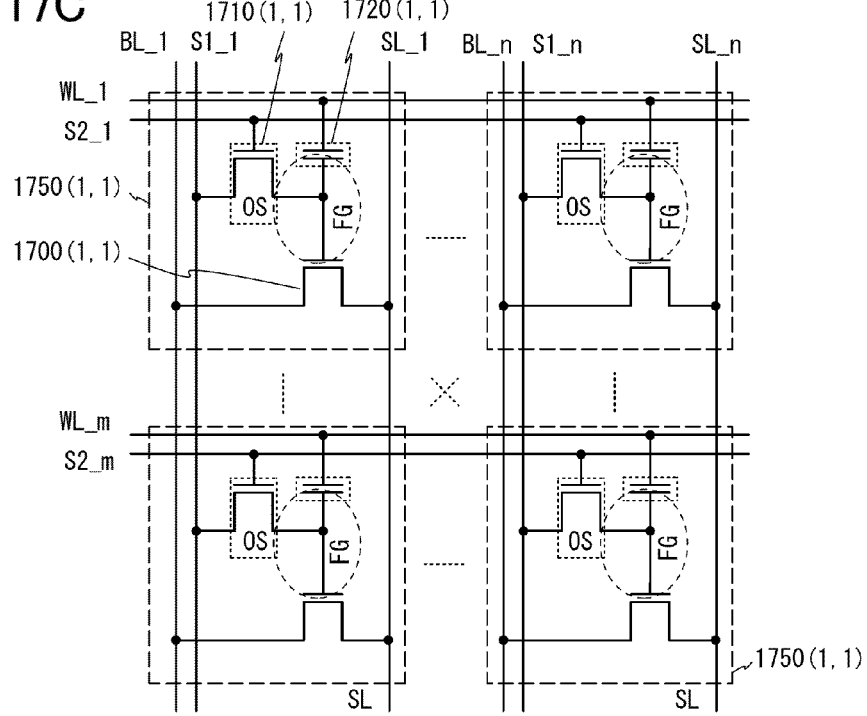

FIGS. 17A to 17C are circuit diagrams of semiconductor devices each of which can be used as a storage device and includes a plurality of semiconductor devices (hereinafter also referred to as memory cells) illustrated in FIG. 16A1. Each of FIGS. 17A and 17B is a circuit diagram of a NAND semiconductor device in which memory cells are connected in series. FIG. 17C is a circuit diagram of a NOR semiconductor device in which memory cells are connected in parallel.

The semiconductor device in FIG. 17A includes a source line SL, a bit line BL, a first signal line S1, m second signal lines S2, m word lines WL, and m memory cells. In FIG. 17A, one source line SL and one bit line BL are provided in the semiconductor device; however, one embodiment of the disclosed invention is not limited to this. A plurality of source lines SL and a plurality of bit lines BL may be provided.

A memory cell $1750(i)$ is considered as a typical example of the memory cells, where i is an integer greater than or equal to 1 and less than or equal to m. In the memory cell $1750(i)$, a gate electrode of a transistor $1700(i)$, a drain electrode (or a source electrode) of a transistor $1710(i)$, and one electrode of a capacitor $1720(i)$ are electrically connected to each other. The first signal line S1 and the source electrode (or the drain electrode) of the transistor $1710(i)$ are electrically connected to each other, and the second signal line $S2(i)$ and a gate electrode of the transistor $1710(i)$ are electrically connected to each other. The word line WL(i) and the other electrode of the capacitor $1720(i)$ are electrically connected to each other.

Further, a source electrode of the transistor $1700(i)$ included in the memory cell $1750(i)$ is electrically connected to a drain electrode of a transistor $1700(i-1)$ in an adjacent memory cell $1750(i-1)$. A drain electrode of the transistor $1700(i)$ included in the memory cell $1750(i)$ is electrically connected to a source electrode of a transistor $1700(i+1)$ in an adjacent memory cell $1750(i+1)$. Note that a drain electrode of a transistor $1700(1)$ in a memory cell $1750(1)$ among the m memory cells connected in series is electrically connected to the bit line BL. In addition, a source electrode of a transistor $1700(m)$ included in a memory cell $1750(m)$ among the m memory cells connected in series is electrically connected to the source line SL.

The transistor $1700(1)$ in the memory cell $1750(1)$ may be electrically connected to the bit line BL through a selection transistor (not shown). In that case, a selection line $G(1)$ is connected to a gate electrode of the selection transistor. Further, the transistor $1700(m)$ in the memory cell $1750(m)$ may be electrically connected to the source line SL through a selection transistor (not shown). In that case, a selection line $G(2)$ is connected to a gate electrode of the selection transistor.

In the semiconductor device in FIG. 17A, writing operation and reading operation are performed in each row. The writing operation is performed as follows. A potential at which the transistor $1710(i)$ is turned on is supplied to the second signal line $S2(i)$ in a row subjected to writing (e.g., the i-th row), so that the transistor $1710(i)$ in the row subjected to writing is turned on. Accordingly, the potential of the first signal line S1 is applied to the gate electrode of the transistor $1700(i)$ in the specified row, so that predetermined charge is given to the gate electrode. Thus, data can be written to the memory cell of the specified row.

Further, the reading operation is performed as follows. Word lines WL of rows other than the row subjected to reading (e.g., the i-th row) are supplied with a potential at which the transistors 1700 that are not in the row subjected to reading are turned on regardless of charge given to the gate electrode of the transistor $1700(i)$, so that the transistors 1700 in the rows other than the row subjected to reading are turned on. Then, the word line WL(i) of the row subjected to reading is supplied with a potential (a reading potential) at which the on state or the off state of the transistor $1700(i)$ is selected depending on data to which the charge stored in the gate electrode of the transistor $1700(i)$ corresponds. Moreover, a constant potential is supplied to the source line SL so that a reading circuit (not shown) connected to the bit line BL operates. Here, among a plurality of transistors $1700(1)$ to $1700(m)$ between the source line SL and the bit line BL, all the transistors 1700 except the transistor $1700(i)$ of the row subjected to reading are on; therefore, the level of the conductance between the source line SL and the bit line BL is determined by the state (the on state or the off state) of the transistor $1700(i)$ in the row subjected to reading. The state (the on state or the off state) of the transistor $1700(i)$ differs depending on data to which the charge stored in the gate electrode of the transistor $1700(i)$ in the row subjected to reading corresponds; thus, the potential of the bit line BL varies accordingly. By reading the potential of the bit line BL with the reading circuit, data can be read from the memory cell of the specified row.

However, fluctuation in the threshold voltage of a transistor (e.g., the transistor $1700(i)$) included in the memory cell may cause fluctuation in potentials needed for driving the plurality of memory cells (such a potential is also referred to as the threshold voltage of a memory cell). For example, fluctuation in the threshold voltage of the transistor $1700(i)$ may cause fluctuation in the threshold voltages of the memory cells in data reading. Therefore, the operation voltages of the plurality of memory cells are each set to have a certain range in consideration of the fluctuation in the threshold voltages of the memory cells. This has limited a reduction in the operation voltages of the memory cells.

In the semiconductor device according to one embodiment of the disclosed invention, writing, reading, and verifying are performed while the write potential is sequentially changed to another potential as described in Embodiment 1 with reference to FIG. 1, FIGS. 2A to 2D, FIGS. 3A to 3D, FIGS. 4A and 4B, and FIGS. 5A and 5B; thus, the write potentials for the plurality of memory cells are determined. Accordingly, a semiconductor device in which variation (distribution width) in the threshold voltages of memory cells after writing is reduced so that the operation voltage can be reduced, the storage capacity can be increased, or operation such as writing, holding, or reading can be surely performed, and a method for driving the semiconductor device can be provided.

Note that the first signal line S1 illustrated in FIG. 17A corresponds to the second signal line 122 illustrated in FIG. 1 in Embodiment 1. The bit line BL illustrated in FIG. 17A corresponds to the third signal line 123 illustrated in FIG. 1 in Embodiment 1.

FIG. 17B illustrates a semiconductor device whose structure is partly different from that in FIG. 17A.

One of differences between the semiconductor device in FIG. 17B and the semiconductor device in FIG. 17A is that the bit line BL and the drain electrode of the transistor 1700(1) in the memory cell 1750(1) are electrically connected to each other through a selection transistor 1730 in the semiconductor device in FIG. 17B. A gate electrode of the selection transistor 1730 is electrically connected to the selection line G(1) for switching between the on and off states of the selection transistor 1730.

Another difference between the semiconductor device in FIG. 17B and the semiconductor device in FIG. 17A is that the source electrode (or the drain electrode) of the transistor 1710 in each memory cell is connected to the first signal line S1 in the semiconductor device in FIG. 17A, whereas the transistors 1710 in the memory cells are connected in series in the semiconductor device in FIG. 17B. That is, the source electrode of the transistor 1710($i$) in the memory cell 1750($i$) is electrically connected to a drain electrode of a transistor 1710($i$−1) in the adjacent memory cell 1750($i$−1). The drain electrode of the transistor 1710($i$) in the memory cell 1750($i$) is electrically connected to a source electrode of a transistor 1710($i$+1) in the adjacent memory cell 1750($i$+1). Note that a source electrode of a transistor 1710(1) in the memory cell 1750(1) among the m memory cells connected in series is electrically connected to the first signal line S1. Moreover, in each of the memory cells connected in series, the drain electrode (or the source electrode) of the transistor 1710($i$) is electrically connected to the gate electrode of the transistor 1700($i$) and one electrode of the capacitor 1720($i$) as in the semiconductor device in FIG. 17A.

The structure of other portions of the semiconductor device in FIG. 17B is similar to that of the semiconductor device in FIG. 17A; therefore, the above description can be referred to for the details.

Note that the first signal line S1 and the bit line BL are separately provided in the semiconductor device in FIG. 17B; however, the disclosed invention is not limited to this structure. The first signal line S1 and the bit line BL may be one line.

Also in the semiconductor device in FIG. 17B, writing operation and reading operation are performed in each row. The writing operation is performed as follows.

The writing operation is sequentially performed row by row from the m-th row. In order to perform writing on the i-th row (i is one of 1 to m), a potential at which the transistor 1710($i$) is turned on is supplied to the second signal line S2($i$) in the row subjected to writing (the i-th row), so that the transistor 1710($i$) in the row subjected to writing is turned on. Here, in the case where the transistors 1710(1) to 1710($i$−1) exist between the transistor 1710($i$) and the first signal line S1, the transistors 1710(1) to 1710($i$−1) in the rows that precede the row subjected to writing are turned on so that the potential of the first signal line S1 is applied to the memory cell 1750($i$) in the row subjected to writing. Accordingly, the potential of the first signal line S1 is supplied to the gate electrode of the transistor 1700($i$) of the specified row, so that predetermined charge is given to the gate electrode. Then, the potential of the second signal line S2($i$) is fixed at GND, so that charge accumulated in the gate electrode of the transistor 1700($i$) is held. Thus, data can be written into the memory cell of the specified row (the i-th row).

Note that in the semiconductor device in FIG. 17B, since the transistors 1710 included in the memory cells 1750 are connected in series, it is difficult to rewrite data only in a given row. Therefore, operation for erasing data in a plurality of rows all at once is preferably performed in the above driving method. For example, erasing per block is preferably performed, dividing the first to m-th rows into blocks. In order to rewrite data in a predetermined block, it is preferable that data in the block be erased first, and then data writing be sequentially performed from the m-th row. Note that in the case where data in a row on which writing has just been performed is rewritten, erasing operation is unnecessary.

Further, the reading operation is performed as follows. First, a potential is supplied to the selection line G(1) so that the selection transistor is turned on. Note that in the case where there are a selection transistor connected to the selection line G(1) and a selection transistor connected to the selection line G(2), the two transistors are turned on. Moreover, word lines WL of rows other than the row subjected to reading (e.g., the i-th row) are supplied with a potential at which the transistors 1700 that are not in the row subjected to reading are turned on regardless of charge given to the gate electrode of the transistor 1700($i$), so that the transistors 1700 in the rows other than the row subjected to reading are turned on. Then, the word line WL(i) of the row subjected to reading is supplied with a potential (a reading potential) at which the on state or the off state of the transistor 1700($i$) is selected depending on data to which the charge stored in the gate electrode of the transistor 1700($i$) corresponds. Moreover, a constant potential is supplied to the source line SL so that a reading circuit (not shown) connected to the bit line BL operates. Here, among a plurality of transistors 1700(1) to 1700($m$) between the source line SL and the bit line BL, all the transistors 1700 except the transistor 1700($i$) of the row subjected to reading are on; therefore, the level of the conductance between the source line SL and the bit line BL is determined by the state (the on state or the off state) of the transistor 1700($i$) in the row subjected to reading. The state (the on state or the off state) of the transistor 1700($i$) differs depending on data to which the charge stored in the gate electrode of the transistor 1700($i$) in the row subjected to reading corresponds; thus, the potential of the bit line BL varies accordingly. By reading the potential of the bit line BL with the read-out circuit, data can be read out from the memory cell of the specified row.

Also in the semiconductor device illustrated in FIG. 17B, writing, reading, and verifying are performed while the write potential is sequentially changed to another potential as described in Embodiment 1 with reference to FIG. 1, FIGS. 2A to 2D, FIGS. 3A to 3D, FIGS. 4A and 4B, and FIGS. 5A and 5B; thus, the write potentials for the plurality of memory cells are determined. Accordingly, a semiconductor device in which variation (distribution width) in the threshold voltages of memory cells after writing is reduced so that the operation voltage can be reduced, the storage capacity can be increased, or operation such as writing, holding, or reading can be surely performed, and a method for driving the semiconductor device can be provided.

Note that the first signal line S1 illustrated in FIG. 17B corresponds to the second signal line 122 illustrated in FIG. 1 in Embodiment 1. The bit line BL illustrated in FIG. 17B corresponds to the third signal line 123 illustrated in FIG. 1 in Embodiment 1.

The semiconductor device in FIG. 17C includes n source lines SL, n bit lines BL, n first signal lines S1, m second signal lines S2, m word lines WL, and a plurality of memory cells 1750(1,1) to 1750(m,n).

A memory cell 1750(i,j) is considered as a typical example of the memory cells, where i is an integer greater than or equal to 1 and less than or equal to m and j is an integer of greater than or equal to 1 and less than or equal to n. In the memory cell 1750(i,j), a gate electrode of a transistor 1700(0, a drain electrode (or a source electrode) of a transistor 1710(i,j), and one electrode of a capacitor 1720(i,j) are electrically connected to each other. A source line SL(j) and a source electrode of the transistor 1700(i,j) are electrically connected to each other. A bit line BL(j) and a drain electrode of the transistor 1700(i,j) are electrically connected to each other. A first signal line S1(j) and the source electrode (or the drain electrode) of the transistor 1710(i,j) are electrically connected to each other. The second signal line S2(i) and a gate electrode of the transistor 1710(i,j) are electrically connected to each other. The word line WL(i) and the other electrode of the capacitor 1720(i,j) are electrically connected to each other.

In the semiconductor device in FIG. 17C, writing operation and reading operation are performed in each row. The writing operation is performed in a manner similar to that of the semiconductor device in FIG. 17A. The reading operation is performed as follows. First, the word lines WL of rows other than a row subjected to reading (e.g., the i-th row having the memory cells 1750(i,1) to 1750(i,n)) are supplied with a potential at which the transistors 1700 that are not in the row subjected to reading are turned off regardless of data to which charge given to gate electrodes of the transistors 1700(i,1) to 1700(i,n) corresponds, so that the transistors 1700 in the rows other than the row subjected to reading are turned off. Then, the word line WL(i) of the row subjected to reading is supplied with a potential (a reading potential) at which the on state or the off state of the transistors 1700(i,1) to 1700(i,n) is selected depending on data to which the charge stored in the gate electrodes of the transistors 1700(i,1) to 1700(i,n) corresponds. Moreover, a constant potential is supplied to the source line SL(j) so that a reading circuit (not shown) connected to the bit line BL(j) operates. Here, the level of the conductance between the source line SL(j) and the bit line BL(j) is determined by the state (the on state or the off state) of the transistors 1700(i,1) to 1700(i,n) in the row subjected to reading. That is, the potential of the bit line BL(j) differs depending on data to which the charge stored in the gate electrodes of the transistors 1700(i,1) to 1700(i,n) in the row subjected to reading corresponds. By reading the potential of the bit line BL(j) with the reading circuit, data can be read out from the memory cell of the specified row.

Also in the semiconductor device illustrated in FIG. 17C, writing, reading, and verifying are performed while the write potential is sequentially changed to another potential as shown in FIG. 1, FIGS. 2A to 2D, FIGS. 3A to 3D, FIGS. 4A and 4B, and FIGS. 5A and 5B; thus, the write potentials for the plurality of memory cells are determined. Accordingly, a semiconductor device in which variation (distribution width) in the threshold voltages of memory cells after writing is reduced so that the operation voltage can be reduced, the storage capacity can be increased, or operation such as writing, holding, or reading can be surely performed, and a method for driving the semiconductor device can be provided.

Note that each of the first signal lines 51 illustrated in FIG. 17C corresponds to the second signal line 122 illustrated in FIG. 1. Each of the bit lines BL illustrated in FIG. 17C corresponds to the third signal line 123 illustrated in FIG. 1.

Although the amount of data which can be stored in each of the memory cells 1750 is one bit in the above description, the structure of the semiconductor device of this embodiment is not limited to this example. The amount of data stored in each memory cell 1750 may be increased by preparation of three or more potentials to be supplied to the gate electrode of the transistor 1700 at the time of data writing. For example, in the case where four kinds of potentials are supplied to the gate electrode of the transistor 1700 at the time of data writing, data of two bits can be held in each of the memory cells.

In FIGS. 17A to 17C, the first signal line S1 and the bit line BL may be one wiring. When one wiring serves as both the first signal line S1 and the bit line BL, the number of wirings can be reduced. Further, in FIG. 17C, the source line SL may be shared by a plurality of memory cells.

In the semiconductor device according to one embodiment of the disclosed invention, even when the threshold voltage of a transistor included in a memory cell fluctuates, variation (distribution width) in the threshold voltages of a plurality of memory cells after writing can be reduced, whereby the operation voltage of the semiconductor device can be reduced. A memory can be multi-valued without increasing the operation voltage and the area of a memory cell, so that the storage capacity per unit area of the semiconductor device can be increased. A semiconductor device in which operation such as writing, holding, or reading can be surely performed can be provided.

The structures, methods, and the like described in this embodiment can be combined as appropriate with any of the structures, methods, and the like described in the other embodiments.

Embodiment 5

In this embodiment, a structure and a manufacturing method of a memory cell included in a semiconductor device according to one embodiment of the disclosed invention will be described with reference to FIGS. 18A and 18B, FIGS. 19A to 19D, FIGS. 20A to 20D, FIGS. 21A to 21D, FIGS. 22A and 22B, and FIGS. 23A and 23B.

<Cross-sectional Structure and Plan View of Memory Cell>

Figure 18A:
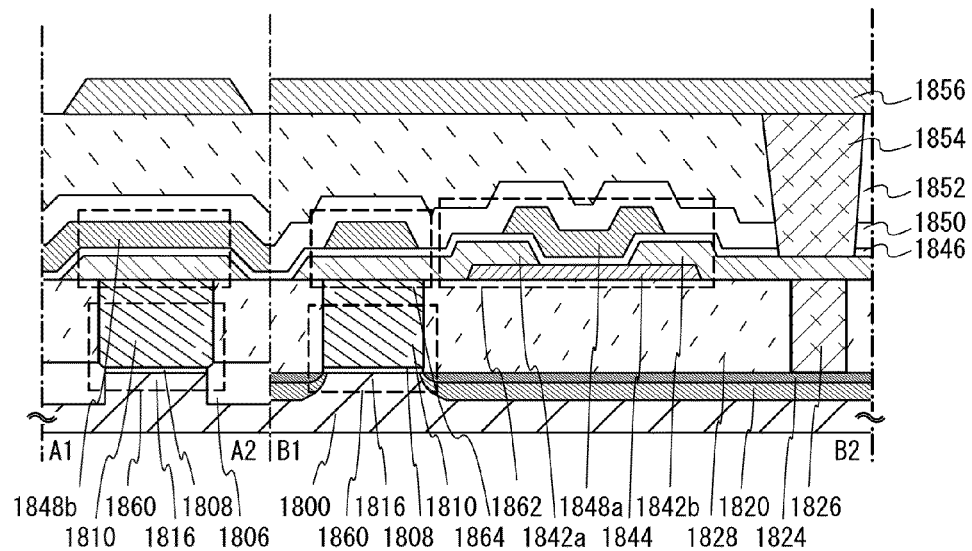
FIGS. 18A and 18B are a cross-sectional view and a plan view of a memory cell included in a semiconductor device.
Figure 18B:
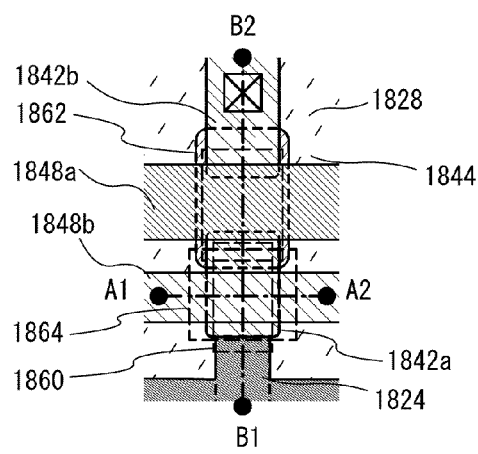

FIGS. 18A and 18B illustrate an example of a structure of a memory cell included in a semiconductor device. FIG. 18A illustrates a cross section of the memory cell included in the semiconductor device, and FIG. 18B illustrates a plan view of the memory cell included in the semiconductor device. In FIG. 18A, A1-A2 is a cross section perpendicular to a channel length direction of a transistor, and B1-B2 is a cross section parallel to the channel length direction of the transistor. The semiconductor device illustrated in FIGS. 18A and 18B includes a transistor 1860 including a first semiconductor material in a lower portion, and a transistor 1862 including a second semiconductor material in an upper portion. FIGS. 18A and 18B illustrate the semiconductor device including one transistor 1860, one transistor 1862, and one capacitor 1864; alternatively, the semiconductor device may include a plurality of transistors 1860, transistors 1862, and capacitors 1864.

Here, the first semiconductor material is preferably different from the second semiconductor material. For example, a semiconductor material other than an oxide semiconductor can be used as the first semiconductor material, and an oxide semiconductor can be used as the second semiconductor material. The semiconductor material other than the oxide semiconductor may be, for example, silicon, germanium, silicon germanium, silicon carbide, gallium arsenide, or the like and is preferably a single crystal semiconductor. Alternatively, an organic semiconductor material or the like may be used. A transistor including such a semiconductor material can operate at high speed easily. On the other hand, a transistor including an oxide semiconductor can hold charge for a long time owing to its characteristics.

Either an n-channel transistor or a p-channel transistor can be used for the transistor 1860 and the transistor 1862. Here, the case where the transistors 1860 and 1862 are n-channel transistors will be described. Since the technical feature of one embodiment of the present invention is to use a semiconductor material like an oxide semiconductor, which can sufficiently reduce off-state current, for the transistor 1862 in order to hold data, it is not necessary to limit specific conditions such as a structure or a material of the semiconductor device to those given here.

The transistor 1860 includes a channel formation region 1816 provided in a substrate 1800 including a semiconductor material (e.g., silicon), impurity regions 1820 (also referred to as a source region and a drain region) provided so that the channel formation region 1816 is placed therebetween, metal compound regions 1824 in contact with the impurity regions 1820, a gate insulating layer 1808 provided over the channel formation region 1816, and a gate electrode 1810 provided over the gate insulating layer 1808. Note that FIGS. 18A and 18B illustrate an element in which distinct source and drain electrodes are not provided; such an element is sometimes referred to as a transistor for the sake of convenience. Further, in such a case, in description of connection of a transistor, a source region and a source electrode may be collectively referred to as a "source electrode," and a drain region and a drain electrode may be collectively referred to as a "drain electrode". That is, in this specification, the term "source electrode" may include a source region.

An electrode 1826 is connected to part of the metal compound region 1824 of the transistor 1860. Here, the electrode 1826 functions as a source electrode or a drain electrode of the transistor 1860. Further, an element isolation insulating layer 1806 is formed on the substrate 1800 so as to surround the transistor 1860, and an insulating layer 1828 is formed over the transistor 1860. For high integration, as illustrated in FIGS. 18A and 18B, it is preferable that the transistor 1860 do not include a sidewall insulating layer. On the other hand, in the case where importance is put on characteristics of the transistor 1860, a sidewall insulating layer may be provided on a side surface of the gate electrode 1810, and the impurity regions 1820 may include a region having a different impurity concentration in a region overlapping with the sidewall insulating layer.

The transistor 1862 includes an oxide semiconductor layer 1844 provided over the insulating layer 1828 and the like; a source or drain electrode 1842*a* and a source or drain electrode 1842*b* which are electrically connected to the oxide semiconductor layer 1844; a gate insulating layer 1846 covering the oxide semiconductor layer 1844, the source or drain electrode 1842*a*, and the source or drain electrode 1842*b*; and a gate electrode 1848*a* provided over the gate insulating layer 1846 so as to overlap with the oxide semiconductor layer 1844.

Here, the oxide semiconductor layer 1844 used for the transistor 1862 is preferably an oxide semiconductor layer which is purified by sufficiently removing an impurity such as hydrogen therefrom or by sufficiently supplying oxygen thereto. For example, the concentration of hydrogen in the oxide semiconductor layer 1844 is $5 \times 10^{19}$ atoms/cm$^3$ or lower, preferably $5 \times 10^{18}$ atoms/cm$^3$ or lower, further preferably $5 \times 10^{17}$ atoms/cm$^3$ or lower. Note that the concentration of hydrogen in the oxide semiconductor layer 1844 is measured by secondary ion mass spectrometry (SIMS). In the oxide semiconductor layer 1844 which is highly purified by sufficiently reducing the hydrogen concentration and in which defect levels in an energy gap due to oxygen deficiency are reduced by supplying a sufficient amount of oxygen, the carrier concentration is less than $1 \times 10^{12}$/cm$^3$, preferably less than $1 \times 10^{11}$/cm$^3$, further preferably less than $1.45 \times 10^{10}$/cm$^3$. For example, the off-state current (here, current per micrometer (μm) of channel width) at room temperature (25° C.) is lower than or equal to 100 zA (1 zA (zeptoampere) is $1 \times 10^{-21}$ A), preferably lower than or equal to 10 zA. Thus, the transistor 1862 can have extremely excellent off-state current characteristics by using the i-type (intrinsic) or substantially i-type oxide semiconductor layer 1844.

Although the oxide semiconductor layer which is processed into an island shape is used in the transistor 1862 in order to suppress leakage current generated between elements due to miniaturization, an oxide semiconductor layer which is not processed into an island shape may be used. When an oxide semiconductor layer is not processed into an island shape, contamination of the oxide semiconductor layer due to etching in the processing can be prevented.

The capacitor 1864 includes the source or drain electrode 1842*a*, the gate insulating layer 1846, and a conductive layer 1848*b*. That is, the source or drain electrode 1842*a* functions as one electrode of the capacitor 1864, and the conductive layer 1848*b* functions as the other electrode of the capacitor 1864. With such a structure, sufficient capacitance can be secured. Further, insulation between the source or drain electrode 1842*a* and the conductive layer 1848*b* can be sufficiently secured by stacking the oxide semiconductor layer 1844 and the gate insulating layer 1846. In the case where a capacitor is not needed, the capacitor 1864 may be omitted.

Note that in the transistor 1862 and the capacitor 1864, end portions of the source or drain electrode 1842*a* and the source or drain electrode 1842*b* are preferably tapered. The end portions of the source or drain electrode 1842*a* and the source or drain electrode 1842*b* are tapered, so that coverage with the gate insulating layer 1846 can be improved and disconnection can be prevented. Here, a taper angle is, for example, greater than or equal to 30° and less than or equal to 60°. Note that the taper angle is a tilt angle formed between a side surface and a bottom surface of a layer having a tapered shape (e.g., the source or drain electrode 1842*a*) when the layer is seen in a direction perpendicular to a cross-sectional plane (a plane perpendicular to the surface of a substrate).

An insulating layer 1850 and an insulating layer 1852 are provided over the transistor 1862 and the capacitor 1864. An electrode 1854 is provided in an opening formed in the gate insulating layer 1846, the insulating layer 1850, the insulating layer 1852, and the like, and a wiring 1856 which is connected to the electrode 1854 is formed over the insulating layer 1852. The wiring 1856 connects one memory cell to another memory cell. Note that although the metal compound region 1824, the source or drain electrode 1842b, and the wiring 1856 are connected to one another through the electrode 1826 and the electrode 1854 in FIGS. 18A and 18B, one embodiment of the present invention is not limited to this. For example, the source or drain electrode 1842b may be in direct contact with the metal compound region 1824, or the wiring 1856 may be in direct contact with the source or drain electrode 1842b.

In FIGS. 18A and 18B, the electrode 1826 connecting the metal compound region 1824 to the source or drain electrode 1842b and the electrode 1854 connecting the source or drain electrode 1842b to the wiring 1856 overlap with each other. In other words, a region in which the electrode 1826 functioning as a source electrode or a drain electrode of the transistor 1860 is in contact with the source or drain electrode 1842b of the transistor 1862 overlaps with a region in which the source or drain electrode 1842b of the transistor 1862 is in contact with the electrode 1854. With such a planar layout, the element area can be prevented from increasing due to contact regions of the electrodes. In other words, the degree of integration of the semiconductor device can be increased.

In FIGS. 18A and 18B, the transistor 1860 and the transistor 1862 are provided to at least partly overlap with each other. Moreover, the transistor 1862 and the capacitor 1864 are provided to overlap with the transistor 1860. For example, the conductive layer 1848b of the capacitor 1864 is provided so as to overlap with the gate electrode 1810 of the transistor 1860 at least partly. By employing such a planar layout, high integration can be realized. For example, given that the minimum feature size is F, the area occupied by a memory cell can be $15F^2$ to $25F^2$.

<Method for Manufacturing Memory Cell Included in Semiconductor Device>

Next, an example of a method for manufacturing the memory cell included in the semiconductor device will be described. First, a method for manufacturing the transistor 1860 in the lower portion will be described below with reference to FIGS. 19A to 19D and FIGS. 20A to 20D, and then a method for manufacturing the transistor 1862 in the upper portion and the capacitor 1864 will be described with reference to FIGS. 21A to 21D and FIGS. 22A and 22B.

<Method for Manufacturing a Transistor in a Lower Portion>

A method for manufacturing the transistor 1860 in a lower portion is described with reference to FIGS. 19A to 19D and FIGS. 20A to 20D.

First, the substrate 1800 including a semiconductor material is prepared. As the substrate including a semiconductor material, a single crystal semiconductor substrate or a polycrystalline semiconductor substrate of silicon, silicon carbide, or the like; a compound semiconductor substrate of silicon germanium or the like; an SOI substrate; or the like can be used. Here, an example of using a single crystal silicon substrate as the substrate 1800 including a semiconductor material is described. Note that in general, the term "SOI substrate" means a substrate where a silicon semiconductor layer is provided on an insulating surface. In this specification and the like, the term "SOI substrate" also includes a substrate where a semiconductor layer formed using a material other than silicon is provided on an insulating surface. That is, a semiconductor layer included in the "SOI substrate" is not limited to a silicon semiconductor layer. Moreover, the SOI substrate can be a substrate having a structure in which a semiconductor layer is provided over an insulating substrate such as a glass substrate, with an insulating layer interposed therebetween.

As the substrate 1800 including a semiconductor material, a single crystal semiconductor substrate of silicon or the like is preferably used because the speed of reading operation of the semiconductor device can be increased.

Figure 19A:
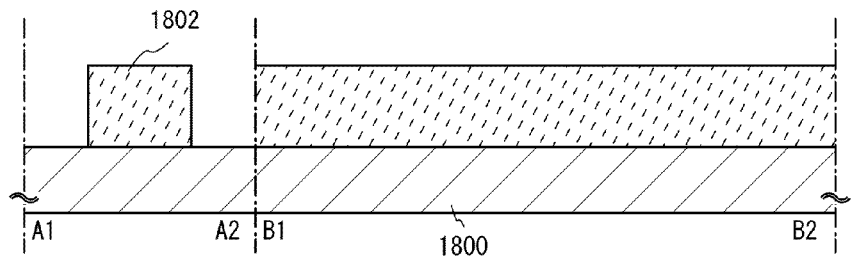
FIGS. 19A to 19D are cross-sectional views illustrating a manufacturing process of a semiconductor device.
Figure 19B:
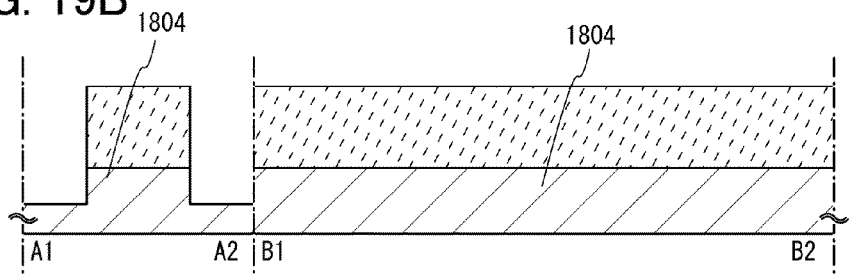

Over the substrate 1800, a protective layer 1802 serving as a mask for formation of the element isolation insulating layer is formed (see FIG. 19A). As the protective layer 1802, for example, an insulating layer formed using silicon oxide, silicon nitride, silicon oxynitride, or the like can be used. Note that before or after this step, an impurity element imparting n-type conductivity or an impurity element imparting p-type conductivity may be added to the substrate 1800 in order to control the threshold voltage of the transistor. In the case where silicon is used as the semiconductor, phosphorus, arsenic, or the like can be used as an impurity element imparting n-type conductivity. On the other hand, boron, aluminum, gallium, or the like can be used as an impurity element imparting p-type conductivity.

Then, part of the substrate 1800 in a region that is not covered with the protective layer 1802 (in an exposed region) is removed by etching using the protective layer 1802 as a mask. Thus, a semiconductor region 1804 isolated from the other semiconductor regions is formed (see FIG. 19B). As the etching, dry etching is preferably performed, but wet etching may be performed. An etching gas and an etchant can be selected as appropriate in accordance with a material to be etched.

Figure 19C:
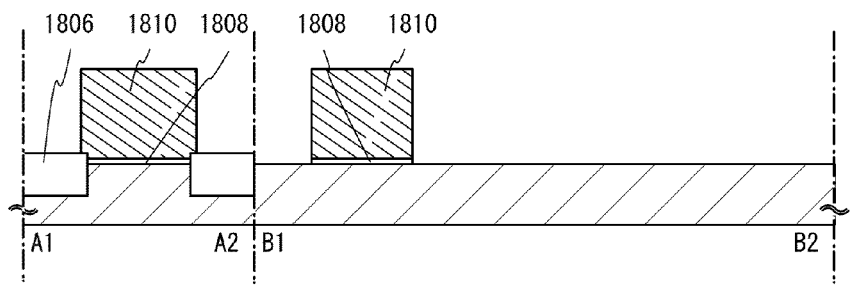

Then, an insulating layer is formed so as to cover the semiconductor region 1804, and the insulating layer in a region overlapping with the semiconductor region 1804 is selectively removed, so that the element isolation insulating layer 1806 is formed (see FIG. 19C). The insulating layer is formed using silicon oxide, silicon nitride, silicon oxynitride, or the like. For removing the insulating layer, any of etching treatment, polishing treatment such as chemical mechanical polishing (CMP), and the like can be employed. Note that the protective layer 1802 is removed after the formation of the semiconductor region 1804 or after the formation of the element isolation insulating layer 1806.

Here, the CMP treatment is treatment of planarizing a surface of an object to be processed by a combination of chemical and mechanical actions using the surface as a reference. Specifically, the CMP treatment is a method in which a polishing cloth is attached to a polishing stage, the polishing stage and the object to be processed are each rotated or swung while a slurry (an abrasive) is supplied between the object to be processed and the polishing cloth, and the surface of the object to be processed is polished by chemical reaction between the slurry and the surface of the object to be processed and by action of mechanical polishing of the object to be processed with the polishing cloth.

Note that as a formation method of the element isolation insulating layer 1806, a method in which an insulating region is formed by introduction of oxygen or the like can be used as well as a method in which an insulating layer is selectively removed.

Next, an insulating layer is formed over a surface of the semiconductor region 1804, and a layer including a conductive material is formed over the insulating layer.

The insulating layer is to be a gate insulating layer later and can be formed by heat treatment (e.g., thermal oxidation treatment or thermal nitridation treatment) on the surface of the semiconductor region 1804, for example. Instead of heat treatment, high-density plasma treatment may be employed.

The high-density plasma treatment can be performed using, for example, a mixed gas of a rare gas such as He, Ar, Kr, or Xe and any of oxygen, nitrogen oxide, ammonia, nitrogen, and hydrogen. Needless to say, the insulating layer may be formed using a CVD method, a sputtering method, or the like. The insulating layer preferably has a single-layer structure or a stacked-layer structure including any of silicon oxide, silicon oxynitride, silicon nitride, hafnium oxide, aluminum oxide, tantalum oxide, yttrium oxide, hafnium silicate (Hf-$Si_xO_y$ (x>0, y>0)), hafnium silicate (HfSi$_x$O$_y$ (x>0, y>0)) to which nitrogen is added, hafnium aluminate (HfAl$_x$O$_y$ (x>0, y>0)) to which nitrogen is added, and the like. The insulating layer can have a thickness of, for example, greater than or equal to 1 nm and less than or equal to 100 nm, preferably greater than or equal to 10 nm and less than or equal to 50 nm.

The layer including a conductive material can be formed using a metal material such as aluminum, copper, titanium, tantalum, or tungsten. The layer including a conductive material may be formed using a semiconductor material such as polycrystalline silicon. There is no particular limitation on the formation method, and a variety of film formation methods such as an evaporation method, a CVD method, a sputtering method, or a spin coating method can be employed. Note that this embodiment shows an example of the case where the layer including a conductive material is formed using a metal material.

After that, the insulating layer and the layer including a conductive material are selectively etched; thus, the gate insulating layer 1808 and the gate electrode 1810 are formed (see FIG. 19C).

Figure 19D:
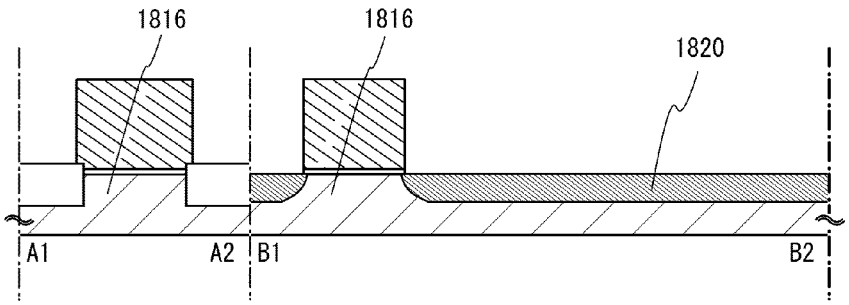

Next, phosphorus (P), arsenic (As), or the like is added to the semiconductor region 1804, so that the channel formation region 1816 and the impurity regions 1820 are formed (see FIG. 19D). Note that phosphorus or arsenic is added here in order to form an n-channel transistor; an impurity element such as boron (B) or aluminum (Al) may be added in the case of forming a p-channel transistor. Here, the concentration of the impurity added can be set as appropriate; the concentration is preferably increased when the size of a semiconductor element is extremely decreased.

Note that a sidewall insulating layer may be formed around the gate electrode 1810 so that impurity regions to which impurity elements are added at different concentrations are formed.

Figure 20A:
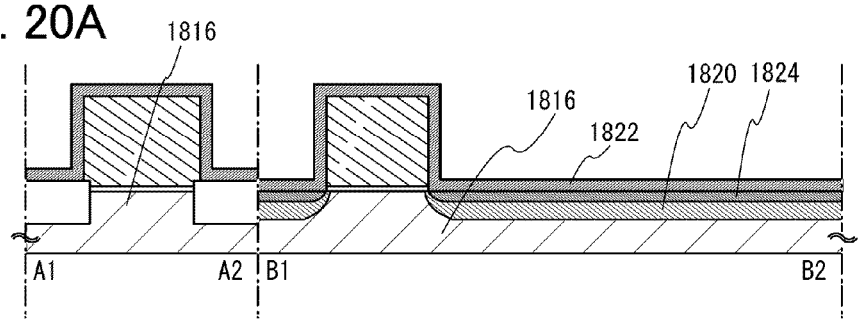
FIGS. 20A to 20D are cross-sectional views illustrating a manufacturing process of a semiconductor device.

Next, a metal layer 1822 is formed so as to cover the gate electrode 1810, the impurity regions 1820, and the like (see FIG. 20A). The metal layer 1822 can be formed by any of a variety of film formation methods such as a vacuum evaporation method, a sputtering method, and a spin coating method. The metal layer 1822 is preferably formed using a metal material which forms a low-resistance metal compound by reacting with the semiconductor material included in the semiconductor region 1804. Examples of such metal materials include titanium, tantalum, tungsten, nickel, cobalt, and platinum.

Next, heat treatment is performed so that the metal layer 1822 reacts with the semiconductor material. Thus, the metal compound regions 1824 that are in contact with the impurity regions 1820 are formed (see FIG. 20A). Note that when the gate electrode 1810 is formed using polycrystalline silicon or the like, a metal compound region is also formed in a region of the gate electrode 1810 which is in contact with the metal layer 1822.

As the heat treatment, irradiation with a flash lamp can be employed, for example. Although it is needless to say that another heat treatment method may be used, a method by which heat treatment for an extremely short time can be achieved is preferably used in order to improve the controllability of chemical reaction in formation of the metal compound. Note that the metal compound regions are formed by reaction of the metal material and the semiconductor material and have sufficiently high conductivity. The formation of the metal compound regions can properly reduce the electric resistance and improve element characteristics. Note that the metal layer 1822 is removed after the metal compound regions 1824 are formed.

Figure 20B:
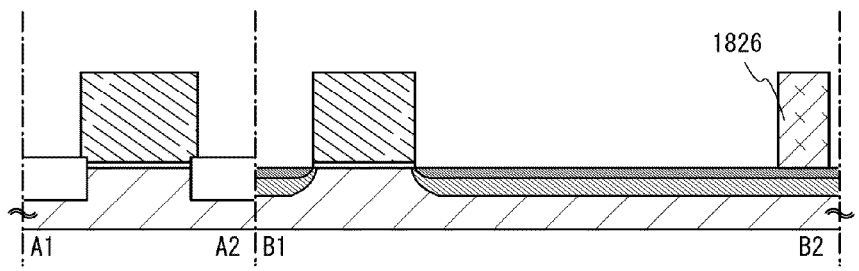

Next, the electrode 1826 is formed in a region overlapping with part of the metal compound region 1824 (see FIG. 20B). For example, the electrode 1826 is formed in such a manner that a layer including a conductive material is formed and then the layer is selectively etched. The layer including a conductive material can be formed using a metal material such as aluminum, copper, titanium, tantalum, or tungsten. The layer including a conductive material may be formed using a semiconductor material such as polycrystalline silicon. There is no particular limitation on the method for forming the layer including a conductive material, and a variety of film formation methods such as an evaporation method, a CVD method, a sputtering method, or a spin coating method can be employed.

Figure 20C:
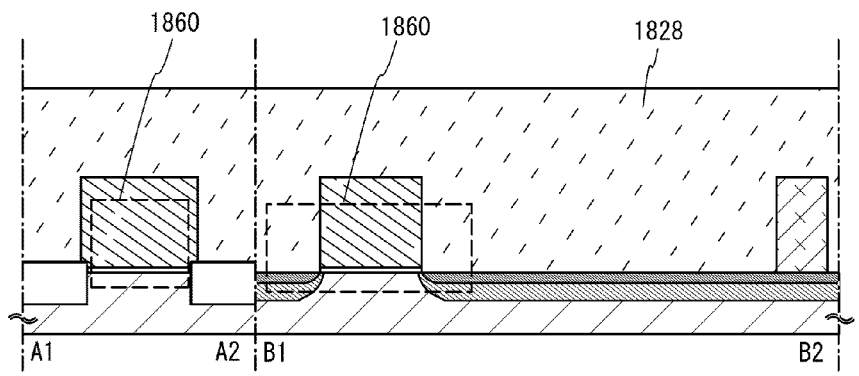

Then, the insulating layer 1828 is formed so as to cover the components formed in the above steps (see FIG. 20C). The insulating layer 1828 can be formed using a material including an inorganic insulating material such as silicon oxide, silicon oxynitride, silicon nitride, or aluminum oxide. In particular, the insulating layer 1828 is preferably formed using a low dielectric constant (low-k) material, whereby capacitance caused by an overlap of electrodes or wirings can be sufficiently reduced. Note that the insulating layer 1828 may be a porous insulating layer formed using any of the above materials. Since the porous insulating layer has low dielectric constant as compared to a dense insulating layer, capacitance due to electrodes or wirings can be further reduced. Moreover, the insulating layer 1828 can be formed using an organic insulating material such as polyimide or acrylic. Note that although the insulating layer 1828 has a single-layer structure here, one embodiment of the present invention is not limited to this example. The insulating layer 1828 may have a stacked-layer structure including two or more layers. In the case of a three-layer structure, for example, a stacked structure of a silicon oxynitride layer, a silicon nitride oxide layer, and a silicon oxide layer can be employed.

Alternatively, the electrode 1826 can be formed by forming an opening reaching the metal compound region 1824 in the insulating layer 1828 after the formation of the insulating layer 1828 and then by filling the opening.

In that case, it is possible to use a method, for example, in which a thin titanium film is formed in a region including the opening by a PVD method and a thin titanium nitride film is formed by a CVD method, and then a tungsten film is formed so as to fill the opening. Here, the titanium film formed by a PVD method has a function of reducing an oxide film (e.g., a native oxide film) formed on a surface over which the titanium film is formed, to decrease the contact resistance with the lower electrode or the like (here, the metal compound region 1824). The titanium nitride film formed after the formation of the titanium film has a barrier function of preventing diffusion of the conductive material. A copper film may be formed by a plating method after the formation of the barrier film of titanium, titanium nitride, or the like.

Through the above steps, the transistor 1860 is formed with the use of the substrate 1800 including a semiconductor material (see FIG. 20C). A feature of the transistor 1860 is that it can operate at high speed. Thus, when the transistor is used as a reading transistor, data can be read at high speed.

Figure 20D:
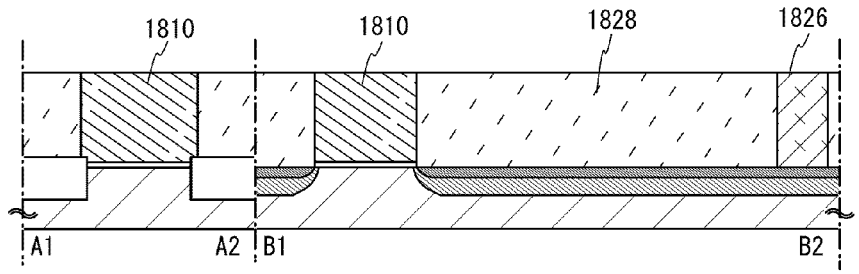

Then, as pretreatment for the formation of the transistor 1862 and the capacitor 1864, CMP treatment is performed on the insulating layer 1828 to expose the upper surfaces of the gate electrode 1810 and the electrode 1826 (see FIG. 20D). As treatment for exposing the upper surfaces of the gate electrode 1810 and the electrode 1826, etching treatment or the like can be employed instead of CMP treatment; in order to improve characteristics of the transistor 1862, the surface of the insulating layer 1828 is preferably made as flat as possible.

Note that before or after the above steps, a step for forming an additional electrode, wiring, semiconductor layer, or insulating layer may be performed. For example, a multilayer wiring structure in which an insulating layer and a conductive layer are stacked is employed as a wiring structure, so that a highly-integrated semiconductor device can be provided.

<Method for Manufacturing Upper Transistor>

Next, a method for manufacturing the transistor 1862 in the upper portion and the capacitor 1864 will be described with reference to FIGS. 21A to 21D and FIGS. 22A and 22B.

Figure 21A:
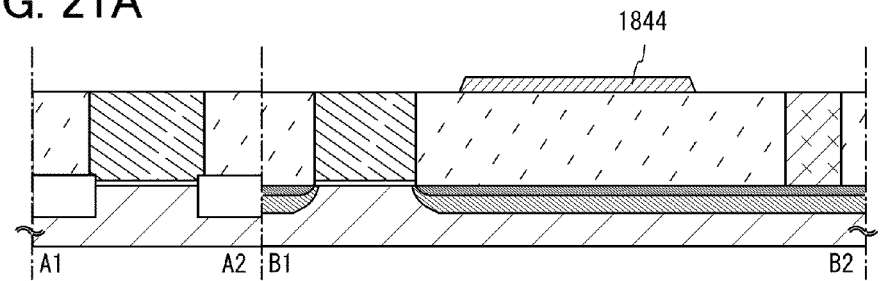
FIGS. 21A to 21D are cross-sectional views illustrating a manufacturing process of a semiconductor device.

First, an oxide semiconductor layer is formed over the gate electrode 1810, the electrode 1826, the insulating layer 1828, and the like and is processed, so that the oxide semiconductor layer 1844 is formed (see FIG. 21A). Note that an insulating layer functioning as a base may be formed over the gate electrode 1810, the electrode 1826, and the insulating layer 1828 before the oxide semiconductor layer is formed. The insulating layer can be formed by a PVD method such as a sputtering method, or a CVD method such as a plasma CVD method.

A material used for the oxide semiconductor layer contains at least one element selected from In, Ga, Sn, and Zn. For example, a four-component metal oxide such as an In—Sn—Ga—Zn—O-based oxide semiconductor; a three-component metal oxide such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor, an In—Hf—Zn—O-based oxide semiconductor, an In—La—Zn—O-based oxide semiconductor, an In—Ce—Zn—O-based oxide semiconductor, an In—Pr—Zn—O-based oxide semiconductor, an In—Nd—Zn—O-based oxide semiconductor, an In—Sm—Zn—O-based oxide semiconductor, an In—Eu—Zn—O-based oxide semiconductor, an In—Gd—Zn—O-based oxide semiconductor, an In—Tb—Zn—O-based oxide semiconductor, an In—Dy—Zn—O-based oxide semiconductor, an In—Ho—Zn—O-based oxide semiconductor, an In—Er—Zn—O-based oxide semiconductor, an In—Tm—Zn—O-based oxide semiconductor, an In—Yb—Zn—O-based oxide semiconductor, an In—Lu—Zn—O-based oxide semiconductor; a two-component metal oxide such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, or an In—Ga—O-based oxide semiconductor; a single-component metal oxide such as an In—O-based oxide semiconductor, a Sn—O-based oxide semiconductor, or a Zn—O-based oxide semiconductor; or the like can be used. In addition, any of the above oxide semiconductors may contain an element other than In, Ga, Sn, and Zn, for example, $SiO_2$.

For example, an In—Ga—Zn—O-based oxide semiconductor means an oxide film containing indium (In), gallium (Ga), and zinc (Zn), and there is no limitation on the composition ratio thereof.

For the oxide semiconductor layer, a thin film expressed by a chemical formula of $InMO_3(ZnO)_m$ (m>0) can be used. Here, M represents one or more metal elements selected from Zn, Ga, Al, Mn, and Co. For example, M can be Ga, Ga and Al, Ga and Mn, Ga and Co, or the like.

The thickness of the oxide semiconductor layer is preferably greater than or equal to 3 nm and less than or equal to 30 nm. This is because the transistor might possibly be normally on when the oxide semiconductor layer is too thick (e.g., the thickness is 50 nm or more).

The oxide semiconductor layer is preferably formed by a method in which impurities such as hydrogen, water, a hydroxyl group, or hydride do not enter the oxide semiconductor layer. For example, a sputtering method can be used.

In this embodiment, the case where the oxide semiconductor layer is formed by a sputtering method with the use of an In—Ga—Zn—O-based oxide target is described; however, the oxide semiconductor layer may alternatively be formed using an In—Zn—O-based oxide target.

As the In—Ga—Zn—O-based oxide target, a target that can be expressed by a composition ratio of In:Ga:Zn=1:x:y (x is greater than or equal to 0 and y is greater than or equal to 0.5 and less than or equal to 5) is preferably used. For example, a target having a composition ratio of $In_2O_3$:$Ga_2O_3$:ZnO=1:1:2 [molar ratio], or the like can be used. Furthermore, a target having a composition ratio of $In_2O_3$:$Ga_2O_3$:ZnO=1:1:1 [molar ratio], a target having a composition ratio of $In_2O_3$:$Ga_2O_3$:ZnO=1:1:4 [molar ratio], or a target having a composition ratio of $In_2O_3$:$Ga_2O_3$:ZnO=1:0:2 [molar ratio] can also be used.

In the case where an In—Zn—O-based material is used as an oxide semiconductor, a target therefor has a composition ratio of In:Zn=50:1 to 1:2 in an atomic ratio ($In_2O_3$:ZnO=25:1 to 1:4 in a molar ratio), preferably, In:Zn=20:1 to 1:1 in an atomic ratio ($In_2O_3$:ZnO=10:1 to 1:2 in a molar ratio), further preferably, In:Zn=15:1 to 1.5:1 in an atomic ratio ($In_2O_3$:ZnO=15:2 to 3:4 in a molar ratio). For example, in a target used for formation of an In—Zn—O-based oxide semiconductor which has an atomic ratio of In:Zn:O=X:Y:Z, the relation of Z>1.5X+Y is satisfied.

The relative density of a metal oxide in the target is greater than or equal to 80%, preferably greater than or equal to 95%, further preferably greater than or equal to 99.9%. The use of a target with high relative density makes it possible to form an oxide semiconductor layer with a dense structure.

The atmosphere in which the oxide semiconductor layer is formed is preferably an inert atmosphere, an oxidizing atmosphere, or a mixed atmosphere containing an inert gas and an oxidizing gas. The oxidizing atmosphere is an atmosphere that contains an oxidizing gas such as oxygen, ozone, or nitrogen dioxide as its main component and, preferably, does not contain water, hydrogen, and the like. For example, the purity of oxygen, ozone, or nitrogen dioxide to be introduced to a heat treatment apparatus is greater than or equal to 8N (99.999999%), preferably greater than or equal to 9N (99.9999999%) (i.e., the impurity concentration is lower than or equal to 1 ppm, preferably lower than 0.1 ppm). As the oxidizing atmosphere, an oxidizing gas and an inert gas may be mixed to be used. In that case, the mixture contains an oxidizing gas at a concentration of greater than or equal to 10 ppm. Further, an inert atmosphere refers to an atmosphere containing an inert gas (such as nitrogen or a rare gas (e.g., helium, neon, argon, krypton, or xenon)) as the main component. For example, the purity of an inert gas to be introduced to a heat treatment apparatus is greater than or equal to 6N (99.9999%), preferably greater than or equal to 7N (99.99999%) (i.e., the impurity concentration is lower than or equal to 1 ppm, preferably lower than or equal to 0.1 ppm). Specifically, the concentration of a reactive gas such as an oxidizing gas is lower than 10 ppm.

In forming the oxide semiconductor layer by a sputtering method, for example, an object to be processed is held in a treatment chamber that is maintained under reduced pressure, and the object to be processed is heated to a temperature higher than or equal to 100° C. and lower than 550° C., preferably higher than or equal to 200° C. and lower than or equal to 400° C. Alternatively, the temperature of an object to be processed in forming the oxide semiconductor layer may be room temperature. Then, moisture in the treatment chamber is removed, a sputtering gas from which hydrogen, water, or the like is removed is introduced, and the above-described target is used; thus, the oxide semiconductor layer is formed. By forming the oxide semiconductor layer while the object to be processed is heated, an impurity in the oxide semiconductor layer, such as hydrogen or water, can be reduced. Moreover, damage due to sputtering can be reduced. In order to remove moisture in the treatment chamber, an entrapment vacuum pump is preferably used. For example, a cryopump, an ion pump, a titanium sublimation pump, or the like can be used. Alternatively, a turbo pump provided with a cold trap may be used. Since an impurity such as hydrogen or water can be removed from the treatment chamber evacuated with a cryopump or the like, the concentration of an impurity in the oxide semiconductor layer can be reduced.

In the case where the oxide semiconductor layer is formed by a sputtering method, for example, the following conditions can be set: the distance between the object to be processed and the target is 170 mm; the pressure is 0.4 Pa; the direct current (DC) power is 0.5 kW; and the atmosphere is an oxygen (100% oxygen) atmosphere, an argon (100% argon) atmosphere, or a mixed atmosphere of oxygen and argon. Note that a pulsed direct current (DC) power source is preferably used because particles (such as powder substances generated in film formation) can be reduced and the film thickness can be uniform. The thickness of the oxide semiconductor layer is greater than or equal to 1 nm and less than or equal to 50 nm, preferably greater than or equal to 1 nm and less than or equal to 30 nm, further preferably greater than or equal to 1 nm and less than or equal to 10 nm. With the oxide semiconductor layer having such thickness, a short-channel effect due to miniaturization can be suppressed. Note that the appropriate thickness of the oxide semiconductor layer differs depending on the oxide semiconductor material to be used, the intended use of the semiconductor device, or the like; therefore, the thickness can be determined as appropriate in accordance with the material, the intended use, or the like.

Note that before the oxide semiconductor layer is formed by a sputtering method, reverse sputtering in which plasma is generated with an argon gas introduced is preferably performed so that a material attached to a surface where the oxide semiconductor layer is to be formed (e.g., a surface of the insulating layer 1828) is removed. Here, the reverse sputtering is a method in which ions collide with a surface to be processed so that the surface is modified, in contrast to normal sputtering in which ions collide with a sputtering target. An example of a method for making ions collide with a surface to be processed is a method in which high-frequency voltage is applied to the surface to be processed in an argon atmosphere so that plasma is generated in the vicinity of the object to be processed. Note that an atmosphere of nitrogen, helium, oxygen, or the like may be used instead of an argon atmosphere.

The oxide semiconductor layer can be processed by being etched after a mask having a desired shape is formed over the oxide semiconductor layer. The mask may be formed by a method such as photolithography or an ink-jet method. For the etching of the oxide semiconductor layer, either wet etching or dry etching may be employed. It is needless to say that both of them may be employed in combination.

The oxide semiconductor layer 1844 formed in the above manner has a non-single-crystal structure in some cases. Here, a non-single-crystal structure includes an amorphous structure, a microcrystalline structure (also including a nanocrystalline structure and the like), a polycrystalline structure, a structure in which microcrystals or polycrystals are included in an amorphous structure, a structure in which microcrystals or polycrystals are formed at a surface of an amorphous structure, and the like.

Next, a method for forming the oxide semiconductor layer 1844 is described. Here, for the oxide semiconductor layer 1844, a CAAC-OS (c-axis aligned crystalline oxide semiconductor) film is preferably used.

The CAAC-OS film is not completely single crystal nor completely amorphous. The CAAC-OS film is an oxide semiconductor film with a crystal-amorphous mixed phase structure where crystal parts are included in an amorphous phase.

The CAAC-OS film is not a single crystal, but this does not mean that the CAAC-OS film is composed of only an amorphous component. Although the CAAC-OS film includes a crystallized portion (crystalline portion), a boundary between one crystalline portion and another crystalline portion is not clear in some cases.

Nitrogen may be substituted for part of oxygen included in the CAAC-OS film. The c-axes of individual crystalline portions included in the CAAC-OS film may be aligned in one direction (e.g., the direction perpendicular to a surface of a substrate over which the CAAC-OS film is formed, a surface of the CAAC-OS film, an interface of the CAAC-OS film, or the like). Alternatively, normals of the a-b planes of individual crystalline portions included in the CAAC-OS film may be aligned in one direction (e.g., the direction perpendicular to a surface of a substrate over which the CAAC-OS film is formed, a surface of the CAAC-OS film, an interface of the CAAC-OS film, or the like).

The CAAC-OS film becomes a conductor, a semiconductor, or an insulator depending on its composition or the like. The CAAC-OS film transmits or does not transmit visible light depending on its composition or the like. Note that the CAAC-OS film used for the oxide semiconductor layer 1844 is a semiconductor.

As an example of such a CAAC-OS film, there is a material which is formed into a film shape and has a triangular or hexagonal atomic arrangement when observed from the direction perpendicular to a surface of a film, a surface of a substrate, or an interface and in which metal atoms are arranged in a layered manner or metal atoms and oxygen atoms (or nitrogen atoms) are arranged in a layered manner when a cross section of the film is observed.

The oxide semiconductor layer 1844 is formed over the insulating layer 1828 by a sputtering method, a molecular beam epitaxy method, an atomic layer deposition method, or a pulsed laser deposition method. Note that the proportion of a crystal region to an amorphous region in the oxide semiconductor layer 1844 can be increased by heating an object to be processed in film formation. For example, the substrate temperature may be higher than or equal to 150° C. and lower than or equal to 450° C. Preferably, the substrate temperature is higher than or equal to 200° C. and lower than or equal to 350° C. Crystallization of the oxide semiconductor layer 1844 can be further promoted by thus increasing the substrate temperature.

Next, first heat treatment may be performed after the oxide semiconductor layer 1844 is formed. The first heat treatment can increase the proportion of a crystal region to an amorphous region in the oxide semiconductor layer 1844. The first heat treatment may be performed at a temperature, for example, higher than or equal to 200° C. and lower than the strain point of the substrate, and is preferably performed at a temperature higher than or equal to 250° C. and lower than or equal to 450° C. The heat treatment is performed in an oxidizing atmosphere, an inert atmosphere, or a reduced-pressure atmosphere; however, there is no limitation on the atmosphere. The treatment time is 3 minutes to 24 hours. As the treatment time is increased, the proportion of a crystal region to an amorphous region in the oxide semiconductor layer 1844 can be increased. However, a heat treatment time longer than 24 hours is not preferable because productivity is decreased. In addition, after the oxide semiconductor layer 1844 is formed, through the first heat treatment, excess hydrogen (including water or a hydroxyl group) in the oxide semiconductor layer 1844 can be removed, the structure of the oxide semiconductor layer 1844 can be ordered, and defect states in an energy gap can be reduced.

The heat treatment apparatus is not limited to an electric furnace and may be an apparatus for heating an object by thermal radiation or thermal conduction from a medium such as a heated gas. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas which does not react with an object to be processed by heat treatment, such as nitrogen or a rare gas such as argon is used.

For example, as the first heat treatment, GRTA treatment may be performed as follows. The object to be processed is put in a heated inert gas atmosphere, heated for several minutes, and taken out of the inert gas atmosphere. The GRTA process enables high-temperature heat treatment for a short time. Moreover, the GRTA process can be employed even when the temperature exceeds the upper temperature limit of the object. Note that the inert gas may be switched to a gas containing oxygen during the process. This is because defect level in energy gap due to oxygen deficiency can be reduced by performing the first heat treatment in an atmosphere containing oxygen.

In any case, the oxide semiconductor layer 1844 which is an i-type (intrinsic) or substantially i-type oxide semiconductor layer can be obtained by reducing an impurity through the first heat treatment. In addition, the proportion of a crystal region to an amorphous region in the oxide semiconductor layer 1844 can be increased. With the use of the oxide semiconductor layer 1844 described above, a transistor with extremely excellent characteristics can be realized.

Figure 21B:
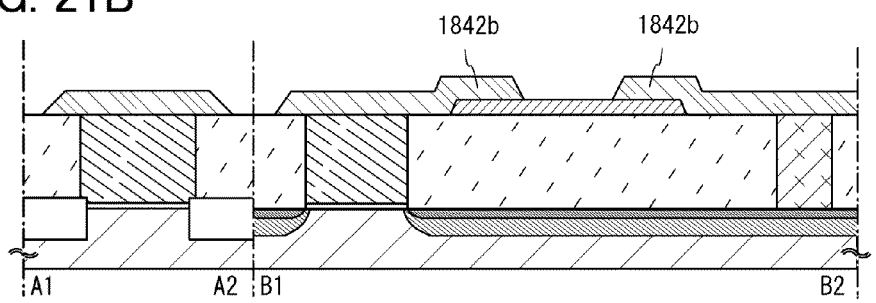

Next, a conductive layer for forming a source electrode and a drain electrode (including a wiring formed in the same layer as the source electrode and the drain electrode) is formed over the oxide semiconductor layer 1844 and the like and is processed, so that the source or drain electrode 1842*a* and the source or drain electrode 1842*b* are formed (see FIG. 21B).

The conductive layer can be formed by a PVD method or a CVD method. As a material for the conductive layer, an element selected from aluminum, chromium, copper, tantalum, titanium, molybdenum, and tungsten; an alloy containing any of these elements as a component; or the like can be used. Further, one or more materials selected from manganese, magnesium, zirconium, beryllium, neodymium, and scandium may be used.

The conductive layer can have a single-layer structure or a stacked-layer structure including two or more layers. For example, the conductive layer can have a single-layer structure of a titanium film or a titanium nitride film, a single-layer structure of an aluminum film containing silicon, a two-layer structure in which a titanium film is stacked over an aluminum film, a two-layer structure in which a titanium film is stacked over a titanium nitride film, or a three-layer structure in which a titanium film, an aluminum film, and a titanium film are stacked in this order. Note that in the case where the conductive layer has the single-layer structure of a titanium film or a titanium nitride film, there is an advantage that the source or drain electrode 1842*a* and the source or drain electrode 1842*b* can be easily processed to be tapered.

Alternatively, the conductive layer may be formed using a conductive metal oxide. As the conductive metal oxide, indium oxide ($In_2O_3$), tin oxide ($SnO_2$), zinc oxide (ZnO), indium oxide-tin oxide ($In_2O_3$—$SnO_2$, which is abbreviated to ITO in some cases), indium oxide-zinc oxide ($In_2O_3$—ZnO), or any of these metal oxide materials in which silicon or silicon oxide is contained can be used.

The conductive layer is preferably etched so that edge portions of the source or drain electrode 1842*a* and the source or drain electrode 1842*b* are tapered. Here, a taper angle is, for example, preferably greater than or equal to 30° and less than or equal to 60°. When etching is performed so that the end portions of the source or drain electrode 1842*a* and the source or drain electrode 1842*b* are tapered, the coverage with the gate insulating layer 1846 to be formed later can be improved and disconnection can be prevented.

The channel length (L) of the transistor in the upper portion is determined by a distance between a lower edge portion of the source or drain electrode 1842*a* and a lower edge portion of the source or drain electrode 1842*b*. Note that for light exposure for forming a mask used in the case where a transistor with a channel length (L) of less than 25 nm is formed, it is preferable to use extreme ultraviolet rays whose wavelength is as short as several nanometers to several tens of nanometers. In the light exposure by extreme ultraviolet rays, the resolution is high and the focus depth is large. For these reasons, the channel length (L) of the transistor to be formed later can be in the range of greater than or equal to 10 nm and less than or equal to 1000 nm (1 μm), and the circuit can operate at higher speed. Moreover, miniaturization can lead to low power consumption of a semiconductor device.

Figure 21C:
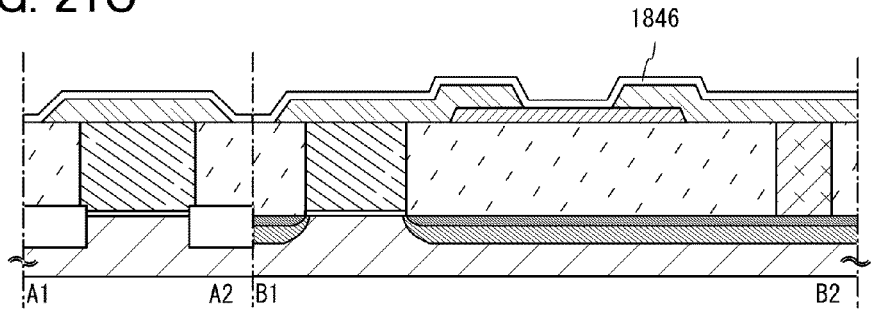

Next, the gate insulating layer 1846 is formed so as to cover the source or drain electrode 1842*a* and the source or drain electrode 1842*b* and to be in contact with part of the oxide semiconductor layer 1844 (see FIG. 21C).

The gate insulating layer 1846 can be formed by a CVD method, a sputtering method, or the like. The gate insulating layer 1846 is formed using a material such as silicon oxide, silicon nitride, or silicon oxynitride. Alternatively, the gate insulating layer 1846 can be formed using a material including a Group 13 element and oxygen. As the material including a Group 13 element and oxygen, for example, gallium oxide, aluminum oxide, aluminum gallium oxide, or the like can be used. Furthermore, the gate insulating layer 1846 may be formed so as to include tantalum oxide, hafnium oxide, yttrium oxide, hafnium silicate (HfSi$_x$O$_y$ (x>0, y>0)), hafnium silicate (HfSi$_x$O$_y$ (x>0, y>0)) to which nitrogen is added, hafnium aluminate (HfAl$_x$O$_y$ (x>0, y>0)) to which nitrogen is added, or the like. The gate insulating layer 1846 may have a single-layer structure or a stacked-layer structure in which these materials are combined. There is no particular limitation on the thickness; however, in the case where a semiconductor device is miniaturized, the thickness is preferably small for ensuring operation of the transistor. For example, in the case where silicon oxide is used, the thickness can be set to greater than or equal to 1 nm and less than or equal to 100 nm, preferably greater than or equal to 10 nm and less than or equal to 50 nm.

The gate insulating layer 1846 is preferably formed by a method with which impurities such as hydrogen or water do not enter the gate insulating layer 1846. This is because, if impurities such as hydrogen or water are contained in the gate insulating layer 1846, the impurities such as hydrogen or water may enter an oxide semiconductor film formed later or oxygen in the oxide semiconductor film may be extracted by the impurities such as hydrogen or water, so that a back channel of the oxide semiconductor film might have lower resistance (have n-type conductivity) and a parasitic channel might be formed. Therefore, the gate insulating layer 1846 is preferably formed so as to contain impurities such as hydrogen and water as little as possible. For example, the gate insulating layer 1846 is preferably formed by a sputtering method. It is preferable to use a high-purity gas from which impurities such as hydrogen and water are removed as a sputtering gas when the gate insulating layer 1846 is formed.

Many oxide semiconductor materials that can be used for the oxide semiconductor layer 1844 include a Group 13 element. Therefore, in the case where the gate insulating layer 1846 in contact with the oxide semiconductor layer 1844 is formed using a material including a Group 13 element and oxygen, the state of the interface between the gate insulating layer 1846 and the oxide semiconductor layer 1844 can be kept favorable. This is because a material including a Group 13 element and oxygen is compatible with an oxide semiconductor material. For example, when the oxide semiconductor layer 1844 and the gate insulating layer 1846 including gallium oxide are provided in contact with each other, pileup of hydrogen at the interface between the oxide semiconductor layer 1844 and the gate insulating layer 1846 can be reduced. Aluminum oxide has a property of not easily transmitting water. Thus, it is preferable to use aluminum oxide for the gate insulating layer 1846 in terms of preventing entry of water into the oxide semiconductor layer 1844.

When the gate insulating layer is thin as in the above description, a problem of gate leakage due to a tunnel effect or the like is caused. In order to solve the problem of gate leakage, the gate insulating layer 1846 may be formed using a high dielectric constant (high-k) material such as hafnium oxide, tantalum oxide, yttrium oxide, hafnium silicate (HfSi$_x$O$_y$ (x>0, y>0)), hafnium silicate (HfSi$_x$O$_y$ (x>0, y>0)) to which nitrogen is added, or hafnium aluminate (HfAl$_x$O$_y$ (x>0, y>0)) to which nitrogen is added. The use of a high-k material for the gate insulating layer 1846 makes it possible to increase the thickness in order to reduce gate leakage as well as ensuring electric characteristics. Note that a stacked structure of a film containing a high-k material and a film containing any one of silicon oxide, silicon nitride, silicon oxynitride, silicon nitride oxide, aluminum oxide, and the like may be employed.

In addition, the gate insulating layer 1846 preferably includes oxygen more than that in the stoichiometric composition. For example, when gallium oxide is used for the gate insulating layer 1846, the stoichiometric composition can be expressed as Ga$_2$O$_{3+\alpha}$ ($0<\alpha<1$). When aluminum oxide is used, the stoichiometric composition can be expressed as Al$_2$O$_{3+\alpha}$ ($0<\alpha<1$). When gallium aluminum oxide is used, the stoichiometric composition can be expressed as Ga$_x$Al$_{2-x}$O$_{3+\alpha}$ ($0<x<2$, $0<\alpha<1$).

Note that oxygen doping treatment may be performed after the oxide semiconductor layer is formed, after the oxide semiconductor layer 1844 is formed, or after the gate insulating layer 1846 is formed. The "oxygen doping" means that oxygen (which includes at least one of an oxygen radical, an oxygen atom, and an oxygen ion) is added to a bulk. Note that the term "bulk" is used in order to clarify that oxygen is added not only to a surface of a thin film but also to the inside of the thin film. In addition, "oxygen doping" includes "oxygen plasma doping" in which oxygen which is made to be plasma is added to a bulk. By the oxygen doping treatment, oxygen can be included in the oxide semiconductor layer or the gate insulating layer more than that in the stoichiometric composition.

The oxygen doping treatment is preferably performed by an inductively coupled plasma (ICP) method, using oxygen plasma which is excited by a microwave (with a frequency of 2.45 GHz, for example).

After formation of the gate insulating layer 1846, second heat treatment is preferably performed in an inert gas atmosphere or an oxygen atmosphere. The temperature of the heat treatment is higher than or equal to 200° C. and lower than or equal to 450° C., preferably higher than or equal to 250° C. and lower than or equal to 350° C. For example, the heat treatment may be performed at 250° C. for one hour in a nitrogen atmosphere. The second heat treatment can reduce variation in electric characteristics of the transistor. Moreover, in the case where the gate insulating layer 1846 includes oxygen, oxygen is supplied to the oxide semiconductor layer 1844 to compensate for oxygen deficiency in the oxide semiconductor layer 1844, whereby an i-type (intrinsic) or substantially i-type oxide semiconductor layer can be formed.

Note that the second heat treatment is performed in this embodiment after the gate insulating layer 1846 is formed; there is no limitation on the timing of the second heat treatment. For example, the second heat treatment may be performed after the gate electrode is formed. Alternatively, the second heat treatment may be performed following the first heat treatment, the first heat treatment may double as the second heat treatment, or the second heat treatment may double as the first heat treatment.

By performing at least one of the first heat treatment and the second heat treatment as described above, the oxide semiconductor layer 1844 can be highly purified so as to contain a substance including a hydrogen atom as little as possible.

Figure 21D:
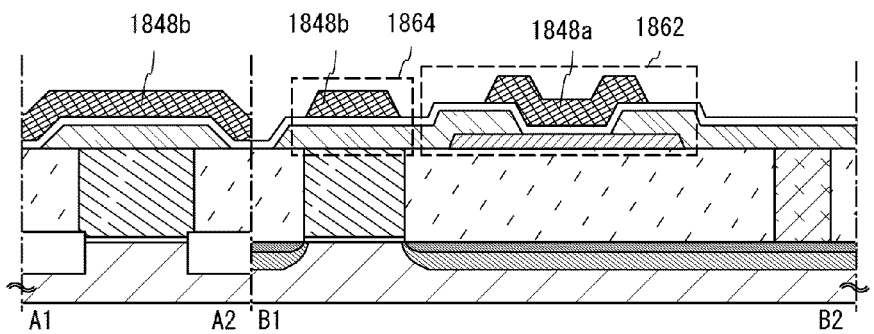

Next, a conductive layer for forming a gate electrode (including a wiring formed using the same layer as the gate electrode) is formed and is processed, so that the gate electrode 1848a and the conductive layer 1848b are formed (see FIG. 21D).

The gate electrode 1848a and the conductive layer 1848b can be formed using a metal material such as molybdenum, titanium, tantalum, tungsten, aluminum, copper, neodymium, or scandium, or an alloy material containing any of these materials as a main component. Note that the gate electrode 1848a and the conductive layer 1848b may have a single-layer structure or a stacked-layer structure.

Figure 22A:
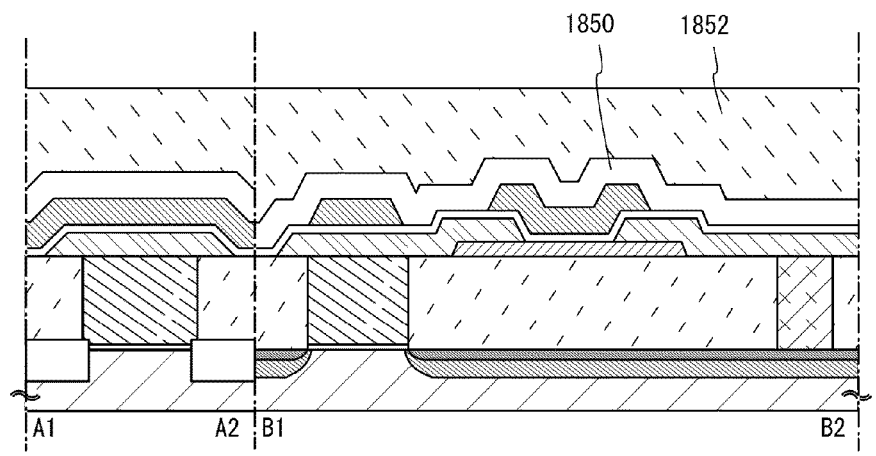
FIGS. 22A and 22B are cross-sectional views illustrating a manufacturing process of a semiconductor device.

Then, the insulating layer 1850 and the insulating layer 1852 are formed over the gate insulating layer 1846, the gate electrode 1848a, and the conductive layer 1848b (see FIG. 22A). The insulating layer 1850 and the insulating layer 1852 can be formed by a PVD method, a CVD method, or the like. The insulating layer 1850 and the insulating layer 1852 can be formed using a material including an inorganic insulating material such as silicon oxide, silicon oxynitride, silicon nitride, hafnium oxide, gallium oxide, aluminum oxide, or gallium aluminum oxide. Note that the insulating layer 1850 and the insulating layer 1852 are preferably formed using a low dielectric constant material or a low dielectric constant structure (such as a porous structure). This is because by reducing the dielectric constant of the insulating layer 1850 and the insulating layer 1852, capacitance between wirings, electrodes, or the like can be reduced; thus, operation at higher speed can be achieved. Note that although the insulating layer 1850 and the insulating layer 1852 each have a single-layer structure in this embodiment, one embodiment of the present invention is not limited to this. The insulating layer 1850 and the insulating layer 1852 may each have a stacked structure including two or more layers.

Next, an opening 1853 reaching the source or drain electrode 1842b is formed in the gate insulating layer 1846, the insulating layer 1850, and the insulating layer 1852. Then, an electrode 1854 that is in contact with the source or drain electrode 1842b is formed in the opening 1853, and a wiring 1856 that is in contact with the electrode 1854 is formed over the insulating layer 1852 (see FIG. 22B). The opening is formed by selective etching using a mask or the like.

The electrode 1854 can be formed in such a manner that, for example, a conductive layer is formed by a PVD method, a CVD method, or the like in a region including the opening 1853 and then part of the conductive layer is removed by etching treatment, CMP treatment, or the like.

Specifically, it is possible to employ a method in which, for example, a thin titanium film is formed by a PVD method in a region including the opening 1853, a thin titanium nitride film is formed by a CVD method, and then a tungsten film is formed so as to fill the opening 1853. Here, the titanium film formed by a PVD method has a function of reducing an oxide film (e.g., a native oxide film) formed on a surface over which the titanium film is formed, to decrease the contact resistance with the lower electrode or the like (here, the source or drain electrode 1842b). The titanium nitride film formed after the formation of the titanium film has a barrier function of preventing diffusion of the conductive material. A copper film may be formed by a plating method after the formation of the barrier film of titanium, titanium nitride, or the like.

Note that in the case where the electrode 1854 is formed by removing part of the conductive layer, processing is preferably performed so that the surface is planarized. For example, when a thin titanium film or a thin titanium nitride film is formed in a region including the opening 1853 and then a tungsten film is formed so as to be embedded in the opening 1853, excess tungsten, titanium, titanium nitride, or the like can be removed and the planarity of the surface can be improved by subsequent CMP treatment. The surface including the electrode 1854 is planarized in such a manner, whereby an electrode, a wiring, an insulating layer, a semiconductor layer, or the like can be favorably formed in a subsequent step.

The wiring 1856 is formed in such a manner that a conductive layer is formed by a PVD method such as a sputtering method or a CVD method such as a plasma CVD method and then is patterned. As a material for the conductive layer, an element selected from aluminum, chromium, copper, tantalum, titanium, molybdenum, and tungsten; an alloy containing any of these elements as a component; or the like can be used. Further, one or more materials selected from manganese, magnesium, zirconium, beryllium, neodymium, and scandium may be used. The details are similar to those of the source or drain electrode 1842a, the source or drain electrode 1842b, and the like.

Figure 22B:
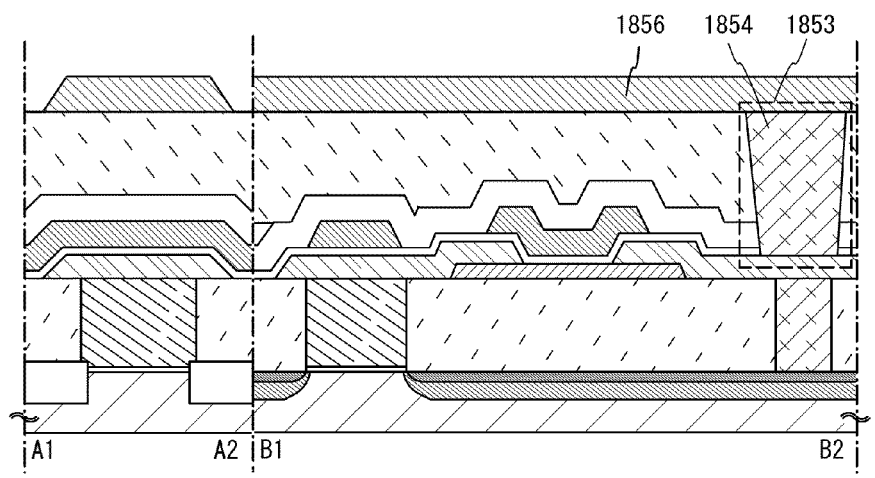

Through the above process, the semiconductor device including the transistor 1860, the transistor 1862, and the capacitor 1864 is completed (see FIG. 22B).

Figure 23A:
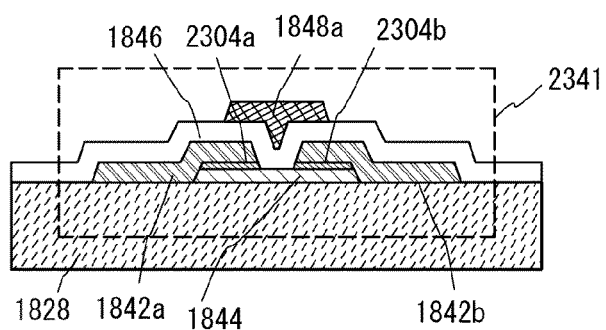
FIGS. 23A and 23B are cross-sectional views of a memory cell included in a semiconductor device.
Figure 23B:
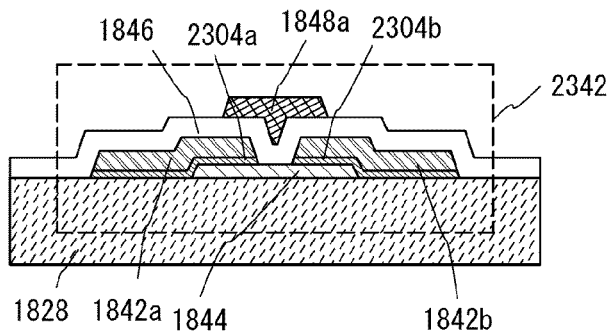

Oxide conductive layers functioning as a source region and a drain region may be provided as buffer layers between the oxide semiconductor layer 1844 and the source or drain electrodes 1842a and 1842b. FIGS. 23A and 23B illustrate transistors 2341 and 2342, respectively, each having a structure in which the transistor 1862 in FIG. 21D further includes oxide conductive layers.

In each of the transistors 2341 and 2342 in FIGS. 23A and 23B, an oxide conductive layer 2304a and an oxide conductive layer 2304b which function as a source region and a drain region are formed between the oxide semiconductor layer 1844 and the source or drain electrodes 1842a and 1842b. The shapes of the oxide conductive layers 2304a and 2304b are different between the transistors 2341 and 2342 of FIGS. 23A and 23B because of the difference between their manufacturing processes.

In the transistor 2341 of FIG. 23A, an oxide semiconductor film and an oxide conductive film are stacked and processed in the same photolithography step into the oxide semiconductor layer 1844 and an oxide conductive film each of which has an island shape. The source or drain electrode 1842a and the source or drain electrode 1842b are formed over the oxide semiconductor layer 1844 and the oxide conductive film, and then the island-shaped oxide conductive film is etched using the source or drain electrode 1842a and the source or drain electrode 1842b as masks, so that the oxide conductive layer 2304a and the oxide conductive layer 2304b which serve as a source region and a drain region are formed.

In the transistor 2342 in FIG. 23B, an oxide conductive film is formed over the oxide semiconductor layer 1844, a metal conductive film is formed over the oxide conductive film, and the oxide conductive film and the metal conductive film are processed in one photolithography step; thus, the oxide conductive layer 2304a and the oxide conductive layer 2304b which serve as a source region and a drain region, the source or drain electrode 1842a, and the source or drain electrode 1842b are formed.

Note that when etching treatment for processing the oxide conductive layer is performed, etching conditions (e.g., type of etching agent, the concentration of an etching agent, and etching time) are adjusted as appropriate in order to prevent excessive etching of the oxide semiconductor layer.

As a method for forming the oxide conductive layer 2304a and the oxide conductive layer 2304b, a sputtering method, a vacuum evaporation method (such as an electron beam evaporation method), an arc discharge ion plating method, or a spray method is used. As a material of the oxide conductive layers, zinc oxide, zinc aluminum oxide, zinc aluminum oxynitride, zinc gallium oxide, indium tin oxide containing silicon oxide (ITSO), or the like can be used. In addition, the above materials may contain silicon oxide.

With the oxide conductive layers provided as the source region and the drain region between the oxide semiconductor layer 1844 and the source or drain electrodes 1842a and 1842b, the resistance of the source region and the drain region can be reduced, which leads to high-speed operation of and the transistors 2341 and 2342.

With the structure including the oxide semiconductor layer 1844, the oxide conductive layers 2304a and 2304b, and the source or drain electrodes 1842a and 1842b, withstand voltages of the transistors 2341 and 2342 can be improved.

The process of manufacturing the transistor including an oxide semiconductor layer does not need high-temperature treatment, so that the transistor including an oxide semiconductor layer can be formed without affecting another device such as the lower transistor and wirings. Further, the manufacturing process of the transistor including an oxide semiconductor layer has a smaller number of steps than a manufacturing process of a transistor including a semiconductor material (e.g., silicon) other than an oxide semiconductor.

The structures, methods, and the like described in this embodiment can be combined as appropriate with any of the structures, methods, and the like described in the other embodiments.

Embodiment 6

In this embodiment, the cases where the semiconductor device described in any of the above embodiments is applied to electronic devices will be described with reference to FIGS. 24A to 24F. The cases where the above-described semiconductor device is applied to electronic devices such as a computer, a mobile phone set (also referred to as a mobile phone or a mobile phone device), a portable information terminal (including a portable game machine, an audio reproducing device, and the like), a camera such as a digital camera or a digital video camera, electronic paper, and a television set (also referred to as a television or a television receiver) are described in this embodiment.

Figure 24A:
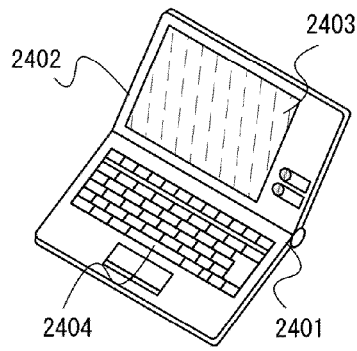
FIGS. 24A to 24F are each an electronic device including a semiconductor device.

FIG. 24A illustrates a laptop personal computer including a housing 2401, a housing 2402, a display portion 2403, a keyboard 2404, and the like. At least one of the housing 2401 and the housing 2402 is provided with the semiconductor device described in any of the above embodiments. Therefore, a laptop personal computer in which writing and reading of data are performed at high speed, data is stored for a long time, and power consumption is sufficiently reduced can be realized.

Figure 24B:
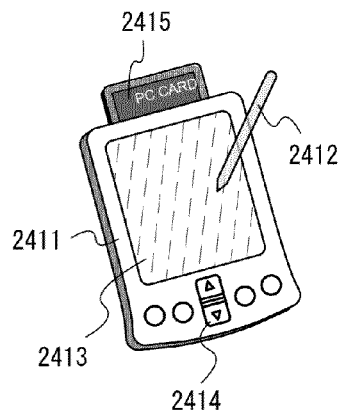

FIG. 24B illustrates a personal digital assistant (PDA), which includes a main body 2411 provided with a display portion 2413, an external interface 2415, operation buttons 2414, and the like. Further, a stylus 2412 or the like for operation of the personal digital assistant is provided. The semiconductor device described in any of the above embodiments is provided in the main body 2411. Therefore, a personal digital assistant in which writing and reading of data are performed at high speed, data is stored for a long time, and power consumption is sufficiently reduced can be realized.

Figure 24C:
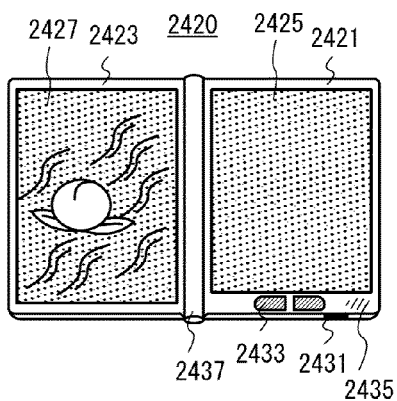

FIG. 24C illustrates an e-book reader 2420 mounted with electronic paper, which includes two housings, a housing 2421 and a housing 2423. The housing 2421 and the housing 2423 are provided with a display portion 2425 and a display portion 2427, respectively. The housings 2421 and 2423 are connected by a hinge portion 2437 and can be opened or closed with the hinge portion 2437. The housing 2421 is provided with a power switch 2431, operation keys 2433, a speaker 2435, and the like. At least one of the housings 2421 and 2423 is provided with the semiconductor device described in any of the above embodiments. Therefore, an e-book reader in which writing and reading of data are performed at high speed, data is stored for a long time, and power consumption is sufficiently reduced can be realized.

Figure 24D:
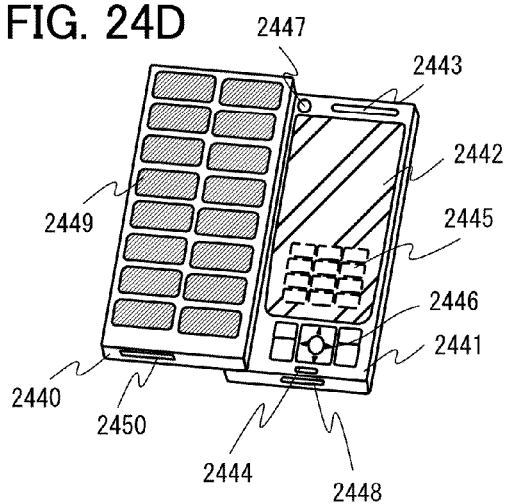

FIG. 24D illustrates a mobile phone including two housings, a housing 2440 and a housing 2441. Moreover, the housings 2440 and 2441 in a state where they are developed as illustrated in FIG. 24D can shift by sliding so that one is lapped over the other; therefore, the size of the mobile phone can be reduced, which makes the mobile phone suitable for being carried. The housing 2441 includes a display panel 2442, a speaker 2443, a microphone 2444, operation keys 2445, a pointing device 2446, a camera lens 2447, an external connection terminal 2448, and the like. The housing 2440 includes a solar cell 2449 for charging the mobile phone, an external memory slot 2450, and the like. In addition, an antenna is incorporated in the housing 2441. At least one of the housing 2440 and the housing 2441 is provided with the semiconductor device described in any of the above embodiments. Therefore, a mobile phone in which writing and reading of data are performed at high speed, data is stored for a long time, and power consumption is sufficiently reduced can be realized.

Figure 24E:
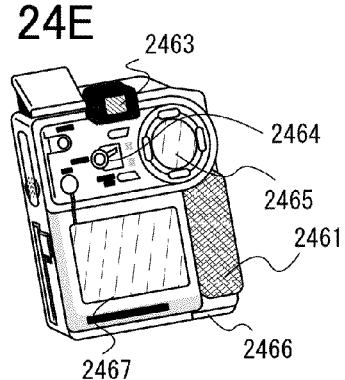

FIG. 24E illustrates a digital camera which includes a main body 2461, a display portion 2467, an eyepiece 2463, an operation switch 2464, a display portion 2465, a battery 2466, and the like. The semiconductor device described in any of the above embodiments is provided in the main body 2461. Therefore, a digital camera in which writing and reading of data are performed at high speed, data is stored for a long time, and power consumption is sufficiently reduced can be realized.

Figure 24F:
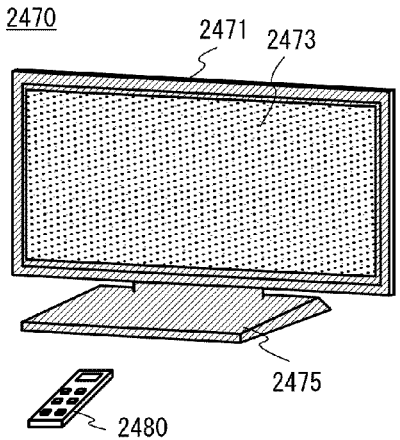

FIG. 24F illustrates a television set 2470 including a housing 2471, a display portion 2473, a stand 2475, and the like. The television set 2470 can be operated with a switch included in the housing 2471 or with a remote controller 2480. The semiconductor device described in any of the above embodiments is mounted on the housing 2471 and the remote controller 2480. Therefore, a television set in which writing and reading of data are performed at high speed, data is stored for a long time, and power consumption is sufficiently reduced can be realized.

As described above, the electronic devices described in this embodiment each include the semiconductor device described in any of the above embodiments. Therefore, electronic devices with low power consumption can be realized.

This application is based on Japanese Patent Application serial no. 2011-048793 filed with Japan Patent Office on Mar. 7, 2011, the entire contents of which are hereby incorporated by reference.

What is claimed is:
1. A semiconductor device comprising:
a memory cell;
a potential generating circuit;
a data buffer;
a writing circuit;
a reading circuit; and
a verifying circuit,
wherein the potential generating circuit is configured to generate a first potential and a second potential,
wherein the data buffer is configured to store first data,
wherein the writing circuit is configured to supply the first potential to the memory cell to write second data into the memory cell,
wherein the reading circuit is configured to read the second data from the memory cell,
wherein the verifying circuit is configured to verify whether the second data read by the reading circuit agrees with the first data stored by the data buffer or not, and
wherein the writing circuit is configured to supply the second potential to the memory cell to write third data into the memory cell in a case where the second data read by the reading circuit disagrees with the first data stored by the data buffer.

2. The semiconductor device according to claim 1, wherein the first potential and the second potential are different from each other.

3. The semiconductor device according to claim 1, wherein the memory cell comprises a transistor comprising an oxide semiconductor.

4. The semiconductor device according to claim 1, wherein the memory cell comprises a first transistor comprising an oxide semiconductor and a second transistor comprising silicon.

5. The semiconductor device according to claim 1,
wherein the memory cell comprises a bit line,
wherein the writing circuit comprises a first transistor and a second transistor,
wherein the first transistor is configured to supply the first potential to the bit line to write the second data into the memory cell while a first voltage is supplied to a gate of the first transistor, and
wherein the second transistor is configured to supply the second potential to the bit line to write the third data into the memory cell while a second voltage is supplied to a gate of the second transistor.

6. The semiconductor device according to claim 1,
wherein the memory cell is electrically connected to a bit line,
wherein the writing circuit comprises a first transistor and a second transistor,
wherein the writing circuit comprises a third transistor, a fourth transistor, a first shift register, and a second shift register,
wherein the first transistor is configured to supply the first potential to the bit line to write the second data into the memory cell while a first terminal of the first shift register supplies a first voltage to a first terminal of the third transistor, a second terminal of the first shift register supplies a second voltage to a first terminal of the fourth transistor, and a first terminal of the second shift register supplies the first voltage to a gate of the third transistor and a gate of the fourth transistor, and
wherein the second transistor is configured to supply the second potential to the bit line to write the third data into the memory cell while the first terminal of the first shift register supplies the second voltage to the first terminal of the third transistor, the second terminal of the first shift register supplies the first voltage to the first terminal of the fourth transistor, and the first terminal of the second shift register supplies the first voltage to the gate of the third transistor and the gate of the fourth transistor.

7. The semiconductor device according to claim 1,
wherein the memory cell is electrically connected to a bit line and a word line,
wherein the reading circuit comprises a counter circuit and a latch circuit,
wherein the reading circuit is configured to decrease a potential of the word line,
wherein the counter circuit is configured to increase a counter value while the potential of the word line decreases, and
wherein the latch circuit is configured to latch the counter value when a voltage of the bit line is a first voltage.

8. A semiconductor device comprising:
a memory cell;
a potential generating circuit;
a writing circuit; and
a reading circuit,
wherein the potential generating circuit is configured to generate a first potential at a first terminal of the potential generating circuit and a second potential at a second terminal of the potential generating circuit
wherein the writing circuit is electrically connected to the first terminal of the potential generating circuit through a first signal line,
wherein the writing circuit is electrically connected to the second terminal of the potential generating circuit through a second signal line,
wherein the writing circuit is electrically connected to the memory cell through a third signal line, and
wherein the reading circuit is electrically connected to the memory cell through a fourth signal line.

9. The semiconductor device according to claim 8, wherein the first potential and the second potential are different from each other.

10. The semiconductor device according to claim 8,
wherein the memory cell comprises a transistor comprising an oxide semiconductor, and
wherein a first terminal of the transistor is electrically connected to the third signal line.

11. The semiconductor device according to claim 8,
wherein the memory cell comprises a first transistor comprising an oxide semiconductor and a second transistor,
wherein a first terminal of the first transistor is electrically connected to the third signal line,
wherein a second terminal of the first transistor is electrically connected to a gate of the second transistor, and
wherein a first terminal of the second transistor is electrically connected to the fourth signal line.

12. The semiconductor device according to claim 8,
wherein the writing circuit comprises a first transistor and a second transistor,
wherein a first terminal of the first transistor is electrically connected to the first signal line,
wherein a second terminal of the first transistor is electrically connected to the third signal line,
wherein a first terminal of the second transistor is electrically connected to the second signal line, and
wherein a second terminal of the second transistor is electrically connected to the third signal line.

13. The semiconductor device according to claim 8,
wherein the writing circuit comprises a first transistor and a second transistor,
wherein the writing circuit comprises a third transistor, a fourth transistor, a first shift register, and a second shift register,
wherein a first terminal of the first transistor is electrically connected to the first signal line,
wherein a second terminal of the first transistor is electrically connected to the third signal line,
wherein a gate of the first transistor is electrically connected to a first terminal of the third transistor,
wherein a first terminal of the second transistor is electrically connected to the second signal line,
wherein a second terminal of the second transistor is electrically connected to the third signal line,
wherein a gate of the second transistor is electrically connected to a first terminal of the fourth transistor,
wherein a second terminal of the third transistor is electrically connected to a first terminal of the first shift register,
wherein a gate of the third transistor is electrically connected to a first terminal of the second shift register,
wherein a second terminal of the fourth transistor is electrically connected to a second terminal of the first shift register, and wherein a gate of the fourth transistor is electrically connected to the first terminal of the second shift register.

14. The semiconductor device according to claim 8,
wherein the reading circuit comprises a counter circuit, a latch circuit, and a transistor,
wherein the counter circuit is electrically connected to the latch circuit through the transistor, and
wherein a gate of the transistor is electrically connected to the fourth signal line.

15. A method for driving a semiconductor device, the semiconductor device comprising a memory cell and a data buffer, the method comprising the steps of:
storing first data in the data buffer;
supplying a first potential into the memory cell to store second data;
reading the second data from the memory cell; and
verifying whether the second data read from the memory cell agrees with the first data stored in the data buffer or not;
supplying a second potential into the memory cell to store third data in a case where the second data read from the memory cell disagrees with the first data stored in the data buffer.

16. The method for driving a semiconductor device according to claim 15,
wherein the second potential is smaller than the first potential in a case where the second data read from the memory cell is larger than the first data stored in the data buffer, and
wherein the second potential is larger than the first potential in a case where the second data read from the memory cell is smaller than the first data stored in the data buffer.

17. The method for driving a semiconductor device according to claim 15, further comprising the steps of:
reading the third data from the memory cell;
verifying whether the third data read from the memory cell agrees with the first data stored in the data buffer or not; and
supplying a third potential into the memory cell to store fourth data in a case where the third data read from the memory cell disagree with the first data stored in the data buffer.

18. The method for driving a semiconductor device according to claim 17,
wherein the second potential is smaller than the first potential in a case where the second data read from the memory cell is larger than the first data stored in the data buffer,
wherein the second potential is larger than the first potential in a case where the second data read from the memory cell is smaller than the first data stored in the data buffer,
wherein the third potential is smaller than the first potential in a case where the third data read from the memory cell is larger than the first data stored in the data buffer, and
wherein the third potential is larger than the first potential in a case where the third data read from the memory cell is smaller than the first data stored in the data buffer.

19. The method for driving a semiconductor device according to claim 15, the semiconductor device further comprising a writing circuit comprising a first transistor, a second transistor, a third transistor, a fourth transistor, a first shift register, and a second shift register, the method further comprising the steps of:
supplying the first potential into the memory cell through the first transistor while a first terminal of the first shift register supplies a first voltage to a first terminal of the third transistor, a second terminal of the first shift register supplies a second voltage to a first terminal of the fourth transistor, and a first terminal of the second shift register supplies the first voltage to a gate of the third transistor and a gate of the fourth transistor, and
supplying the second potential into the memory cell through the second transistor while the first terminal of the first shift register supplies the second voltage to the first terminal of the third transistor, the second terminal of the first shift register supplies the first voltage to the first terminal of the fourth transistor, and the first terminal of the second shift register supplies the first voltage to the gate of the third transistor and the gate of the fourth transistor.

* * * * *